(12) United States Patent
Kobayashi et al.

(10) Patent No.: US 6,606,736 B1
(45) Date of Patent: Aug. 12, 2003

(54) COMPUTER-AIDED TIMING ADJUSTING METHOD AND APPARATUS

(75) Inventors: Tatsuya Kobayashi, Kawasaki (JP); Yoshihiro Yasue, Kawasaki (JP)

(73) Assignee: Fujitsu limited, Kawasaki (JP)

( * ) Notice: Subject to any disclaimer, the term of this patent is extended or adjusted under 35 U.S.C. 154(b) by 0 days.

(21) Appl. No.: 09/289,966

(22) Filed: Apr. 13, 1999

(30) Foreign Application Priority Data

Apr. 13, 1998 (JP) .......................................... 10-101239
May 20, 1998 (JP) .......................................... 10-138887

(51) Int. Cl.$^7$ .............................................. G06F 17/50
(52) U.S. Cl. ........................................ 716/10; 714/726
(58) Field of Search .............................. 714/726; 716/2, 716/6, 9, 10, 18

(56) References Cited

U.S. PATENT DOCUMENTS 5,459,673 A  * 10/1995  Carmean et al. ............... 716/6
6,067,650 A  *  5/2000  Beausang et al. ........... 714/726
6,539,536 B1 *  3/2003  Singh et al. ................... 716/18

* cited by examiner

*Primary Examiner*—Vuthe Siek
*Assistant Examiner*—Thuan Do
(74) *Attorney, Agent, or Firm*—Staas & Halsey LLP

(57) ABSTRACT

Input signal dull values in a targeted set-up error path are read from a delay information file, in this path, a cell in a proceeding stage of the cell with the largest input signal dull value is selected, a cell which is in the same family as the selected cell and has a driving capability being closest to and larger than that of the selected cell is searched in a logic information file, and the selected cell is replaced with the searched cell. When the same type of timing error paths have a common part, a cell in the common part is replaced or this part is inserted with a cell. If the common part is on the downstream side, a cell at the most downstream side is selected, and if on the upstream side, a cell at the most upstream side is selected, and the selected cell is replaced, or a cell is inserted into the input or output side wiring of the selected cell. If different types of timing error paths have a common part, a cell at an uncommon part is replaced or a cell is inserted into this part, or the number of set-up error paths and the number of hold error paths are counted for each cell in the targeted timing error path, whereby, based on the counts, a cell to be replaced is selected or the cell insertion position is determined according to the priority order.

35 Claims, 37 Drawing Sheets

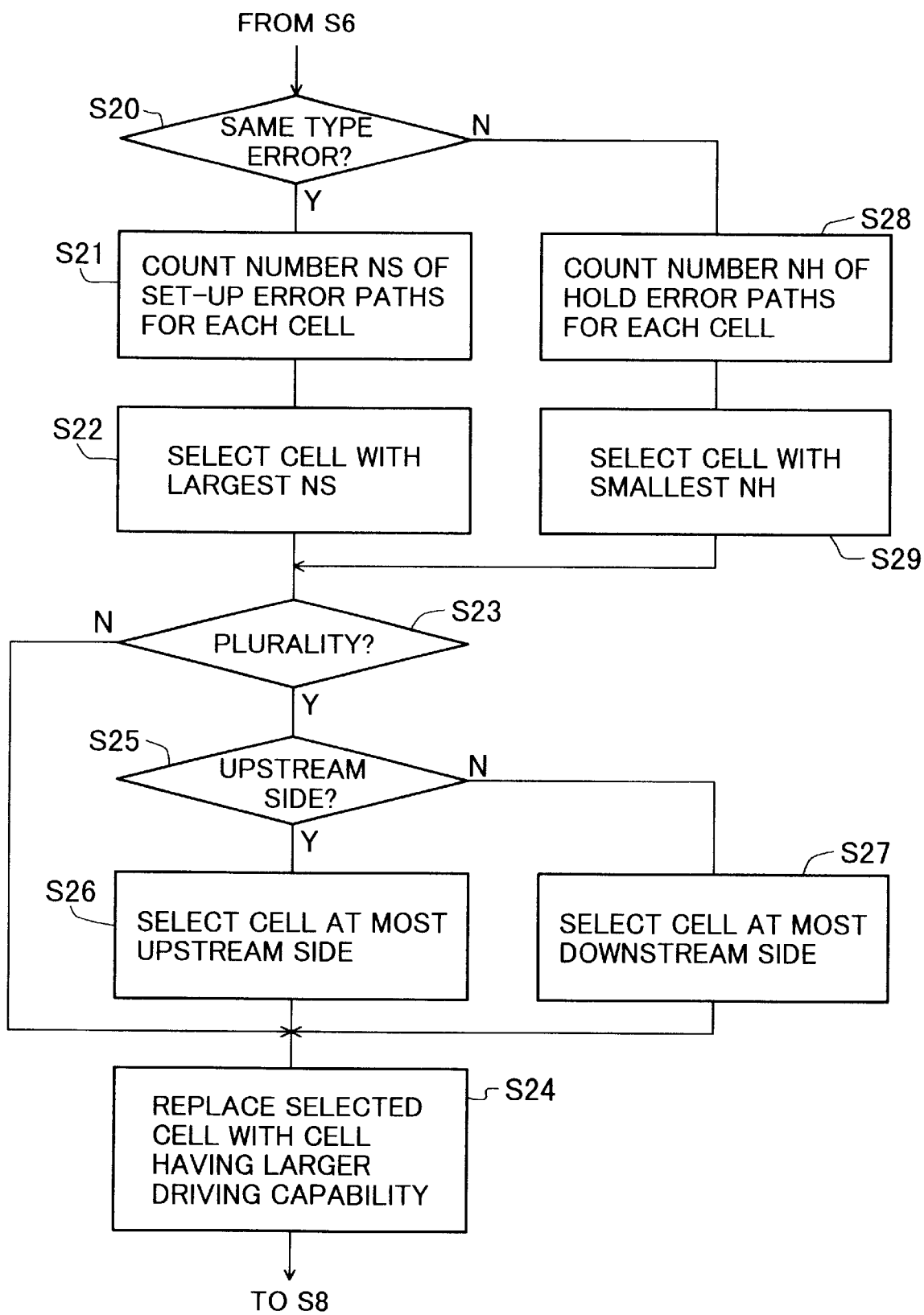

FROM S6 → S10A: IN ERROR PATH, SELECT CELL WITH LARGEST DELAY TIME OF ITS OUTPUT SIDE WIRING → S11: REPLACE SELECTED CELL WITH CELL HAVING LARGER DRIVING CAPABILITY → TO S8

DL: 132  168  163
DLT: 463

DL: 140  143  104
DLT: 387
ΔDLT: −76

DL: 153  80  92
DLT: 325
ΔDLT: −138

FIG. 24B
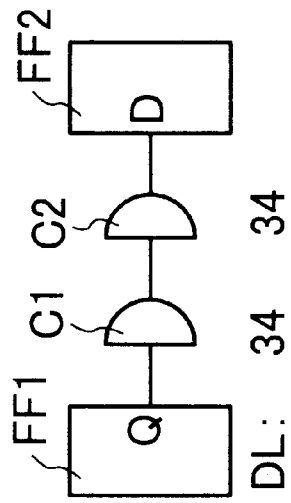
DL: 34  34
FIG. 24C
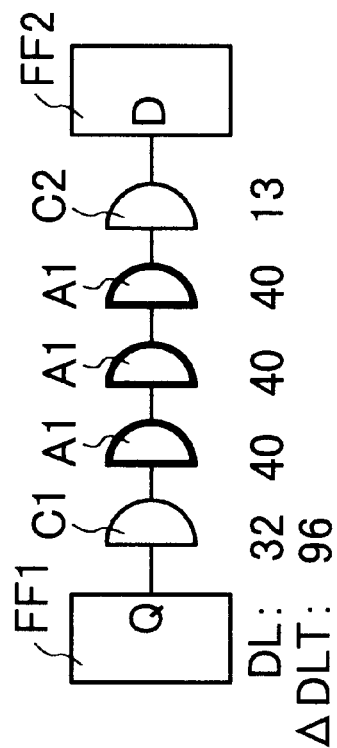
DL: 32  40  40  40  13
ΔDLT: 96
FIG. 24A
FROM S7 → S80 DETERMINE CELL INSERTION POSITION → S81 SELECT CELL TO BE INSERTED WITH SMALLEST DRIVING CAPABILITY → S82 INSERT CELL COMBINATION SATISFYING (SUM OF BASIC DELAY TIMES) ≧ ΔT → TO S8

DL: 34  34

DL: 32  110  13
ΔDLT: 93

FIG. 26B
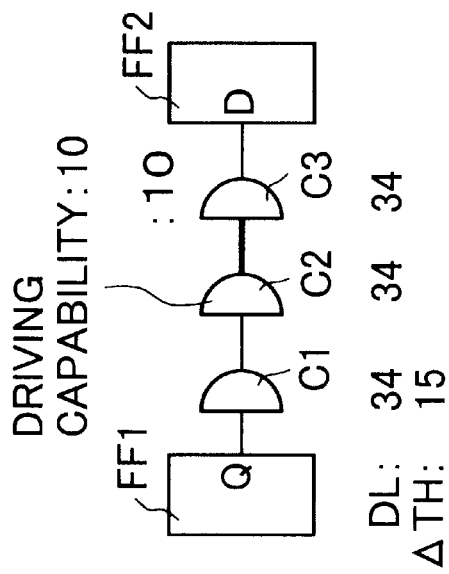
DRIVING CAPABILITY: 10
DL: 34 34 34
ΔTH: 15
FIG. 26C
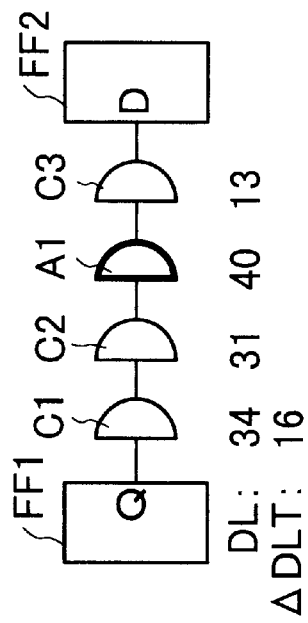
DL: 34 31 40 13
ΔDLT: 16
FIG. 26A
FROM S7 → S80 DETERMINE CELL INSERTION POSITION
S81B SELECT CELL TO BE INSERTED WITH DRIVING CAPABILITY CLOSE TO THAT OF CELL IN PROCEEDING STAGE OF INSERTION POSITION, FROM EACH CELL FAMILY
S82A SELECT CELL WITH BASIC DELAY CLOSE TO ΔTH
→ TO S8

FIG. 27B
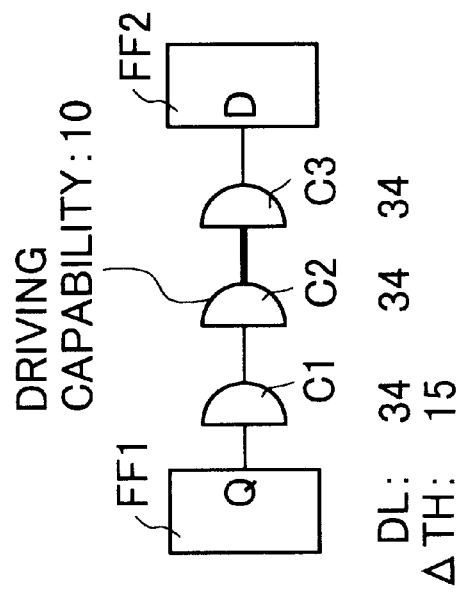
DRIVING CAPABILITY:10
DL: 34 34 34
ΔTH: 15
FIG. 27C
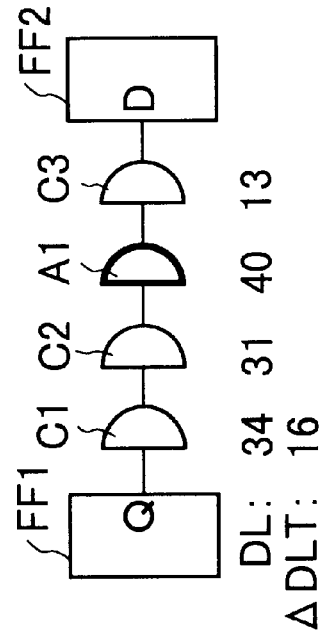
DL: 34 31 40 13
ΔDLT: 16
FIG. 27A
FROM S7 → | DETERMINE CELL INSERTION POSITION | S80
| OPERATOR NARROWS CELLS IN CELL FAMILIES | S83
| SELECT CELL CANDIDATES FROM NARROWED CELLS | S84
| SELECT CELL WITH BASIC DELAY TIME CLOSE TO ΔTH | S82A
→ TO S8

COMPUTER-AIDED TIMING ADJUSTING METHOD AND APPARATUS

BACKGROUND OF THE INVENTION

1. Field of the Invention

The present invention relates to a computer-aided timing adjusting method and apparatus for correcting timing errors (set-up errors and hold errors) by automatically or semiautomatically adjusting the timing of a logic circuit whose layout has been designed, and a storage medium stored with a program for executing this method.

2. Description of the Related Art

In logic circuit, in accordance with its development in integration and with the miniaturizing of its element, a ratio of wiring propagation delay time to gate propagation delay time has been becoming increasingly greater. Therefore, timing analysis for the logic circuit whose layout has been designed is performed with computer.

In the prior art timing adjusting, the designer refers to the gate propagation delay time and wiring propagation delay time of a timing error path, selects a cell to be replaced or a position to be inserted, and performs replacing the cell or inserting a cell.

But, since a signal dull value or a number of error paths in a case where a plurality of timing error paths are overlapped is not taken into consideration, it is difficult to perform timing adjusting effectively.

Also, by replacing or inserting a cell, since the gate propagation delay time and wiring propagation delay time of the cells around it change, timing analysis must be performed again after the net list and layout are renewed to confirm the adjusting result. In repetition of such a processing, since replacing and inserting of cells are manually performed by the designer, timing adjusting takes a long time.

SUMMARY OF THE INVENTION

Accordingly, an object according to the present invention is to provide a computer-aided timing adjusting method and apparatus, and a storage medium stored with a program to execute the method, wherein the timing adjusting is more effectively performed, whereby the adjusting time will be shortened.

In the 1st aspect of the present invention, there is provided a computer-aided timing adjusting method for adjusting a timing in a semiconductor integrated circuit whose layout and wiring have been designed, the semiconductor integrated circuit including sequential circuits, each of the sequential circuits having first and second flip-flops and a combinational circuit connected between an output of the first flip-flop and the input of the second flip-flop, the first and second flip-flops operating in synchronization with a clock, the method comprising the steps of, as shown in FIGS. 4A through 4C for example,: preparing a timing error information including the types of timing errors and timing error paths, a delay information relating to signal propagation delay, and a logic information including function and driving capability of each cell in the combinational circuits; when the timing error information has one that the sequential circuit is a set-up error path: selecting a cell which is estimated with referring to the delay information to be the greatest cause for the set-up error arising; searching a cell whose function is the same as the selected cell and driving capability is larger than the selected cell; and replacing the selected cell with the searched cell.

With the 1st aspect according to the present invention, since the ratio of the decreasing amount of path delay time to the increasing amount of the driving capability becomes relatively greater, whereby it will be effective and the timing adjusting time will be shortened.

In the 2nd aspect of the present invention, there is provided a computer-aided timing adjusting method as defined in the 1st aspect, wherein, in the preparing step, the delay information has input signal dull values of the cells, wherein, in the selecting step, as shown in FIGS. 4A through 4C for example, a cell in the proceeding stage of a cell with the largest input signal dull value is selected.

In the 3rd aspect of the present invention, there is provided a computer-aided timing adjusting method as defined in the 1st aspect, wherein, in the preparing step, as shown in FIGS. 15A through 15C for example, the delay information has output-wiring propagation delay times, wherein, in the selecting step, a cell whose output-wiring propagation delay time is the maximum is selected.

In the 4th aspect of the present invention, there is provided a computer-aided timing adjusting method as defined in the 1st aspect, wherein, in the preparing step, the delay information has gate propagation delay times, wherein, in the selecting step, as shown in FIGS. 16A through 16C for example, the cell in the proceeding stage of a cell whose propagation delay time is the maximum is selected.

In the 5th aspect of the present invention, there is provided a computer-aided timing adjusting method for adjusting a timing in a semiconductor integrated circuit whose layout and wiring have been designed, the semiconductor integrated circuit including sequential circuits, each of the sequential circuits having first and second flip-flops and a combinational circuit connected between an output of the first flip-flop and the input of the second flip-flop, the first and second flip-flops operating in synchronization with a clock, the sequential circuits having first and second sequential circuits whose combinational circuits have a common part, the method comprising the steps of, as shown in FIGS. 6A and 6B for example,: preparing a timing error information including the types of timing errors and timing error paths, and a logic information including function and driving capability of each cell in the combinational circuits; when the timing error information has one that the first and second sequential circuits each are timing error paths: judging whether or not the types of the timing errors of the timing error paths are the same; and if the types are the same, then, in order to lower the degree of the both timing errors, replacing a cell in the common part with a cell, in the logic information, with the same function and a different driving capability, or inserting a cell in the logic information into the common part without changing the function of the common part.

With the 5th aspect according to the present invention, since the timings in the same type and plurality of timing error paths are simultaneously and effectively adjusted, the timing adjusting time will be shortened.

In the 6th aspect of the present invention, there is provided a computer-aided timing adjusting method as defined in the 5th aspect, wherein, as shown in FIGS. 6A and 6B for example, if the type of the timing errors is a set-up error, then the replacing or inserting step comprises the steps of: selecting a cell in the common part; searching, in the logic information, a cell having the same function as and a greater driving capability than the selected cell; and replacing the selected cell with the searched cell.

In the 7th aspect of the present invention, there is provided a computer-aided timing adjusting method as defined in the 6th aspect, wherein, in the selecting step, as shown in FIGS. 6A and 6B for example, if a plurality of the second sequential circuits exist, then a cell, in the common part, with the largest number of set-up error paths is selected.

In the 8th aspect of the present invention, there is provided a computer-aided timing adjusting method as defined in the 5th aspect, wherein the replacing or inserting step, as shown in FIGS. 11A and 11B for example, if the type of the timing errors is a hold error, then comprises the steps of: selecting a cell in the common part; and inserting a cell, in the logic information, before or after the selected cell so as not to change the function as before insertion.

In the 9th aspect of the present invention, there is provided a computer-aided timing adjusting method as defined in the 8th aspect, wherein, in the selecting step, as shown in FIGS. 11A and 11B for example, if a plurality of the second sequential circuits exist, then a cell, in the common part, with the largest number of hold error paths is selected.

In the 10th aspect of the present invention, there is provided a computer-aided timing adjusting method as defined in any one of the 6th through 9th aspects, wherein, as shown in FIGS. 7A and 7B or FIGS. 8A and 8B for example, when a plurality of cells are selected in the selecting step, if the common part is on the downstream side of the circuit between the first and second flip-flops, then the cell on the most downstream side is selected, and if the common part is on the upstream side, then the cell on the most upstream side is selected.

With the 10th aspect according to the present invention, since the propagation delay time mainly and only at the common part changes, the timings of a multi set-up error path will be more effectively and simultaneously adjusted.

In the 11th aspect of the present invention, there is provided a computer-aided timing adjusting method for adjusting a timing in a semiconductor integrated circuit whose layout and wiring have been designed, the semiconductor integrated circuit including sequential circuits, each of the sequential circuits having first and second flip-flops and a combinational circuit connected between an output of the first flip-flop and the input of the second flip-flop, the first and second flip-flops operating in synchronization with a clock, the sequential circuits having first and second sequential circuits whose combinational circuits have a common part, the method comprising the steps of, as shown in FIGS. 9A and 9B for example,: preparing a timing error information including the types of timing errors and timing error paths, and a logic information including function and driving capability of each cell in the combinational circuits; when the timing error information has one that the first and second sequential circuits each are timing error paths: judging whether or not the types of the timing errors of the timing error paths are the same; and if the types are the same, then, in order to lower the degree of the both timing errors, replacing a cell in the combinational circuit of the first sequential circuit and not in the common part with a cell, with the same function and a different driving capability, or inserting a cell in the logic information into the common part without changing the function of the common part.

With the 11th aspect according to the present invention, since the timing of mainly and only a targeted timing error path is adjusted, the timing of a complicated multi timing error path will be effectively adjusted.

In the 12th aspect of the present invention, there is provided a computer-aided timing adjusting method as defined in the 11th aspect, wherein, as shown in FIGS. 9A and 9B for example, if the first and second sequential circuits are a set-up error path and a hold error path, respectively, then the replacing or inserting step comprises the steps of: selecting a cell which is in the set-up error path and not in the common part; searching a cell, in the logic information, having the same function as and a greater driving capability than the selected cell; and replacing the selected cell with the searched cell.

In the 13th aspect of the present invention, there is provided a computer-aided timing adjusting method as defined in the 11th aspect, wherein, as shown in FIGS. 9A and 9B for example, if the first sequential circuit is a set-up error path, a plurality of the second sequential circuits exist, and at least one of the second sequential circuits is a hold error path, then the replacing or inserting step comprises the steps of: selecting a cell which is in the set-up error path and has the smallest number of hold error paths; searching a cell, in the logic information, having the same function as and a greater driving capability than the selected cell; and replacing the selected cell with the searched cell.

In the 14th aspect of the present invention, there is provided a computer-aided timing adjusting method as defined in the 11th aspect, wherein, as shown in FIGS. 14A and 14B for example, in the replacing or inserting step, if the first and second sequential circuits are a hold error path and a set-up error path, respectively, then a cell is inserted into a part which is in the hold error path and not in the common part so as not to change the function as before insertion.

In the 15th aspect of the present invention, there is provided a computer-aided timing adjusting method as defined in the 11th aspect, wherein, as shown in FIGS. 14A and 14B for example, if the first sequential circuit is a hold error path, a plurality of the second sequential circuits exist, and at least one of the second sequential circuits is a set-up error path, then the replacing or inserting step comprises the steps of: selecting a cell which is in the hold error path and has the smallest number of set-up error paths; and inserting a cell, in the logic information, before or after the selected cell.

In the 16th aspect of the present invention, there is provided a computer-aided timing adjusting method for adjusting a timing in a semiconductor integrated circuit whose layout and wiring have been designed, the semiconductor integrated circuit including sequential circuits, each of the sequential circuits having first and second flip-flops and a combinational circuit connected between an output of the first flip-flop and the input of the second flip-flop, the first and second flip-flops operating in synchronization with a clock, the sequential circuits having first and second sequential circuits whose combinational circuits have a common part, the method comprising the steps of, as shown in FIGS. 18A and 18B for example,: preparing a timing error information including the types of timing errors and timing error paths, and a logic information including function and driving capability of each cell in the combinational circuits; when the timing error information has one that the first and second sequential circuits each are timing error paths: judging whether or not the types of the timing errors of the timing error paths are the same; and if the types are different, then: counting the number of set-up error paths and the number of hold error paths for each cell in the first sequential circuit; selecting a cell based on the counted number in accordance with a rule of a priority order; and in order to lower the degree of the timing errors, replacing the selected cell with a cell, in the logic information, with the same function and a different driving capability, or inserting a cell, in the logic information, before or after the selected cell so as not to change the function as before insertion.

With the 16th aspect according to the present invention, by providing a priority order for cell selection, the cell to be replaced or the cell insertion position will be narrowed to one, whereby effective adjusting will be performed.

In the 17th aspect of the present invention, there is provided a computer-aided timing adjusting method as defined in the 16th aspect, wherein, as shown in FIGS. 18A and 18B for example, when the first sequential circuit is a set-up error path, the replacing or inserting step comprises the steps of: searching a cell, in the logic information, having the same function as and a greater driving capability than the selected cell; and replacing the selected cell with the searched cell.

In the 18th aspect of the present invention, there is provided a computer-aided timing adjusting method as defined in the 17th aspect, wherein, as shown in FIG. 17 for example, the rule is such that the larger the number of set-up error paths, the higher the priority order, and that, if the number of the set-up error paths are equal, the smaller the number of hold error paths, the higher the priority order.

In the 19th aspect of the present invention, there is provided a computer-aided timing adjusting method as defined in the 17th aspect, wherein, as shown in FIG. 17 for example, in the preparing step, a delay information having the input signal dull value of each cell in the combination circuits is further prepared, wherein the rule is such that a cell in the proceeding stage of a cell with the largest input signal dull value is selected, that, if a plurality of cells are selected thereby, then the larger the number of set-up error paths, the higher the priority order, and that, if the number of the set-up error paths are equal, then the smaller the number of hold error paths, the higher the priority order.

In the 20th aspect of the present invention, there is provided a computer-aided timing adjusting method as defined in the 16th aspect, as shown in FIGS. 20A and 20B for example, in the replacing or inserting step, when the first sequential circuit is a hold error path, a cell is inserted before or after the selected cell so as not to change the function as before insertion.

In the 21st aspect of the present invention, there is provided a computer-aided timing adjusting method as defined in the 20th aspect, wherein, as shown in FIGS. 20A and 20B for example, the rule is such that the smaller the number of set-up error paths, the higher the priority order, and that, if the number of the set-up error paths are equal, the larger the number of hold error paths, the higher the priority order.

In the 22nd aspect of the present invention, there is provided a computer-aided timing adjusting method as defined in the 1st, 6th, 12th, 13th or 17th aspect, wherein, in the logic information, cells are classified into families, each of the families having the same function and the same number of input and output, wherein, in the searching step, a cell is searched in the same family as the selected cell.

In the 23rd aspect of the present invention, there is provided a computer-aided timing adjusting method as defined in the 5th, 11th or 16th aspect, wherein, as shown in FIGS. 24A through 24D for example, in the preparing step, the timing error information includes hold shortage time at each hold error path, the delay information includes signal propagation delay time of each cell and wiring-between adjacent cells in the combinational circuits, and the logic information includes basic delay time of each cell, the basic delay time being propagation delay time of cell itself under a predetermined condition, wherein, in the inserting step, cells, the sum of the basic delay times of which is equal to or larger than the hold shortage time, are selected and inserted.

In the 24th aspect of the present invention, there is provided a computer-aided timing adjusting method as defined in the 23rd aspect, wherein, as shown in FIGS. 27A through 27D for example, in the inserting step, candidates of cells, in the logic information, to be inserted are narrowed manually, and a cell to be inserted is automatically selected.

With the 24th aspect according to the present invention, excessive adjusting will be prevented more securely.

In the 25th aspect of the present invention, there is provided a computer-aided timing adjusting method as defined in the 1st, 5th, 11th or 16th aspect, as shown in FIG. 2 for example, further comprising a step of setting a lower limit before adjusting timing errors, wherein, in the preparing step, the timing error information includes shortage time which is set-up shortage time or hold shortage time; wherein, in the replacing or inserting step, the replacing or inserting is performed only for timing error path whose shortage time is larger than the lower limit.

With the 25th aspect according to the present invention, even if the shortage time is smaller than the lower limit and the timing error path is excluded from an object of direct adjusting, since adjusting for the timing error is indirectly performed, it will be corrected. Thus, excessive adjusting will be prevented, and the adjusting time will be shortened.

In the 26th aspect of the present invention, there is provided a computer-aided timing adjusting method as defined in the 1st aspect, as shown in FIGS. 21A through 21D for example, further comprising a step of calculating signal propagation delay time of adjusted set-up error path, wherein the selecting, searching, replacing, and calculating steps are repeatedly executed until the set-up error is corrected.

With the 26th aspect according to the present invention, every time of replacing, cell to be replaced will be effectively selected.

In the 27th aspect of the present invention, there is provided a computer-aided timing adjusting method as defined in the 1st aspect, as shown in FIGS. 22A through 22D for example, further comprising a step of calculating signal propagation delay time of adjusted set-up error path, wherein the searching, replacing, and calculating steps are repeatedly executed until the set-up error is corrected.

With the 27th aspect according to the present invention, the number of cells to be replaced will be less than in the case of the 26th aspect, whereby influence on non-adjusted paths will be reduced.

In the 28th aspect of the present invention, there is provided a computer-aided timing adjusting method as defined in the 5th, 11th or 16th aspect, as shown in FIGS. 21A through 21D or FIGS. 22A through 22D for example, further comprising a step of calculating signal propagation delay time of adjusted timing error path, wherein the replacing or inserting, and calculating steps are repeatedly executed until the timing error is corrected.

In the 29th aspect of the present invention, there is provided a computer-aided timing adjusting method as defined in the 1st aspect, as shown in FIG. 23 for example, further comprising the steps of: detecting timing errors in the semiconductor integrated circuit after the replacing step; and renewing the timing error information and the delay information; wherein the selecting, searching, replacing, detecting and renewing steps are repeatedly executed until all the set-up errors are corrected.

With the 29th aspect according to the present invention, timing adjusting is repeatedly performed full-automatically.

In the 30th aspect of the present invention, there is provided a computer-aided timing adjusting method as defined in the 5th, 11th or 16th aspect, as shown in FIG. 23 for example, further comprising the steps of: detecting timing errors in the semiconductor integrated circuit after the replacing or inserting step; and renewing the timing error information; wherein the selecting, searching, replacing or inserting, detecting and renewing steps are repeatedly executed until all the timing errors are corrected.

In the 31st aspect of the present invention, there is provided a storage medium stored with a program for executing a computer-aided timing adjusting method for adjusting a timing in a semiconductor integrated circuit whose layout and wiring have been designed, the semiconductor integrated circuit including sequential circuits, each of the sequential circuits having first and second flip-flops and a combinational circuit connected between an output of the first flip-flop and the input of the second flip-flop, the first and second flip-flops operating in synchronization with a clock, the method comprising the steps of: preparing a timing error information including the types of timing errors and timing error paths, a delay information relating to signal propagation delay, and a logic information including function and driving capability of each cell in the combinational circuits; when the timing error information has one that the sequential circuit is a set-up error path: selecting a cell which is estimated with referring to the delay information to be the greatest cause for the set-up error arising; searching a cell whose function is the same as the selected cell and driving capability is larger than the selected cell; and replacing the selected cell with the searched cell.

In the 32nd aspect of the present invention, there is provided a computer-aided timing adjusting apparatus for adjusting a timing in a semiconductor integrated circuit whose layout and wiring have been designed, the semiconductor integrated circuit including sequential circuits, each of the sequential circuits having first and second flip-flops and a combinational circuit connected between an output of the first flip-flop and the input of the second flip-flop, the first and second flip-flops operating in synchronization with a clock, the apparatus comprising: a storage device for storing a timing error information including the types of timing errors and timing error paths, a delay information relating to signal propagation delay, and a logic information including function and driving capability of each cell in the combinational circuits; and a computer for executing the steps of: when the timing error information has one that the sequential circuit is a set-up error path: selecting a cell which is estimated with referring to the delay information to be the greatest cause for the set-up error arising; searching a cell whose function is the same as the selected cell and driving capability is larger than the selected cell; and replacing the selected cell with the searched cell.

With the 32nd aspect according to the present invention, since the ratio of the decreasing amount of path delay time to the increasing amount of the driving capability becomes relatively greater, whereby it will be effective and the timing adjusting time will be shortened.

In the 33rd aspect of the present invention, there is provided a computer-aided timing adjusting apparatus for adjusting a timing in a semiconductor integrated circuit whose layout and wiring have been designed, the semiconductor integrated circuit including sequential circuits, each of the sequential circuits having first and second flip-flops and a combinational circuit connected between an output of the first flip-flop and the input of the second flip-flop, the first and second flip-flops operating in synchronization with a clock, the sequential circuits having first and second sequential circuits whose combinational circuits have a common part, the apparatus comprising: a storage device for storing a timing error information including the types of timing errors and timing error paths, and a logic information including function and driving capability of each cell in the combinational circuits; a computer for executing the steps of: when the timing error information has one that the first and second sequential circuits each are timing error paths: judging whether or not the types of the timing errors of the timing error paths are the same; and if the types are the same, then, in order to lower the degree of the both timing errors, replacing a cell in the common part with a cell, in the logic information, with the same function and a different driving capability, or inserting a cell in the logic information into the common part without changing the function of the common part.

With the 33rd aspect according to the present invention, since the timings in the same type and plurality of timing error paths are simultaneously and effectively adjusted, the timing adjusting time will be shortened.

In the 34th aspect of the present invention, there is provided a computer-aided timing adjusting apparatus for adjusting a timing in a semiconductor integrated circuit whose layout and wiring have been designed, the semiconductor integrated circuit including sequential circuits, each of the sequential circuits having first and second flip-flops and a combinational circuit connected between an output of the first flip-flop and the input of the second flip-flop, the first and second flip-flops operating in synchronization with a clock, the sequential circuits having first and second sequential circuits whose combinational circuits have a common part, the apparatus comprising: a storage device for storing a timing error information including the types of timing errors and timing error paths, and a logic information including function and driving capability of each cell in the combinational circuits; a computer for executing the steps of: when the timing error information has one that the first and second sequential circuits each are timing error paths: judging whether or not the types of the timing errors of the timing error paths are the same; and if the types are the same, then, in order to lower the degree of the both timing errors, replacing a cell in the combinational circuit of the first sequential circuit and not in the common part with a cell, with the same function and a different driving capability, or inserting a cell in the logic information into the common part without changing the function of the common part.

With the 34th aspect according to the present invention, since the timing of mainly and only a targeted timing error path is adjusted, the timing of a complicated multi timing error path will be effectively adjusted.

In the 35th aspect of the present invention, there is provided a computer-aided timing adjusting apparatus for adjusting a timing in a semiconductor integrated circuit whose layout and wiring have been designed, the semiconductor integrated circuit including sequential circuits, each of the sequential circuits having first and second flip-flops and a combinational circuit connected between an output of the first flip-flop and the input of the second flip-flop, the first and second flip-flops operating in synchronization with a clock, the sequential circuits having first and second sequential circuits whose combinational circuits have a common part, the apparatus comprising: a storage device for storing a timing error information including the types of timing errors and timing error paths, and a logic information including function and driving capability of each cell in the combinational circuits; a computer for executing the steps of: when the timing error information has one that the first and second sequential circuits each are timing error paths: judging whether or not the types of the timing errors of the timing error paths are the same; and if the types are different, then: counting the number of set-up error paths and the number of hold error paths for each cell in the first sequential circuit; selecting a cell based on the counted number in accordance with a rule of a priority order; and in order to lower the degree of the timing errors, replacing the selected cell with a cell, in the logic information, with the same function and a different driving capability, or inserting a cell, in the logic information, before or after the selected cell so as not to change the function as before insertion.

With the 35th aspect according to the present invention, by providing a priority order for cell selection, the cell to be replaced or the cell insertion position will be narrowed to one, whereby effective adjusting will be performed.

Other aspects, objects, and the advantages of the present invention will become apparent from the following detailed description taken in connection with the accompanying drawings.

BRIEF DESCRIPTION OF THE DRAWINGS

FIG. 5 is a detailed flow chart of the step SS2 in FIG. 2;

FIG. 24A is a flow chart showing a selection procedure of a cell to be inserted of the ninth embodiment according to the present invention, and FIGS. 24B through 24D are illustrations for FIG. 24A;

FIG. 26A is a flow chart showing a selection procedure of a cell to be inserted of the eleventh embodiment according to the present invention, and FIGS. 26B through 26D are illustrations for FIG. 26A;

FIG. 27A is a flow chart showing a selection procedure of a cell to be inserted of the twelfth embodiment according to the present invention, and FIGS. 27B through 27D are illustrations for FIG. 27A;

DESCRIPTION OF THE PREFERRED EMBODIMENTS

Figure 1:
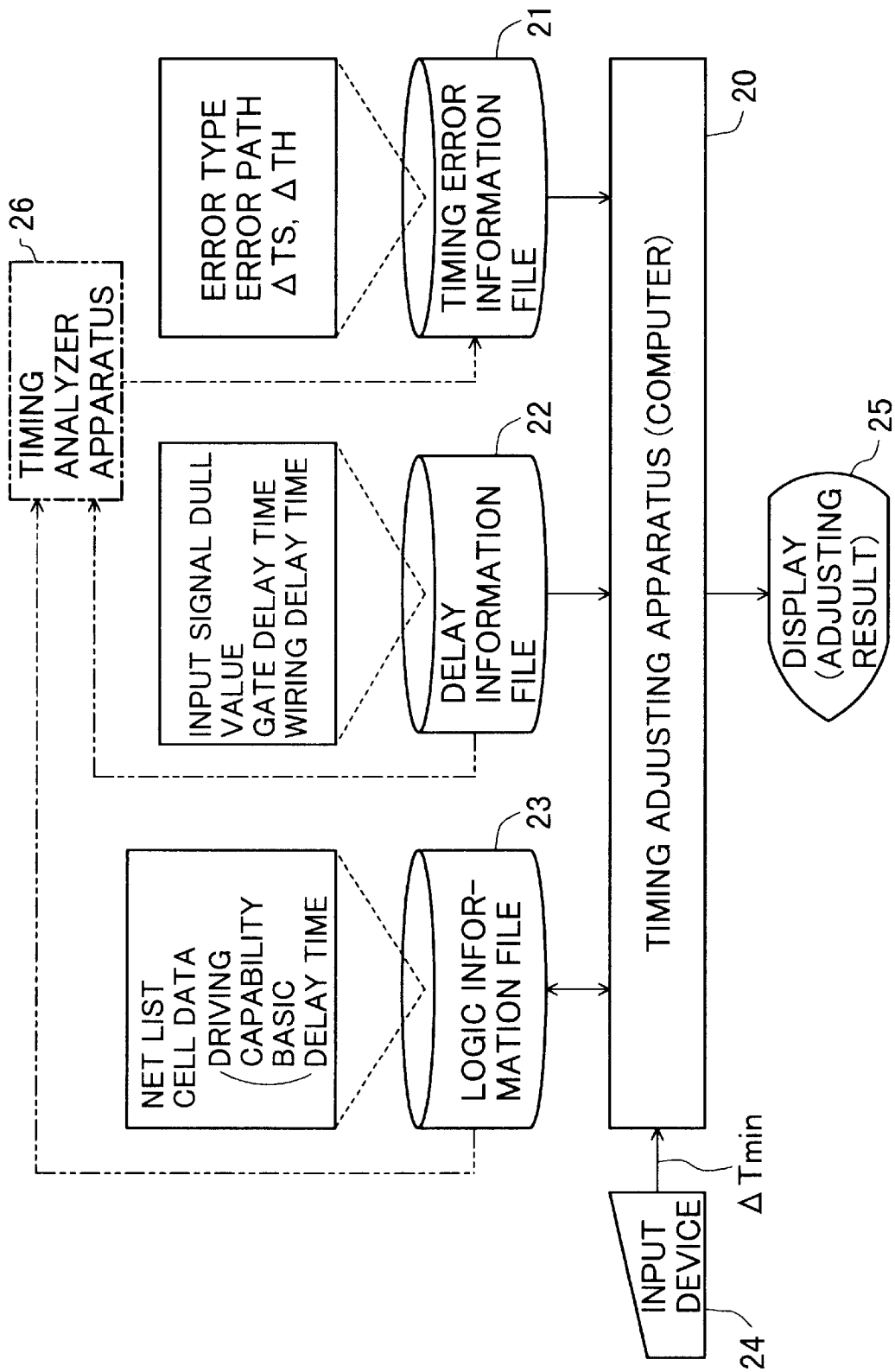
FIG. 1 is a schematic block diagram of a timing adjusting system of the first embodiment according to the present invention.

Referring now to the drawings, wherein like reference characters designate like or corresponding parts throughout several views, preferred embodiments of the present invention are described below.

First Embodiment

Figure 3A:
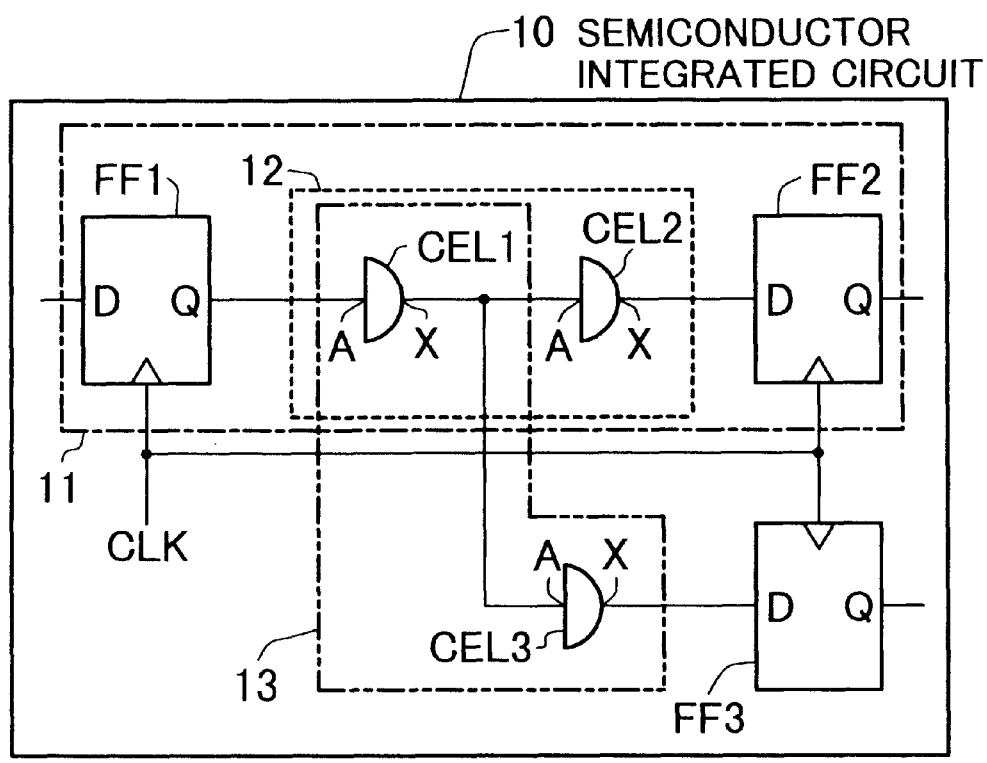
FIG. 3A is a circuit diagram showing an object of timing adjusting.

Referring to FIG. 3A, in a semiconductor integrated circuit 10 whose layout has been designed, a timing error arises at a sequential circuit 11 as a unit. The sequential circuit 11 has flip-flops FF1 and FF2 and a combinational circuit 12 connected between the data output of the flip-flop FF1 and the data input of flip-flop FF2. Data held in the flip-flop FF1 at the rise of a clock CLK passes through the combinational circuit 12, and is held in the flip-flop FF2 at the next rise of the clock CLK.

Figure 3B:
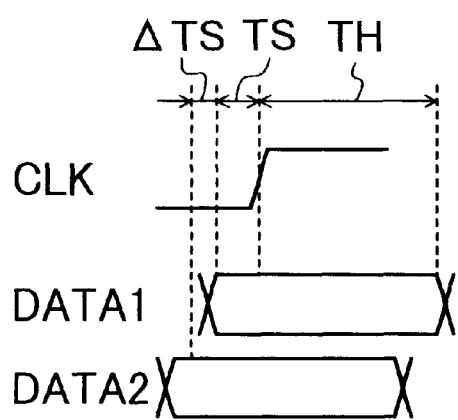
FIGS. 3B and 3C are time charts to illustrate set-up error and hold error, respectively.

If the setup time TS from reaching of data DATA1 to the input pin D of the flip-flop FF2 until a rise of the clock CLK is too short as shown in FIG. 3B, due to variation in the manufacturing process and change in temperature of a semiconductor chip, TS turns negative, whereby a malfunction will occur. If the time that guarantees a malfunction does not occur lacks by ΔTS, namely set-up shortage time ΔTS>0 as shown in FIG. 3B, the sequential circuit 11 is judged as a set-up error path in the timing error analysis. In this case, as described below, by replacing a cell CEL1 or CEL2 in the combinational circuit 12 with another cell, the data DATA1 becomes DATA2 as shown in FIG. 3B, that is, ΔTS<0, which means the timing error is corrected. Herein, a cell may be any basic gate such as an AND gate or inverter.

Figure 3C:
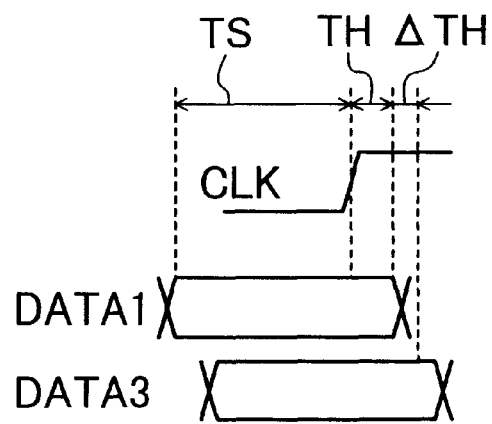

If the hold time TH from a rise of the clock CLK until data DATA1 changes to the next data at the input pin D of the flip-flop FF2 is too short as shown in FIG. 3C, the malfunction will occur like described above. If the time that guarantees a malfunction does not occur is short by ΔTH, namely hold shortage time ΔTH>0 as shown in FIG. 3C, the sequential circuit 11 is judged as a hold error path in the timing error analysis. In this case, as described below, by inserting a cell in the combinational circuit 12, the data DATA1 becomes DATA3 as shown in FIG. 3C, that is, ΔTH<0, which means the timing error is corrected. Although a cell may be replaced to correct the hold timing error, it is better to insert a cell which has a small driving capability and a small area since the total area becomes smaller in general. So, only cell insertion in the case of a hold error path is considered in the description below.

Referring to FIG. 3A, there is another sequential circuit which has the flip-flop FF1, a flip-flop FF3 and a combinational circuit 13 having cells CEL1 and CEL3 between the output pin Q of the flip-flop FF1 and the data input pin D of the flip-flop FF3. The cell CEL1 is a common part for combinational circuits 12 and 13.

In such a configuration, there are two cases, one being that only one of the sequential circuits is a timing error path, and the other being that both sequential circuits are timing error paths. In the latter case, there are two cases, one being that both timing error types are the same, and the other being that they are different. The first embodiment, as described below, is contrived so that timing adjusting is more effectively performed in accordance with each case.

FIG. 1 shows the schematic configuration of a timing adjusting system of the first embodiment according to the present invention. A timing adjusting apparatus 20 comprised of a computer, which performs timing adjusting based on the contents of a timing error information file 21, a delay information file 22 and a logic information file 23 stored in a storage apparatus and input values from an input device 24 such as a keyboard, and the results are displayed on a display 25. As known in the art, a timing analyzer apparatus 26 comprised of a computer produces the timing error information file 21 based on the delay information file 22 and logic information file 23.

Using the reference characters in FIG. 3A, the content of the timing error information file 21 is, for example, as follows:

| | |
|---|---|
| ERROR TYPE: | SETUP |
| START PIN: | FF1.Q |
| END PIN: | FF2.D |
| DELTA: | 100 ps |
| ERROR TYPE: | HOLD |
| START PIN: | FF1.Q |

-continued

| | |
|---|---|
| END PIN: | FF3.D |
| DELTA: | 10 ps |

The meaning of this list is as follows. The first record shows that a set-up error path is from the output pin Q of the flip-flop FF1 to the input pin D of the flip-flop FF2 and set-up shortage time ΔTS=100 ps, and the second record shows that a hold error path is from the output pin Q of the flip-flop FF1 to the input pin D of the flip-flop FF3 and hold shortage time ΔTH=10 ps.

The configurations of combinational circuit 12 in the set-up error path and combinational circuit 13 in the hold error path can be got from a net list in the logic information file 23. In order to omit this getting process, the content of the timing error information file 21 may be made as follows:

| | |
|---|---|
| ERROR TYPE: | SETUP |
| START PIN: | FF1.Q |
| | CEL1.A, X |
| | CEL2.A, X |
| END PIN: | FF2.D |
| DELTA: | 100 ps |
| ERROR TYPE: | HOLD |
| START PIN: | FF1.Q |
| | CEL1.A, X |
| | CEL3.A, X |
| END PIN: | FF3.D |
| DELTA: | 10 ps |

The error path of the above first record is the output pin Q of the flip-flop FF1→the input pin A of the cell CEL1→the output pin X of the cell CEL1→the input pin A of the cell CEL2→the output pin X of the cell CEL2→the input pin D of the flip-flop FF2. The error path of the above second record is the output pin Q of the flip-flop FF1→the input pin A of the cell CEL1→the output pin X of the cell CEL1→the input pin A of the cell CEL3→the output pin X of the cell CEL3→the input pin D of the flip-flop FF3.

The delay information file 22 contains, regarding the semiconductor integrated circuit 10 whose layout has been designed, a signal dull value at each gate input and calculated results of each gate propagation delay time and each wiring propagation delay time between gates. Signal dull value is, for example, rise time, fall time or an average of the both times.

The logic information file 23 contains a net list and cell data, and the cell data contains the driving capability of cells and basic delay time which is the gate propagation delay time under a predetermined condition.

Next, processing by the timing adjusting apparatus 20 will be described referring to FIG. 2. Hereinafter, the characters in parentheses are step identification ones in the figures.

(S1) The lower limit ΔTmin of the shortage time ΔT of error path in adjusting object is inputted from the input device 24. Herein, the shortage time ΔT is the above-mentioned set-up shortage time ΔTS or hold shortage time ΔTH. For example, in the case of ΔTS=100 ps, ΔTH=10 ps and ΔTmin=20 ps, set-up error paths are the objects to be adjusted, however, hold error paths are excluded from the objects to be adjusted. Even when it is excluded from the object to be adjusted, as described below, the error may be indirectly corrected. ΔTmin is set by taking into consideration for this, and the meaning thereof will become clear later.

(S2) The next one of timing error paths is read from the timing error information file 21. The read timing error path (targeted timing error path) is processed as follows.

(S3) If the targeted timing error path exists, then the process proceeds to a step S4, or else the process proceeds to a step S9.

(S4) Regarding the targeted timing error path, if $\Delta T < \Delta Tmin$, the process returns to the step S2, otherwise, the process proceeds to a step S5.

(S5 through S7) In accordance with the above-described classification in regard to FIG. 3A, processing of the cell selection and its replacement, or processing of the cell-insertion-position selection and its insertion is performed. Namely, When the targeted timing error path is a set-up error, if the path has no overlapping error, processing of a step SS1 is performed, or else, that is, it is a multi timing error path, processing of a step SS2 is performed. When the targeted timing error path is a hold error, if it has no overlapping error, processing of a step SH1 is performed, or else, processing of a step SH2 is performed. These processings will be described below in detail.

(S8) In accordance with the above cell replacement or insertion, the net list within the logic information file 23 is renewed. However, since a case where the original net list becomes necessary may be considered, the original net list is saved, and deleted when it has become unnecessary. Next, the process returns to the step S2.

(S9) For example, the following adjusting results are displayed on the display 25.

| | |
|---|---|
| ERROR: | SETUP |
| START: | FF1.Q |
| END: | FF2.D |
| DELTA: | 100 |
| DELAY: | 1500→1410 |
| STATUS: | INCOMPLETE |
| A: | a1l→a1h |
| ERROR: | HOLD |
| START: | FF3.Q |
| END: | FF4.D |
| DELTA: | 50 |
| DELAY: | 1000→1100 |
| STATUS: | COMPLETE |
| B.X - INSC.A | (a1m) |
| . | |
| . | |
| . | |
| *summary* | |
| TOTAL ERROR: | 300 |
| TOTAL ADJUST: | 250 |
| REPLACE: | 10 |
| INSERT: | 100 |
| *histogram* | |
| 1–100: | 40 |
| 101–200: | 10 |
| error path: | 50 |

The meaning of this list is as follows.

The first record shows that a set-up error path is from the output pin Q of the flip-flop FF1 until the input pin D of the flip-flop FF2, before adjusting $\Delta TS=100$ ps and a path delay time (exactly, a signal propagation delay time of a path) is DLT=1500 ps, and the path delay time becomes DLT=1410 ps, namely the shortage time $\Delta TS$ decreases by 90 ps by replacing a cell A (the cell name in the logic information file 23 is a1l) in the error path with a cell a1h in the logic information file 23, however, since $\Delta TS=100-90>0$, the timing error is not completely corrected. The second record shows that a hold error path is from the output pin Q of the flip-flop FF3 until the input pin D of the flip-flop FF4, before adjusting $\Delta TH=50$ ps and DLT=1000 ps, and by connecting the output pin X of a cell B to the input pin A of an insertion cell INSC (the cell name in the logic information file 23 is a1m), the DLT becomes 1100 ps, namely the shortage time $\Delta TH$ increases by 100, and thereby $\Delta TH=50-100<0$, therefore the timing error is corrected. The connection destination of the insertion cell INSC can be got from the net list before renewal, and therefore, it is not described in the above list.

250 of 300 timing error paths in the semiconductor integrated circuit are corrected by replacing 10 cells and inserting 100 cells, and of the remaining 50 timing error paths, 40 are $1 \leq \Delta T \leq 100$ ps and 10 are $101 \leq \Delta T \leq 200$ ps.

Next, referring to FIGS. 4A through 4C, step SS1 in FIG. 2 will be described in detail.

(S10) The input signal dull value in the targeted set-up error path is read from the delay information file 22, and in this path, a cell in the proceeding stage of the cell of the input-signal largest dull value is selected.

Figure 4A:
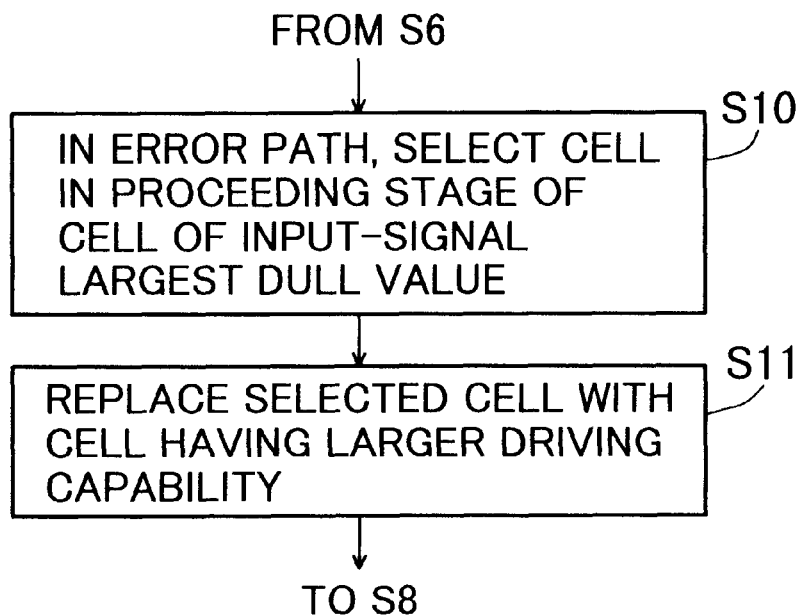
FIG. 4A is a flow chart showing the content of the step SS1 in FIG. 2, and FIGS. 4B and 4C are illustrations showing circuits before and after cell replacement in this step, respectively.
Figure 4B:
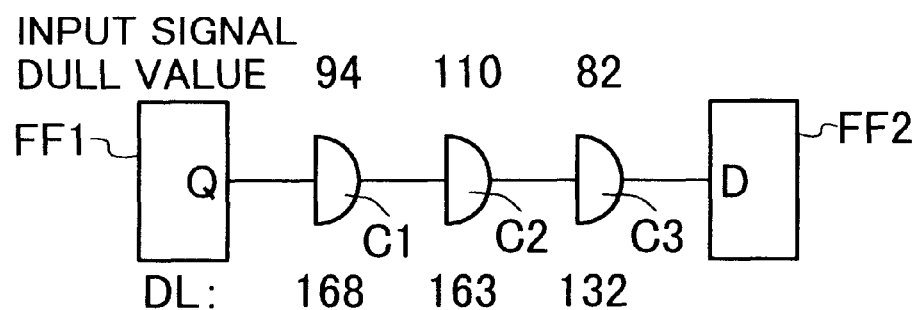

For example, in FIG. 4B, in a case where a circuit, in which the output pin Q of the flip-flop FF1 is connected to the input pin D of the flip-flop FF2 via cells C1, C2 and C3, is a set-up error path, and the input signal dull values of the cells C1, C2 and C3 are 94 ps, 110 ps, and 82 ps, respectively, the cell C1 in the preceding stage of the cell C2 is selected.

(S11) In the logic information file 23, the cell C1A which is in the same family as the cell C1 and the driving capability of which is closest to and larger than that of the cell C1 is searched, and the cell C1 is replaced with C1A. Herein, the same family means a group of cells having the same function and the same input and output numbers, and cell data (intrinsic cell data) in the logic information file 23 are classified into families.

Figure 4C:
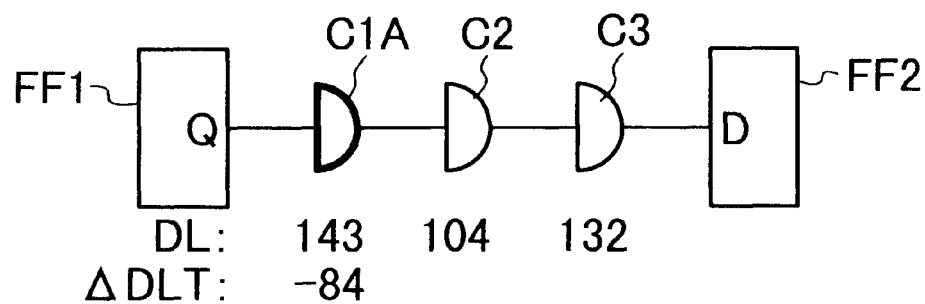

FIG. 4C shows the circuit after this replacement. The bold line shows the replaced cell (and so forth). In FIGS. 4B and 4C, the sum DL of the propagation delay times of a gate (cell) and the propagation delay time of its input side wiring (hereinafter, referred to as delay time DL of a cell for short) is shown for each cell, and by this replacement, the delay times DL of the replaced cell and the succeeding cell decrease, whereby the path delay time DLT decreases by 84 ps, for example.

According to this replacement, the ratio of the decreasing amount of path delay time DLT to the increasing amount of driving capability will become relatively great, which is effective.

Next, referring to FIGS. 5 through 9B, the step SS2 in FIG. 2 will be described. In FIGS. 6A through 9B, the FF1 through FF4 are flip-flops, and C1 through C5 and C1A and C3A each are cells.

(S20) Referring to the timing error information file 21, if the targeted set-up error path overlaps with other set-up error path, the process proceeds to step S21, and if it overlaps with the hold error path, the process proceeds to step S28.

(S21) Referring to the timing error information file 21, the number NS of set-up error paths is counted for each cell in the targeted set-up error path.

Figure 6A:
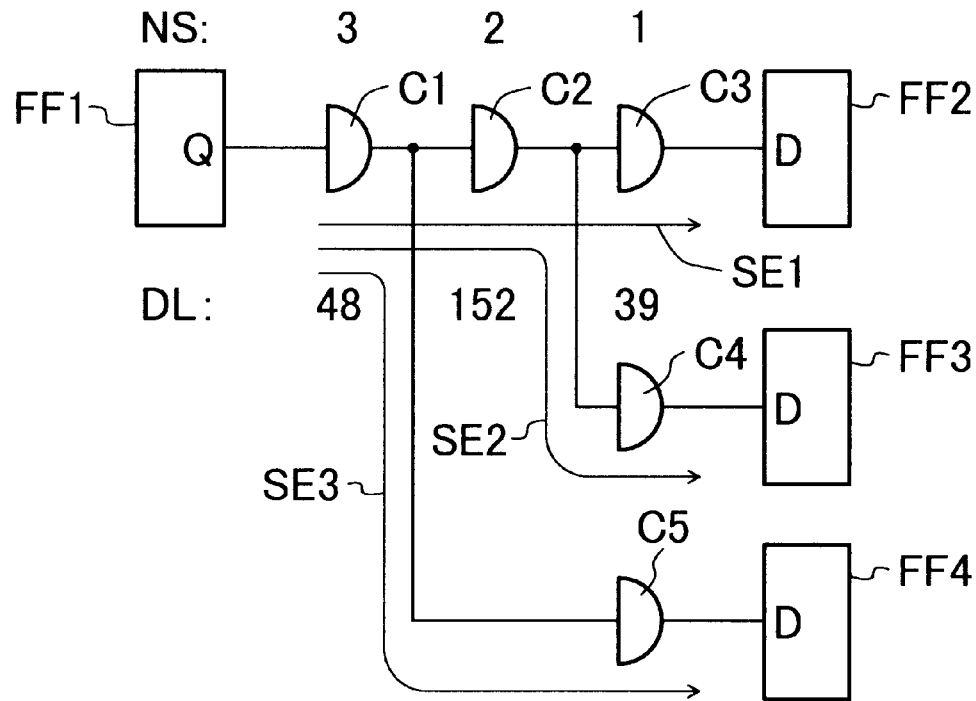
FIG. 6A is an illustration of the steps S20 through S22 in FIG. 5.

For example, in FIG. 6A, in a case where a targeted set-up error path SE1 is from the flip-flop FF1 to the flip-flop FF2, and is partially overlapped with a set-up error path SE2 being from the flip-flop FF1 to the flip-flop FF3 and a set-up error path being from the flip-flop FF1 to the flip-flop FF4, the number NS of set-up error paths is counted for each cell C1, C2, and C3 in the targeted set-up error path SE1. In this case, the counts NS for cells C1, C2, and C3 are 3, 2, and 1, respectively.

(S22) A cell with the largest number NS of set-up error paths is selected as an object to be replaced. In the case of FIG. 6A, the cell C1 is selected.

(S23) If only one cell is selected, then the process proceeds to step S24, and else the process proceeds to step S25.

(S24) The selected cell is replaced in the same manner as in the step S11.

Figure 6B:
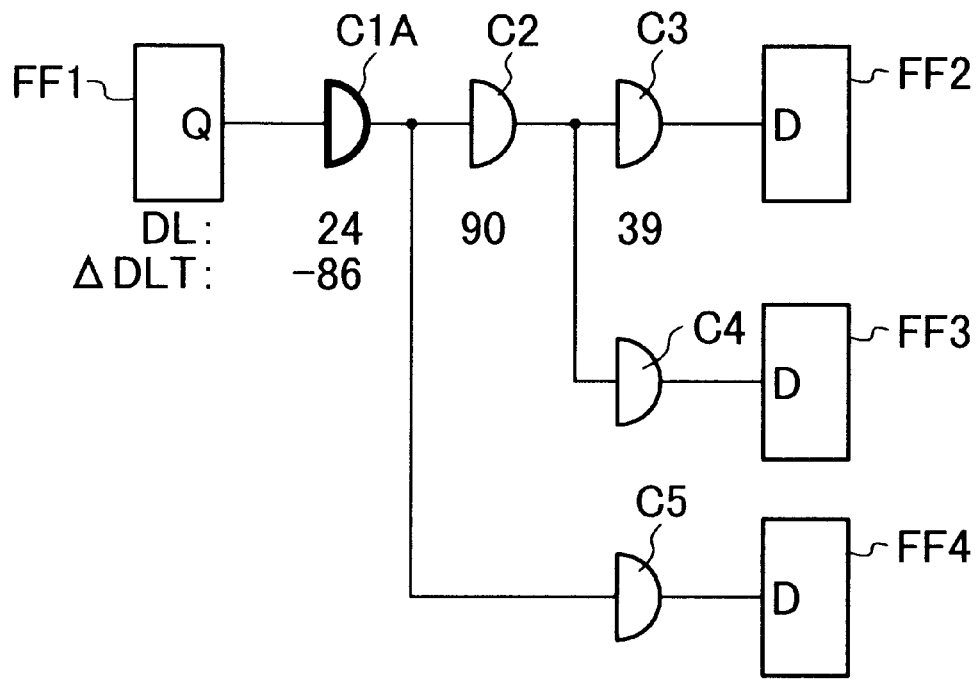
FIG. 6B is an illustration of the step S24 in FIG. 5 in the case of FIG. 6A.

Thereby, the cell C1 in FIG. 6A is replaced with the cell C1A and the circuit becomes such as in FIG. 6B. Before replacement, the delay times DL of the cell C1 and C2 are 48 ps and 152 ps, respectively, and by this replacement, become 24 ps and 90 ps, respectively, and the changed amount ΔDLT of the path delay time DLT becomes −86 ps. By replacing the cell C1 with C1A, the timings of the set-up error paths SE1, SE2, and SE3 are simultaneously and effectively adjusted.

In other words, although the set-up error paths SE2 and SE3 are not targeted timing error paths, adjusting is indirectly performed for them. Therefore, even if adjusting is not direct, when ΔT<ΔTmin, the errors may be corrected indirectly. Also, excessive adjusting is thus prevented, and the adjusting time is shortened.

Figure 2:
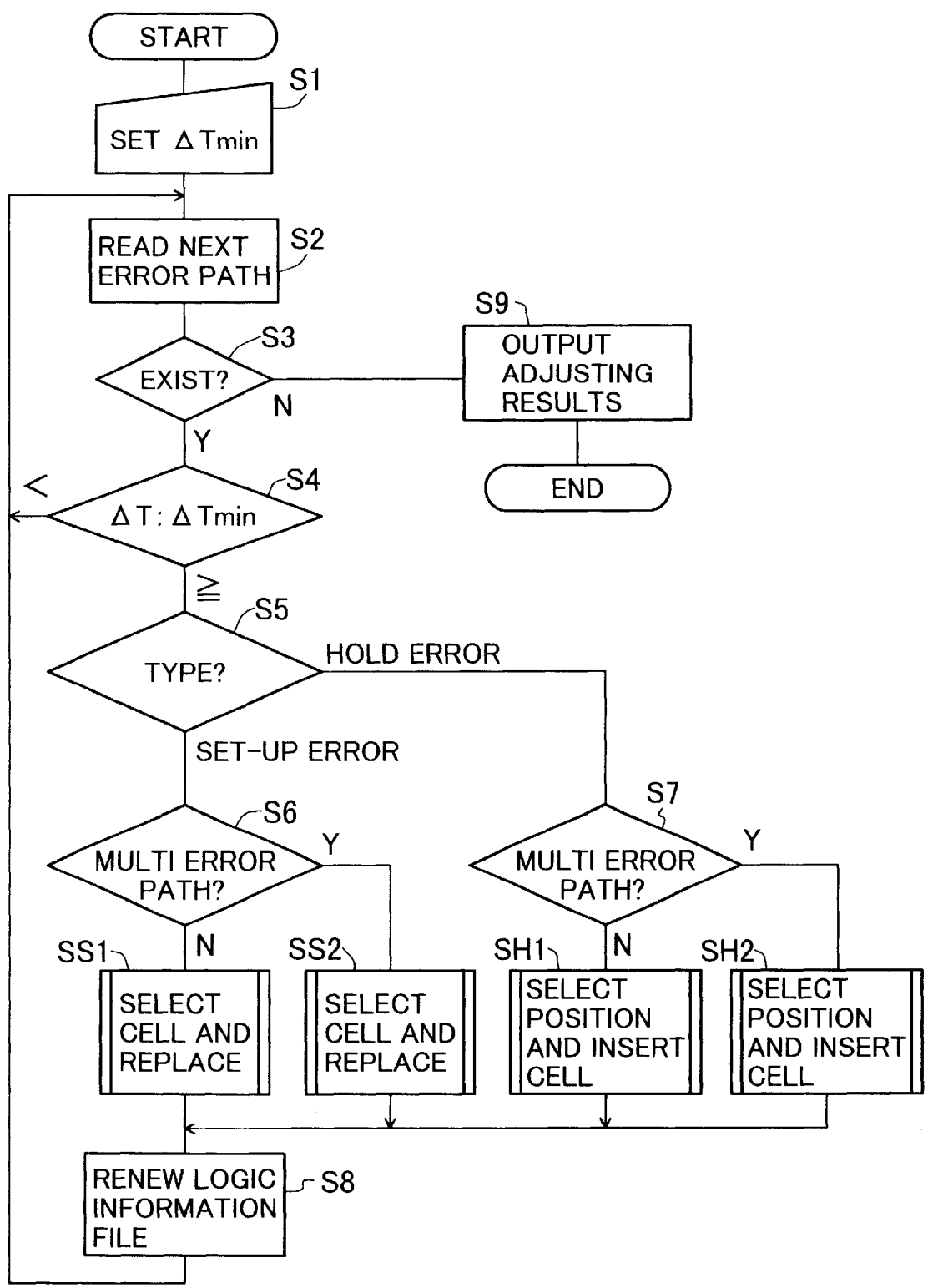
FIG. 2 is a flow chart showing an adjusting procedure of the timing adjusting apparatus in FIG. 1.

Next, the process proceeds to step S8 in FIG. 2.

(S25) When a plurality of cells are selected and positioned at the upstream side of the targeted set-up error path, the process proceeds to step S26, and when it is positioned at the downstream side, the process proceeds to step S27.

(S26) The cell at the most upstream side in the selected cells is selected, and the process proceeds to step S24.

Figure 7A:
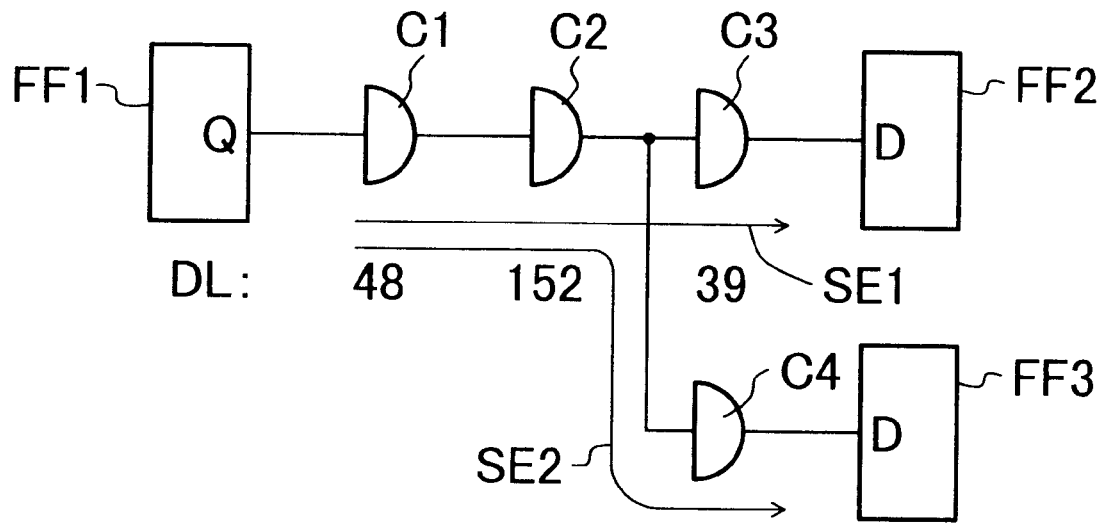
FIGS. 7A and 7B are illustrations of the steps S26 and S24 in FIG. 5, respectively.
Figure 7B:
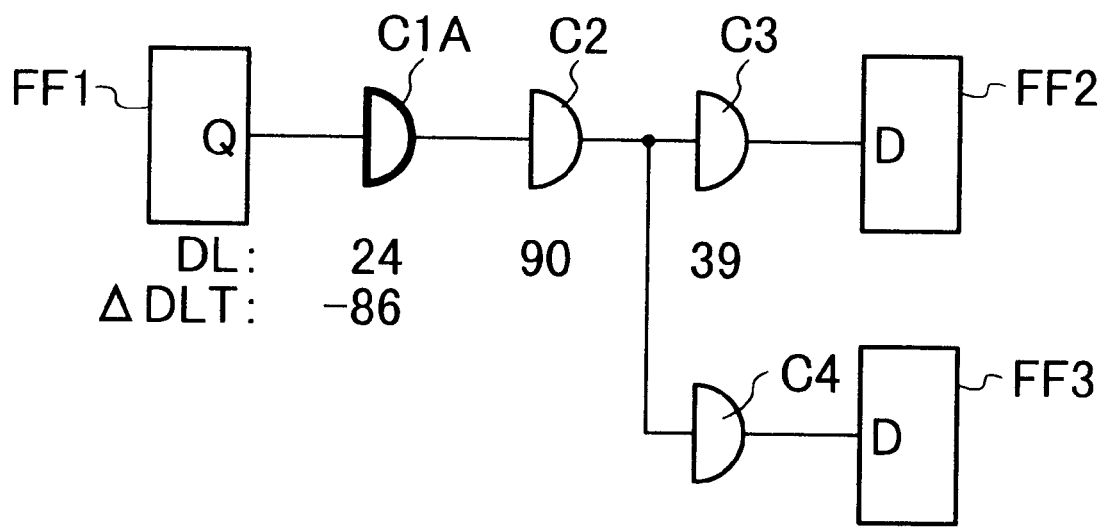

For example, in FIG. 7A, when the cells C1 and C2 are selected in the step S22, the cell C1 at the most upstream side is selected. When the delay times DL of the cells C1 and C2 are 48 ps and 152 ps, respectively, by replacing the cell C1 with C1A in the next step S24, as shown in FIG. 7B, the delay times DL of the cells C1A and C2 become 24 ps and 90 ps, respectively, and ΔDLT=−86 ps.

By such cell selection and replacement, since the delay time DL of only the common part of the set-up error paths SE1 and SE2 decreases, the timings of multi set-up error path will be more effectively and simultaneously adjusted.

(S27) The cell at the most downstream side in the selected cells is selected, and the process proceeds to step S24.

Figure 8A:
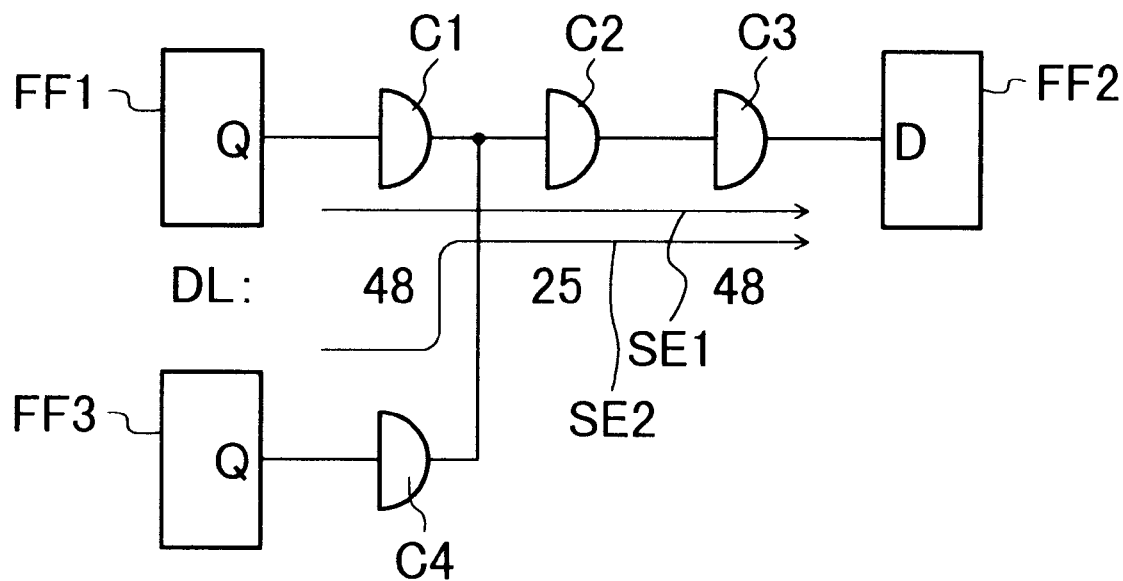
FIGS. 8A and 8B are illustrations of the steps S27 and S24 in FIG. 5, respectively.
Figure 8B:
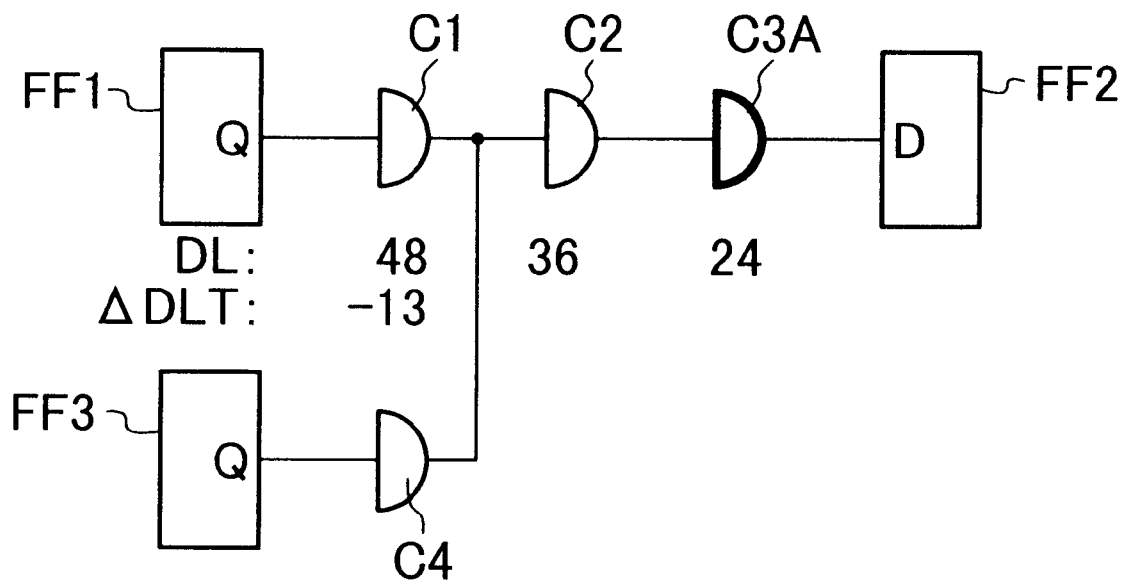

For example, in FIG. 8A, when the cells C2 and C3 are selected in the step S22, the cell C3 at the most downstream side is selected. When the delay times DL of the cells C2 and C3 are 25 ps and 48 ps, respectively, by replacing the cell C3 with C3A in the next step S24, as shown in FIG. 8B, the delay times DL of the cells C2 and C3A become 36 ps and 24 ps, respectively, and ΔDLT=−13 ps.

By such cell selection and replacement, since the delay time DL of only the common part of the set-up error paths SE1 and SE2 decreases, the timings of multi set-up error path will be more effectively and simultaneously adjusted.

(S28) Referring to the timing error information file 21, the number NH of hold error paths is counted for each cell in the targeted set-up error path.

Figure 9A:
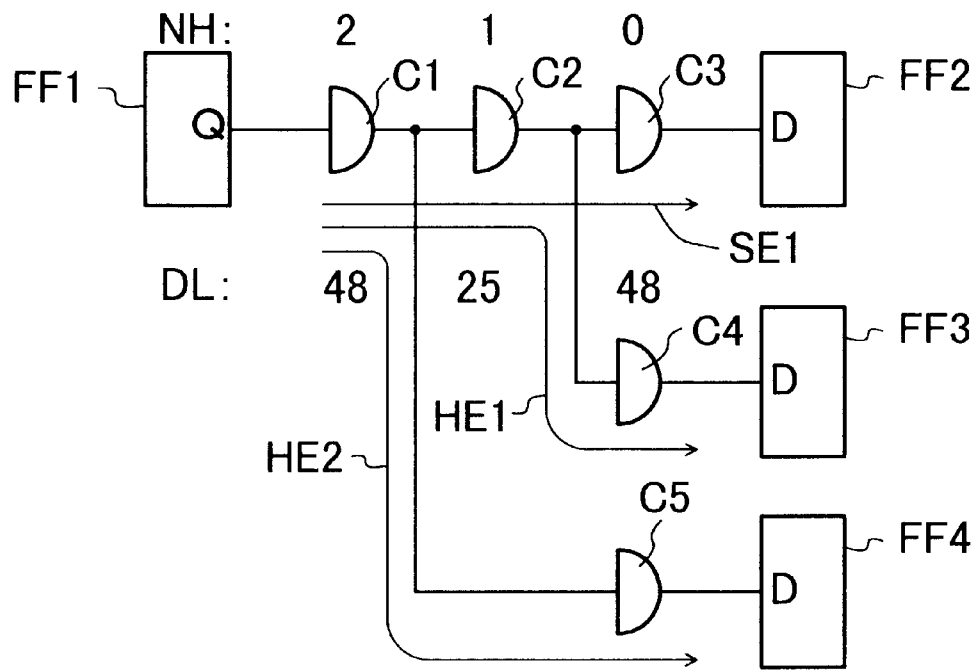
FIG. 9A is an illustration of the steps S28 and S29 in FIG. 5.

For example, in FIG. 9A, in a case where a targeted set-up error path SE1 is from the flip-flop FF1 to the flip-flop FF2, and is partially overlapped with a hold error path HE1 being from the flip-flops FF1 to the flip-flop FF3 and a hold error path HE2 being from the flip-flops FF1 to the flip-flop FF4, the number NH of hold error paths is counted for each cell C1, C2, and C3 in the targeted set-up error path SE1. In this case, the counts of the cells C1, C2, and C3 are 2, 1, and 0, respectively.

(S29) The cell with the smallest number NH of hold error paths is selected as an object to be replaced, and the process proceeds to the step S23.

Figure 9B:
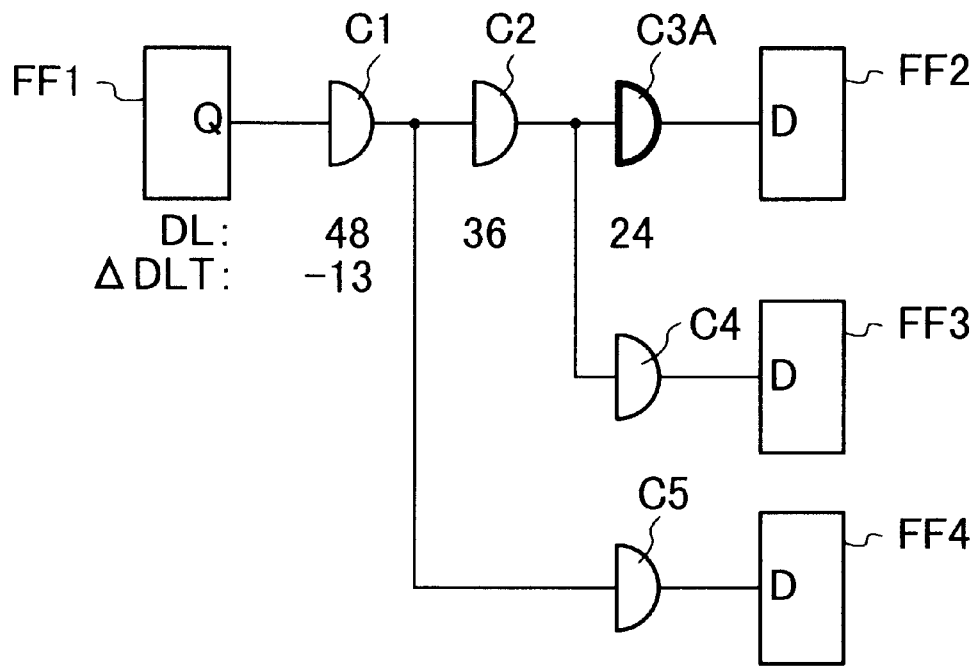
FIG. 9B is an illustration of the step S24 in FIG. 5 in the case of FIG. 9A.

In the case of FIG. 9A, the cell C3 is selected. In the next step S24, the cell C3 is replaced with the cell C3A, whereby, as shown in FIG. 9B, the delay times DL of the cells C2 and C3 become 36 ps and 24 ps, respectively, and ΔDLT=−13 ps.

By such cell selection and replacement, timing adjusting will be performed mainly and only in the targeted set-up error path SE1, and increase in the shortage time ΔTH of hold error path to be separately adjusted will be made 0 or reduced, whereby the timing of complicated multi timing error path will be effectively adjusted.

Next, referring to FIGS. 10 through 14B, the step SH2 in FIG. 2 will be described in detail. In FIGS. 11A through 14B, FF1 through FF4 each are flip-flops, and C1 through C6 each are cells.

(S30) Referring to the timing error information file 21, if the targeted hold error path is overlapped with other hold error path, the process proceeds to a step S31, and if it is overlapped with other set-up error path, the process proceeds to a step S38.

(S31) Referring to the timing error information file 21, the number NH of hold error paths is counted for each cell in the targeted hold error path.

Figure 11A:
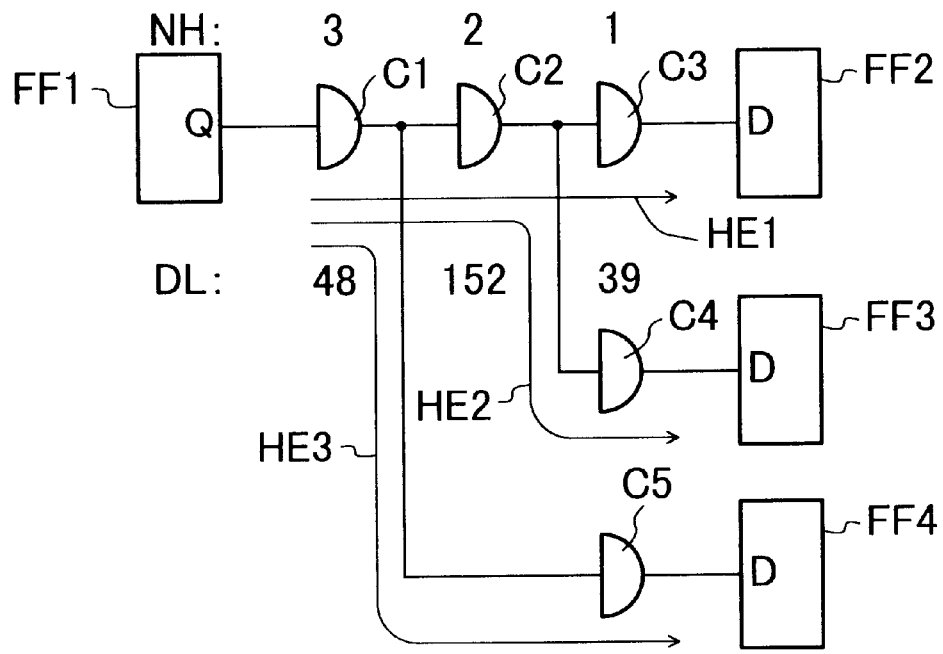
FIG. 11A is an illustration of the steps S30 through S32 in FIG. 10.

For example, in FIG. 11A, in a case where a targeted hold error path HE1 is from the flip-flop FF1 to the flip-flop FF2, and is partially overlapped with a hold error path HE2 being from the flip-flop FF1 to the flip-flop FF3 and a hold error path HE3 being from the flip-flop FF1 to the flip-flop FF4, the number NH of hold error paths is counted for each cell C1, C2, and C3 in the targeted hold error path HE1. In this case, the counts of the cells C1, C2, and C3 are 3, 2, and 1, respectively.

(S32) The cell with the largest number NH of hold error paths is selected as an object to be replaced. In the case of FIG. 11A, the cell C1 is selected.

(S33) If only one cell is selected, the process proceeds to a step 34, and if a plurality of cells are selected, the process proceeds to a step S35.

(S34) A non-inverting gate, for example, a cell in which two inverters are cascaded, or a cell in which one input of a 2 input OR gates is fixed to "0" is read from the logic information file 23 and inserted into the input or output side of the selected cell, for example, into the input side wiring.

Figure 11B:
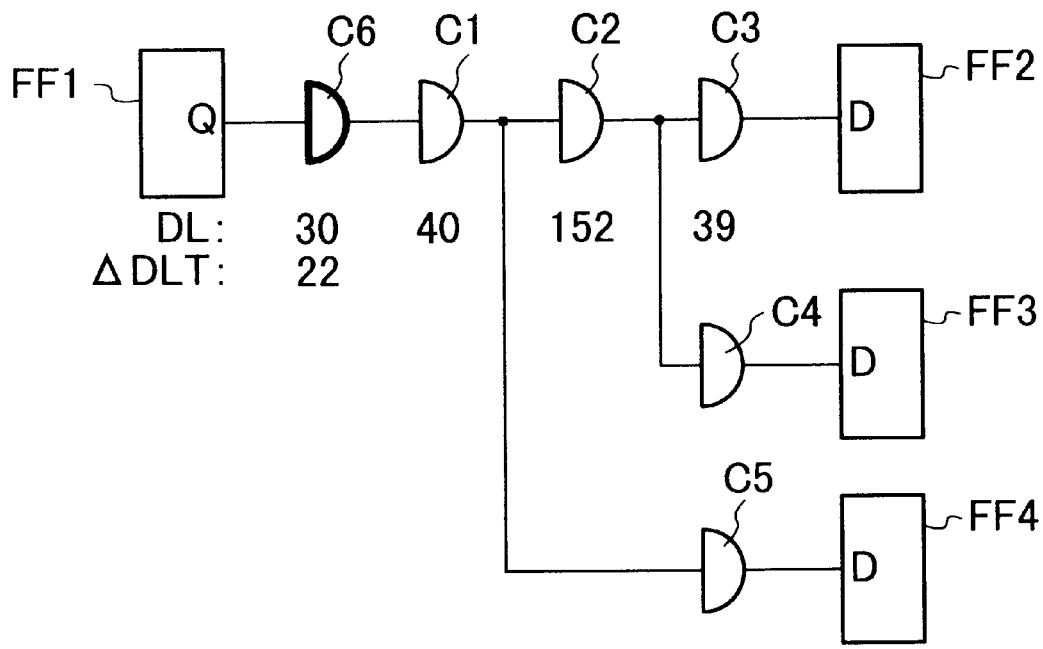
FIG. 11B is an illustration of the step S34 in FIG. 10 in the case of FIG. 11A.

Thereby, a cell C6 is inserted into the wiring at the input side of the cell C1 in FIG. 11A and the circuit becomes as that of FIG. 11B. The bold line in FIG. 11B is the inserted cell (and so forth). The delay time DL of the cell C1 before the insertion is 48 ps, and after the insertion, the delay times DL of the cell C6 and cell C1 become 30 ps and 40 ps, respectively, and the change amount ΔDLT of the path delay time DLT becomes 22 ps. By insertion of the cell C6, the timings of the hold error paths HE1, HE2, and HE3 are simultaneously adjusted, whereby adjusting is effectively performed.

In other words, although the hold error paths HE2 and HE3 are not the targeted timing error paths, timing adjusting is indirectly performed, therefore, even if adjusting is not direct, when ΔT<ΔTmin, the error may be corrected. In addition, by this processing, excessive adjusting is prevented, whereby adjusting time is shortened.

Next, the process proceeds to the step S8 in FIG. 2.

(S35) When a plurality of cells are selected, and positioned at the upstream side of the targeted hold error path, the process proceeds to step S36, and when it is positioned at the downstream side, the process proceeds to step S37.

(S36) The cell at the most upstream side in the selected cells is selected, and the process proceeds to step S34.

Figure 12A:
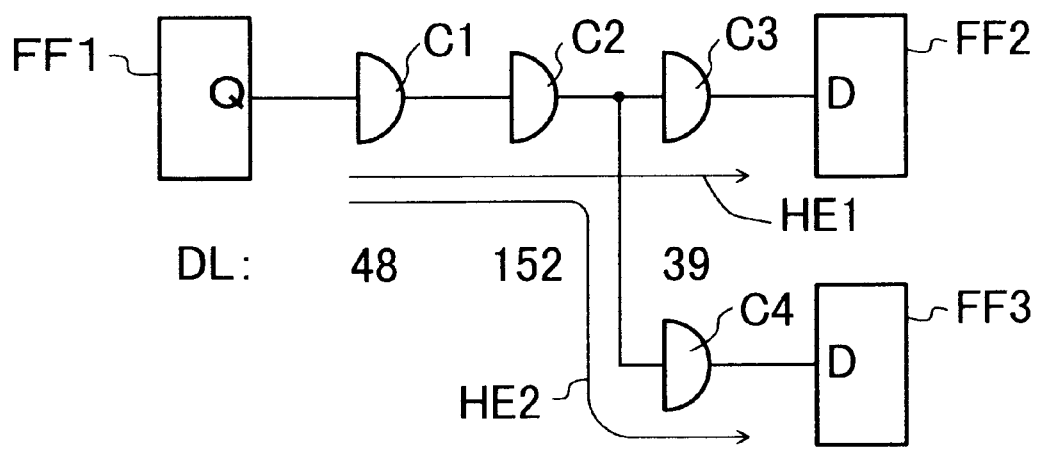
FIGS. 12A and 12B are illustrations of the steps S36 and S34 in FIG. 10, respectively.
Figure 12B:
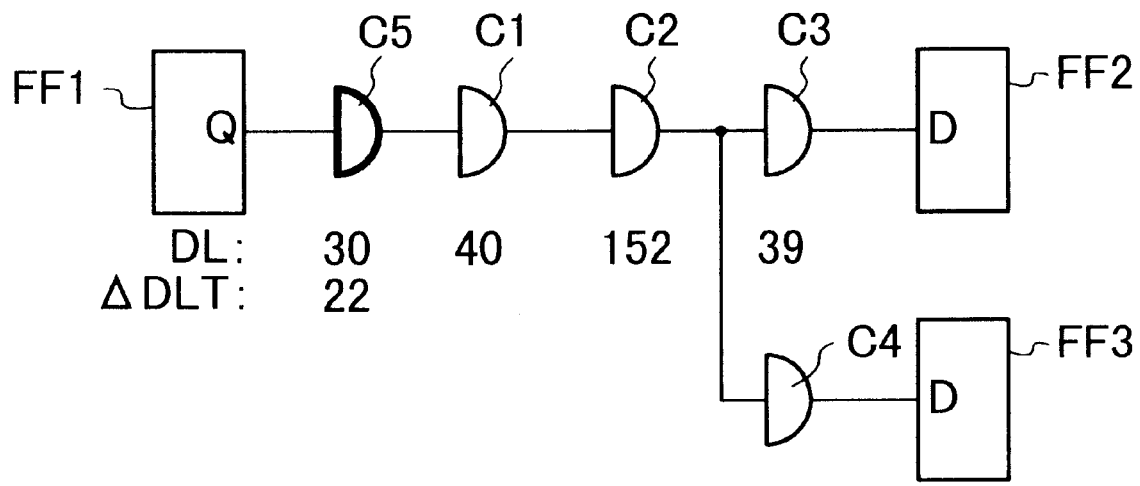

For example, in FIG. 12A, when the cells C1 and C2 are selected in the step S32, the cell C1 at the most upstream side is selected. When the delay time DL of the cell C1 is 48 ps, by inserting a cell C5 of a non-inverting gate into the input side of the cell C1 in the next step S34 as shown in FIG. 12B, the delay times DL of the cells C5 and C1 become 30 ps and 40 ps, respectively, and ΔDLT=22 ps.

By such cell insertion, since the delay time DL of only the common part of the hold error paths HE1 and HE2 increases, the timings of a multi hold error path will be more effectively and simultaneously adjusted.

(S37) The cell at the most downstream side in the selected cells is selected, and the process proceeds to step S34.

Figure 13A:
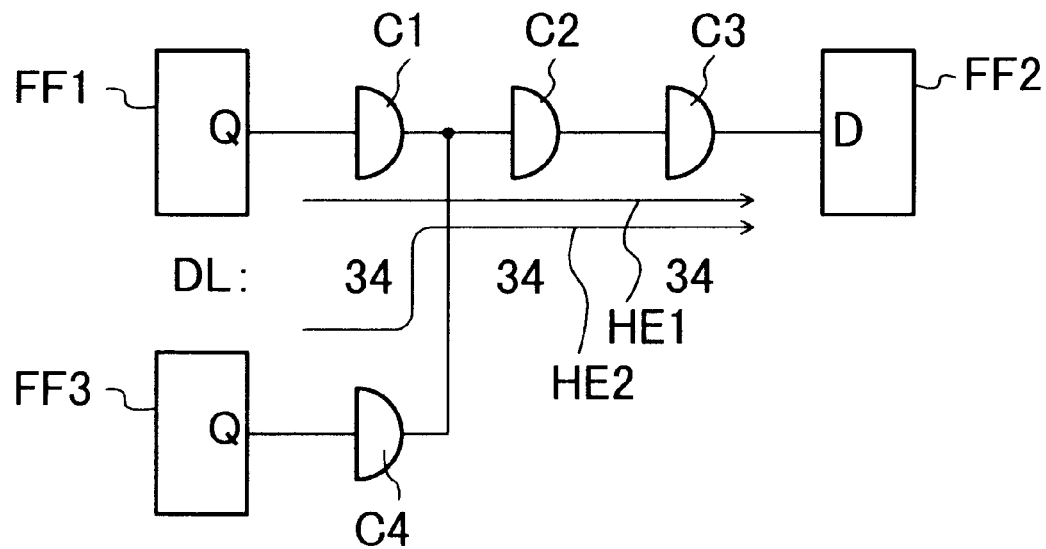
FIGS. 13A and 13B are illustrations of the steps S37 and S34 in FIG. 10.
Figure 13B:
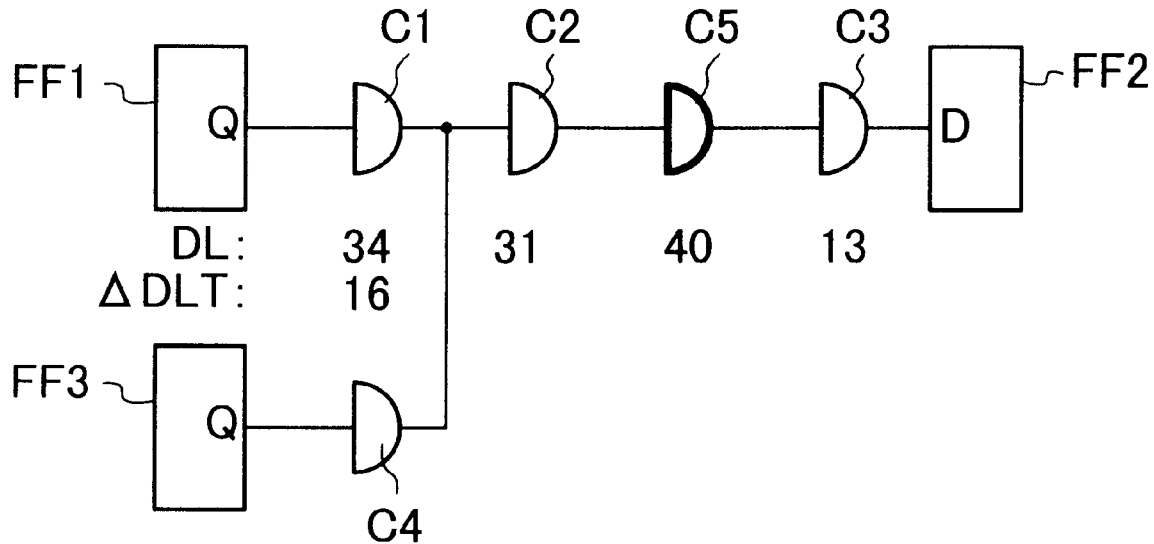

For example, in FIG. 13A, when the cells C2 and C3 are selected in step S32, the cell C3 at the most downstream side is selected. If the delay times DL of the cells C2 and C3 are both 34 ps, a cell C5 of a non-inverting gate is inserted into the input side wiring of the cell C3 in the next step S34, whereby, as shown in FIG. 13B, the delay times DL of the cells C2, C5, and C3 become 31 ps, 40 ps, and 13 ps, respectively, and ΔDLT=16 ps.

By such cell insertion, since the delay time DL of only the common part of the hold error paths HE1 and HE2 increases, the timings of multi hold error path will be more effectively and simultaneously adjusted.

(S38) The number NS of set-up error paths is counted for each cell in the targeted hold error path.

Figure 14A:
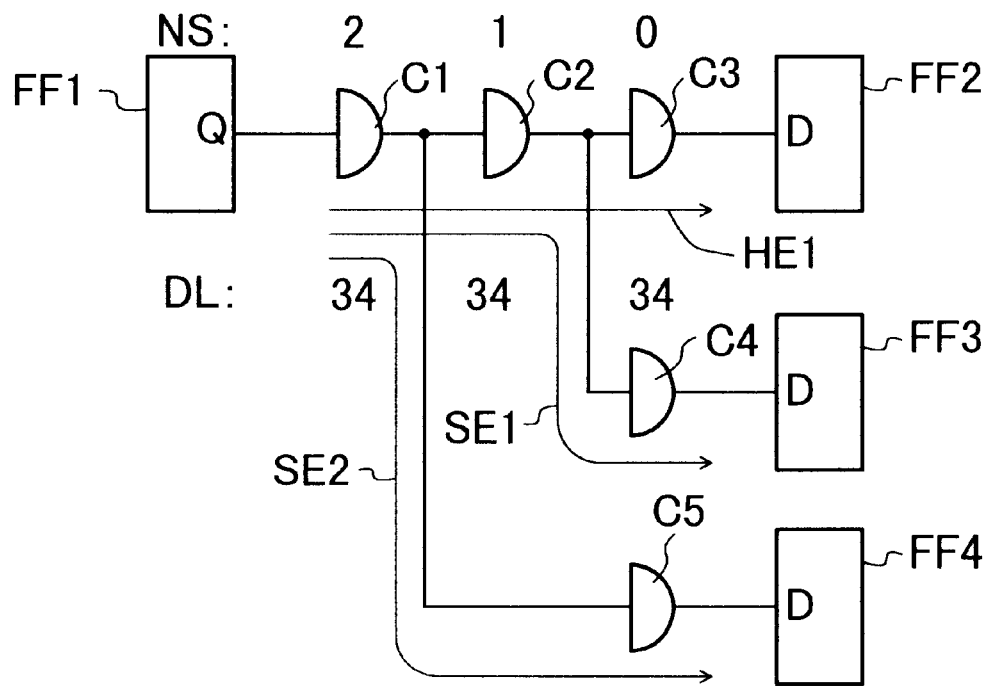
FIG. 14A is an illustration of the steps S38 and S39 in FIG. 10.

For example, in FIG. 14A, in a case where a targeted hold error path HE1 is from the flip-flop FF1 to the flip-flop FF2, and is partially overlapped with a set-up error path SE1 being from the flip-flop FF1 to the flip-flop FF3 and a set-up error path SE2 from being the flip-flop FF1 to the flip-flop FF4, the number NS of set-up error paths is counted for each cell C1, C2 and C3 in the targeted hold error path HE1. In this case, the counts of cells C1, C2, and C3 are 2, 1, and 0, respectively.

(S39) The cell with the smallest number NS of set-up error paths is selected, and the process proceeds to step S33.

Figure 14B:
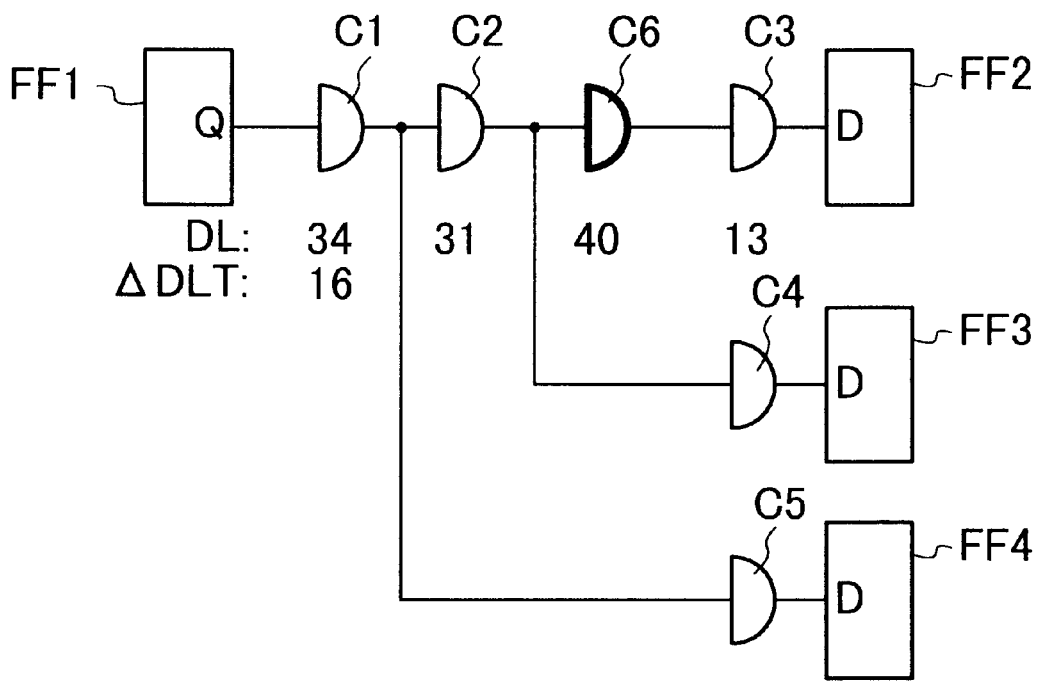
FIG. 14B is an illustration of step S34 in the case of FIG. 14A.

In the case of FIG. 14A, the cell C3 is selected. In the next step S34, a cell C6 of a non-inverting gate is inserted into the input or output side of the cell C3, for example, into the wiring at the input side, whereby, as shown in FIG. 14B, the delay times of the cells C2, C6 and C3 become 31 ps, 40 ps, and 13 ps, respectively, and ΔDLT=16 ps.

By such cell insertion, timing adjusting will be performed mainly and only in the targeted hold error path HE1, and increase in shortage time ΔTS of set-up error path to be separately adjusted will be made 0 or reduced, whereby the timing of complicated multi timing error path will be effectively adjusted.

In the step SH1 in FIG. 2, a cell of a non-inverting gate is inserted into the targeted hold error path.

In this case, when the targeted hold error path and other non-error path comprises a multi path, as in the case where the non-error path is the set-up error, by inserting a cell into a part other than the common part in the targeted hold error path, influence in the non-error path is avoided or reduced. The same result is obtained even if the branch is performed at the step S7 in FIG. 2 depending on whether or not the targeted path is a multi-path in place of a multi-error path, and in FIG. 10, the non-error path is handled in the same manner as a different type of error path. These points are like in the step SS1 in FIG. 2.

Second Embodiment

Figure 15A:
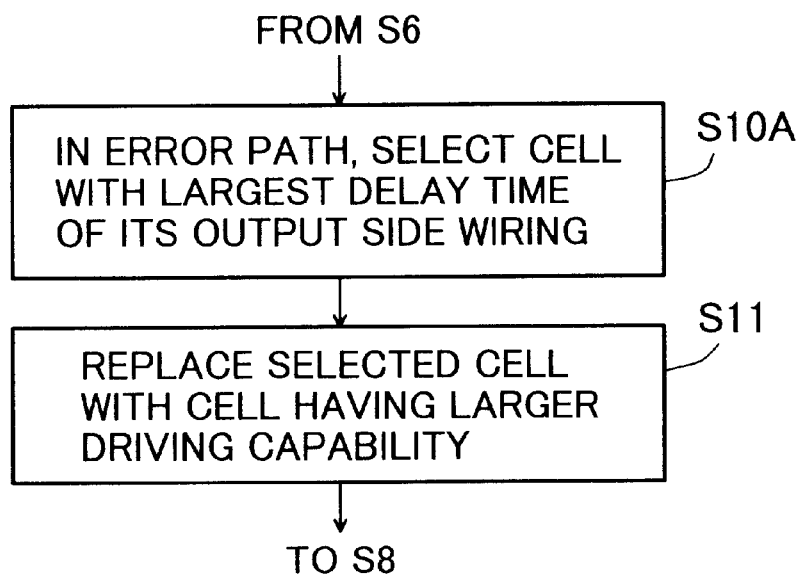
FIGS. 15A through 15C are diagrams of the second embodiment according to the present invention, corresponding to FIGS. 4A through 4C, respectively.
Figure 15B:
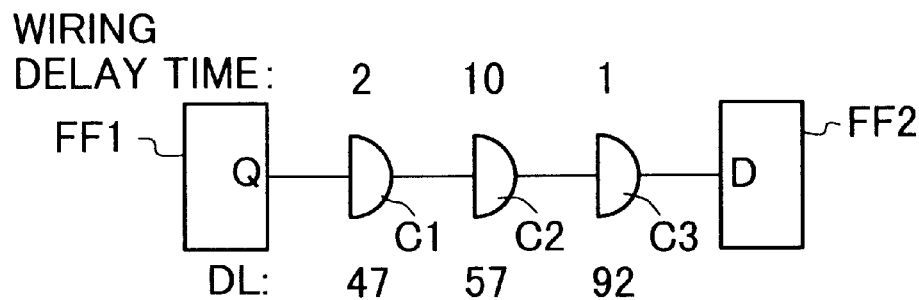
Figure 15C:
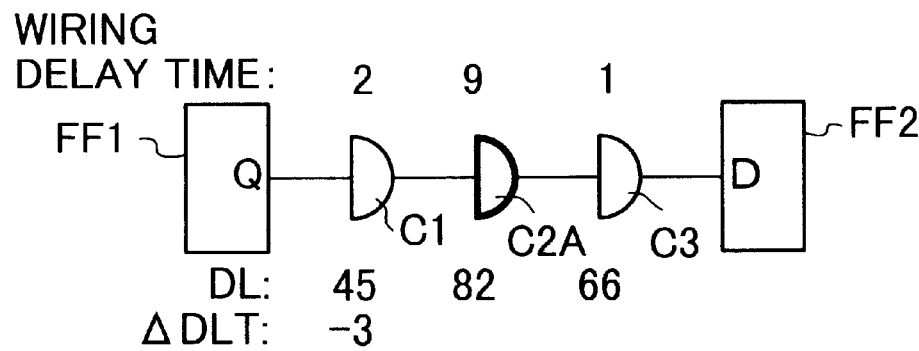

FIGS. 15A through 15C are diagrams of the second embodiment according to the present invention, corresponding to FIGS. 4A through 4C, respectively.

(S10A) The wiring delay times in the targeted set-up error path are read from the delay information file 22, and in this path, a cell with the largest propagation delay time of its output side wiring is selected.

For example, in FIG. 15B, in a case where a circuit, in which the output pin Q of the flip-flop FF1 is connected to the input pin D of the flip-flop FF2 via cells C1, C2, and C3, is a set-up error path, and the output side wiring delay times of the cells C1, C2, and C3 are 2 ps, 10 ps, and 1 ps, the cell C2 is selected.

Next, the same processing as the step S11 in FIG. 4A is executed.

FIG. 15C shows the circuit after a cell replacement. For example, driving capability (the maximum capacity to be able to drive) of the cell C2 to be replaced and the cell C2A for replacement are 400 pF and 500 pF, respectively. FIGS. 15B and 15C show the wiring propagation delay times, and the cell delay times DL of the proceeding and succeeding cells of this cell decrease by this replacement, and the path delay time DLT decreases, for instance, by 3 ps.

By such replacement, the ratio of the decreasing amount of path delay time DLT to the increasing amount of driving capability will become relatively great, which is effective.

Third Embodiment

Figure 16A:
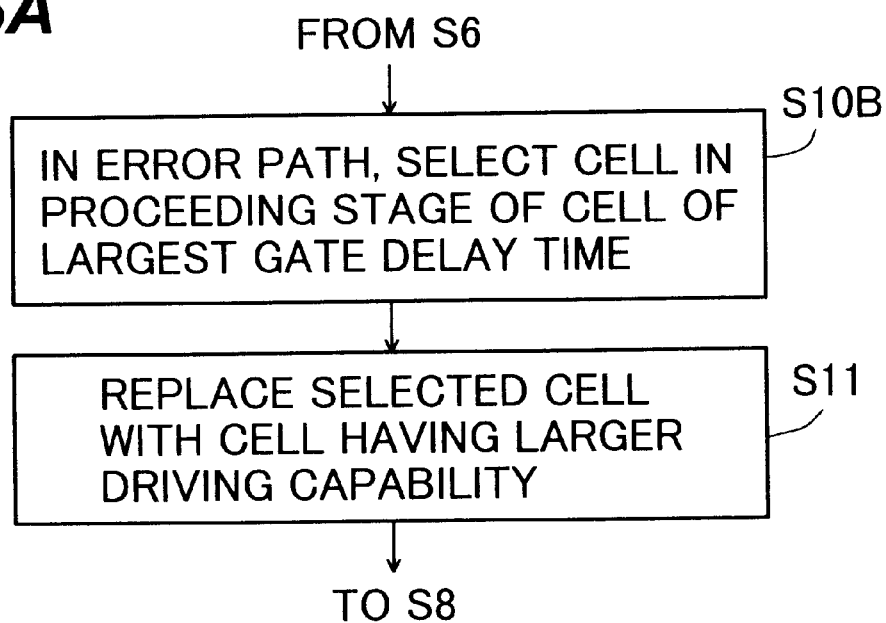
FIGS. 16A through 16C are diagrams of the third embodiment according to the present invention, corresponding to FIG. 4A through FIG. 4C, respectively.
Figure 16B:
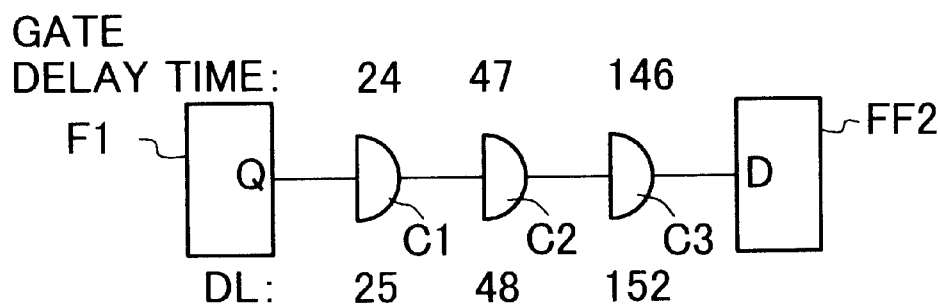
Figure 16C:
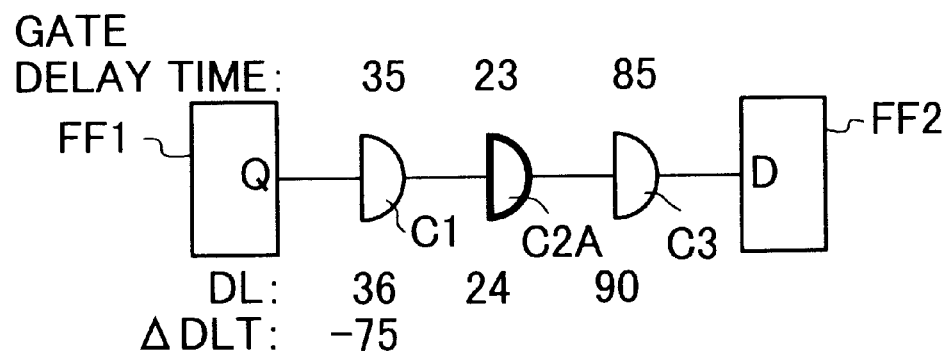

FIGS. 16A through 16C are diagrams of the third embodiment according to the present invention, corresponding to FIGS. 4A through 4C, respectively.

(S10B) Gate delay times in the targeted set-up error path are read from the delay information file 22, and the cell in the proceeding stage of the cell with the largest gate delay time in this path is selected.

For example, as shown in FIG. 16B, in a case where a circuit, in which the output pin Q of the flip-flop FF1 is connected to the input pin D of the flip-flop FF2 via cells C1, C2, and C3, is a set-up error path, and the gate delay times of the cells C1, C2, and C3 are 24 ps, 47 ps, and 146 ps, the cell C2 is selected.

Next, the same processing as the step S11 in FIG. 4A is executed.

FIG. 16C shows the circuit after cell replacement. For example, the driving capability of the cell C2 to be replaced and the cell C2A for replacement are 222 pF and 500 pF, respectively. Gate delay times are shown in FIGS. 16B and 16C, and by this replacement, the delay time DL of the cell in the succeeding stage thereof greatly decreases, and the path delay time DLT decreases by 75 ps, for example.

By such replacement, the ratio of the decreasing amount of path delay time DLT to the increasing amount of driving capability will become relatively great, which is effective.

Fourth Embodiment

Figure 17:
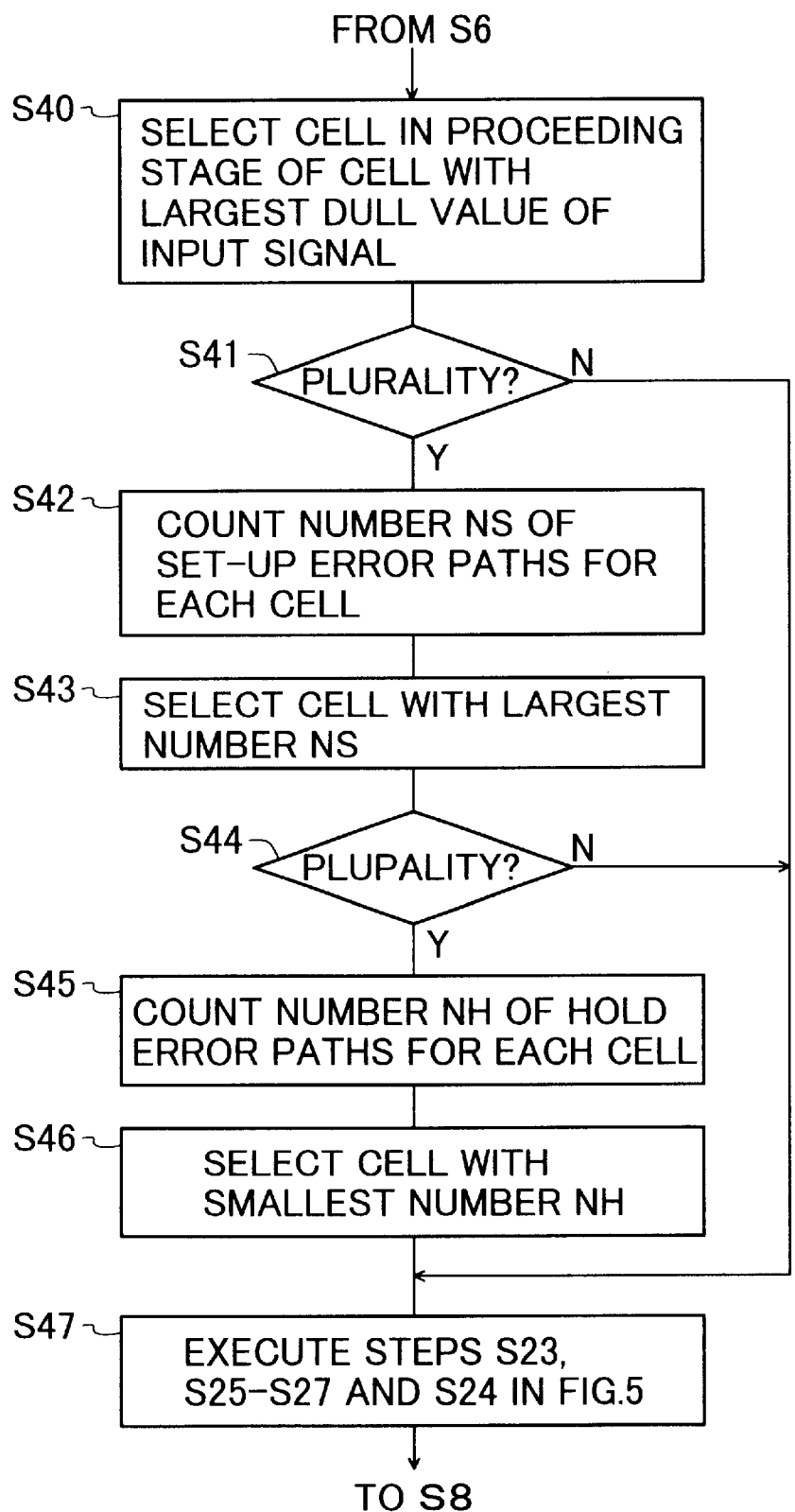
FIG. 17 is a flow chart of the fourth embodiment according to the present invention, corresponding to FIG. 5.

FIG. 17 shows a flow chart of the fourth embodiment according to the present invention, corresponding to FIG. 5.

Figure 18A:
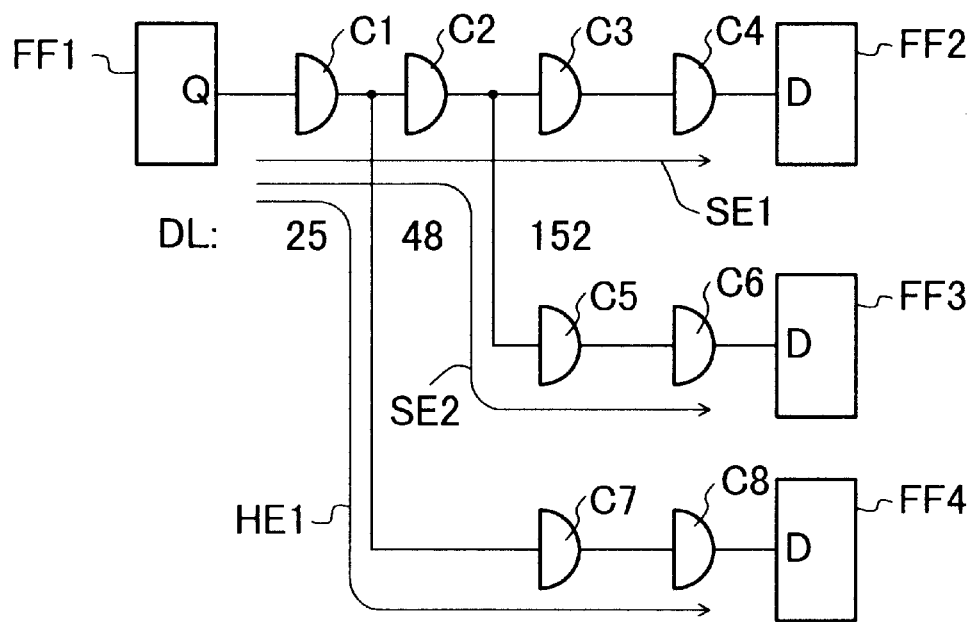
FIG. 18A is an illustration of the steps S40 through S46 in FIG. 17.
Figure 18B:
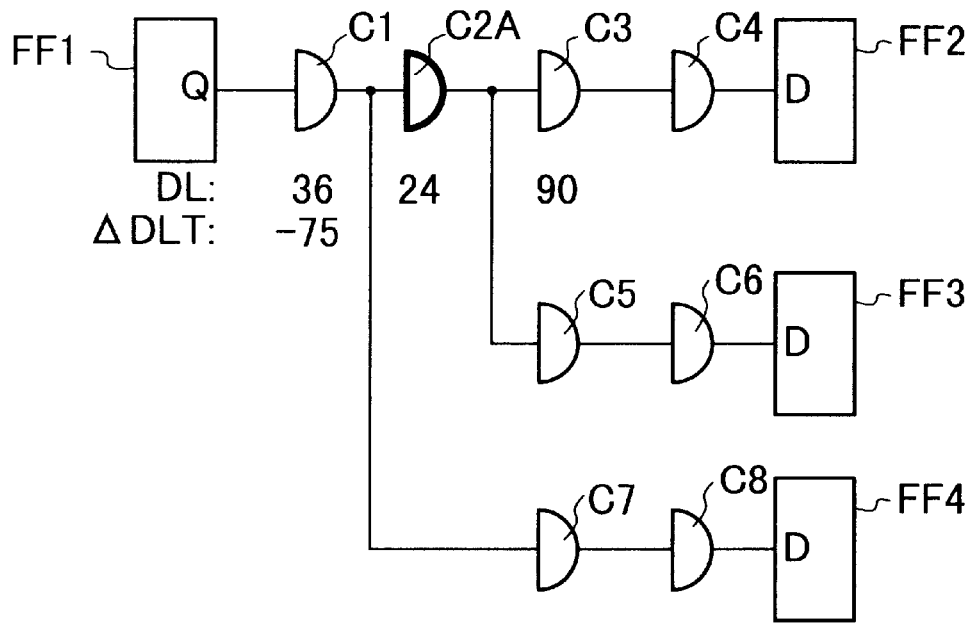
FIG. 18B is an illustration of the step S47 in FIG. 17 in the case of FIG. 18A.

FIG. 18A is an illustration of steps S40 through S46 in FIG. 17, and FIG. 18B is an illustration of a step S47 in FIG. 17 in the case of FIG. 18A. In FIGS. 18A and 18B, FF1 through FF4 each are flip-flops, and C1 through C8 and C2A each are cells.

(S40) Regarding the cells in the targeted set-up error path, the cell in the proceeding stage of the cell with the largest dull value of input signal is selected.

For example, in FIG. 18A, in a case where a targeted set-up error path SE1 is from the flip-flops FF1 to the flip-flop FF2, and the input signal dull values of the cells C2 through C4 are equal to each other and the largest cells, the cells C1 through C3 in the proceeding stages of the respective cell C2 through C4 are selected.

(S41) If a plurality of cells are selected, the process proceeds to a step S42, or else the process proceeds to a step S47.

(S42) The number NS of set-up error paths is counted for each cell in the targeted set-up error path.

(S43) Of the cells selected at the S41, the cell with the largest number NS of set-up error paths is selected.

In FIG. 18A, the set-up error path SE2 is from the flip-flop FF1 to the flip-flop FF3, and the number NS of set-up error paths is largest at the cells C1 and C2.

(S44) If a plurality of cells are selected at the step S43, the process proceeds to a step S45, or else the process proceeds to a step S47.

(S45) The number NH of hold error paths is counted for each cell in the targeted set-up error path.

(S46) Of the cells selected at the step S43, the cell with the smallest number NH of hold error paths is selected.

In FIG. 18A, the hold error path HE1 is from the flip-flop FF1 to the flip-flop FF4, and the cell C2 is selected.

(S47) The steps S23, S25 through S27 and S24 in FIG. 5 are executed.

Thus, by replacing the cell C2 with the cell C2A, the delay times DL of the cells C1, C2, and C3 in FIG. 18A, 25 ps, 48 ps, and 152 ps, changes into the delay times DL of the cells C1, C2A, and C3 as shown in FIG. 18B, 36 ps, 24 ps, and 90 ps, and ΔDLT=−75 ps. By this replacement, the path delay time of the set-up error path SE2 in addition to that of the set-up error path SE1 decreases, and further the path delay time of the hold error path HE1 increases. Therefore, by the timing adjustment of the set-up error path SE1, the timings of the set-up error path SE2 and hold error path HE1 can also be adjusted.

In other words, by giving the priority order for cell selection, cell to be replaced is limited to one, and effective timing adjusting will be performed.

At the step S4 in FIG. 2, even when ΔT<ΔTmin is judged and the set error path SE2 or the hold error path HE1 is excluded from the object to be adjusted, by timing adjusting in the set-up error path SE1, the errors of the set-up error path NS and hold error path HE1 may be corrected, therefore, the entire processing time of FIG. 2 is shortened, and also excessive adjusting is prevented.

Fifth Embodiment

Figure 10:
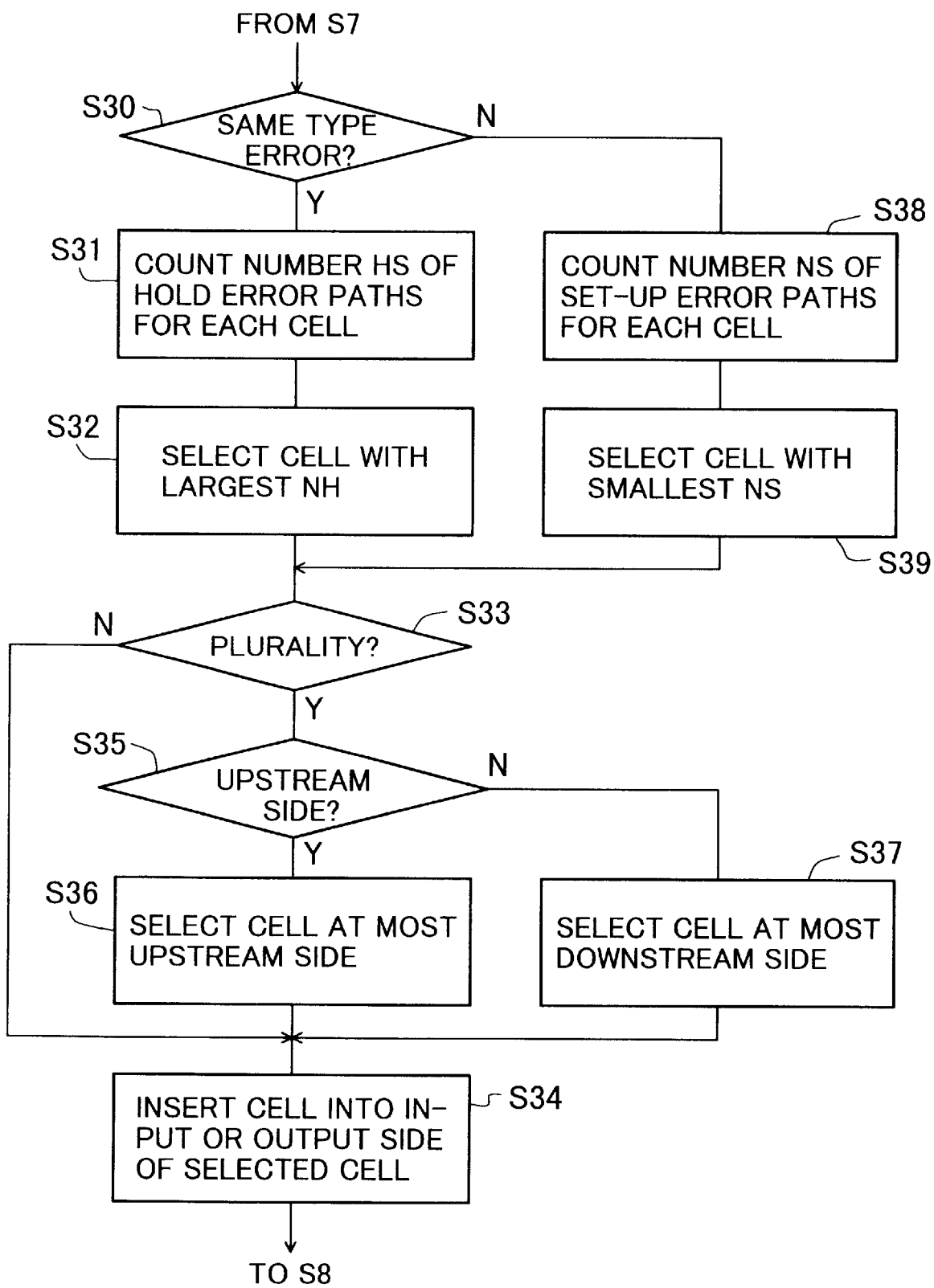
FIG. 10 is a detailed flow chart of the step SH2 in FIG. 2.
Figure 19:
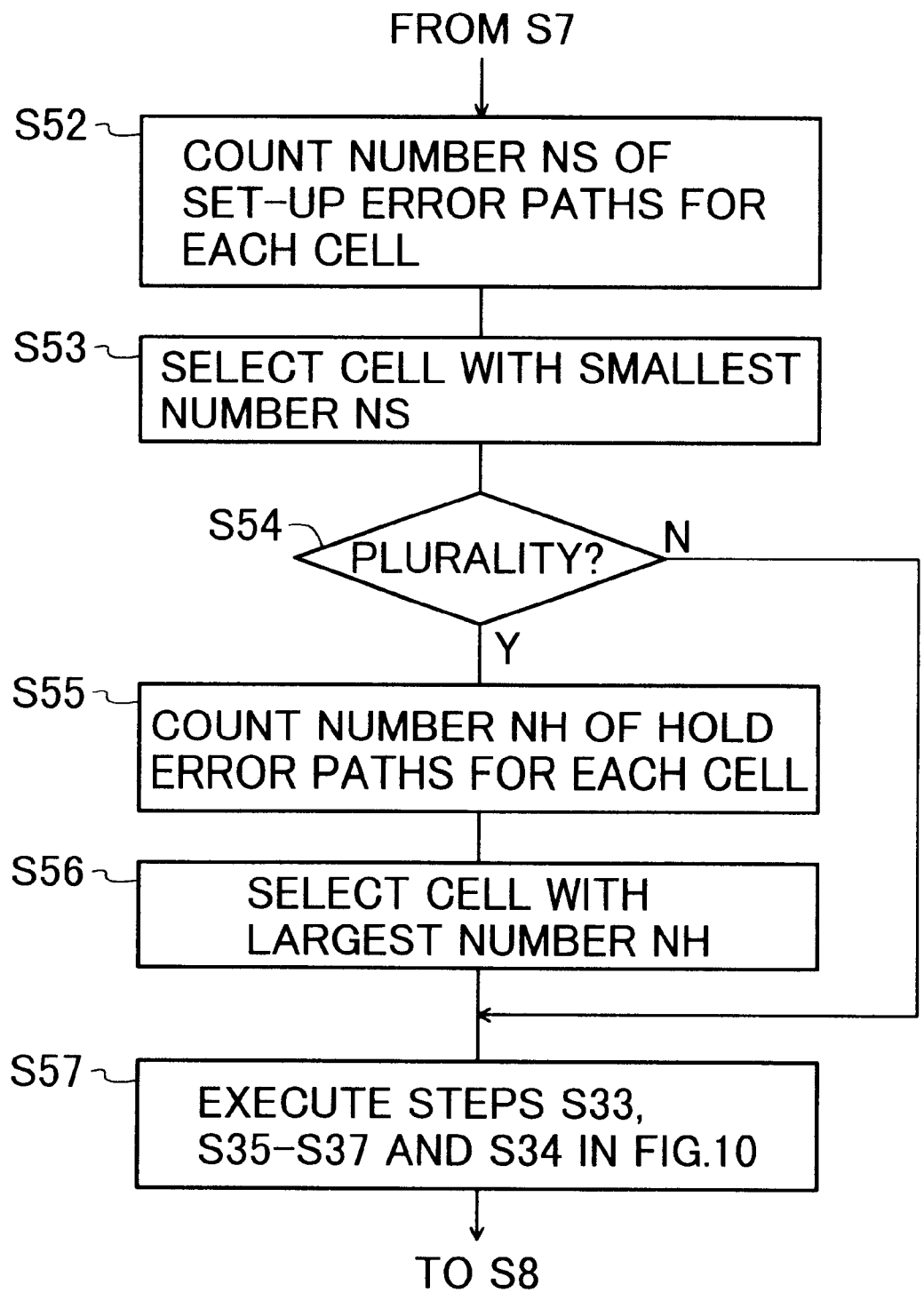
FIG. 19 is a flow chart of the fifth embodiment according to the present invention, corresponding to FIG. 10.

FIG. 19 is a flow chart of the fifth embodiment according to the present invention, corresponding to FIG. 10.

Figure 20A:
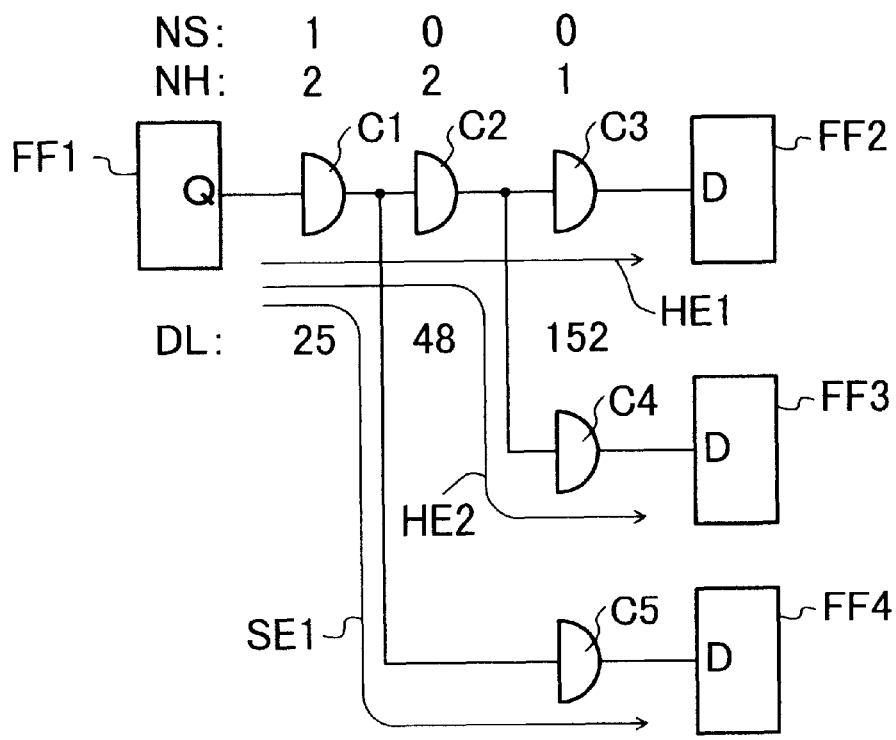
FIG. 20A is an illustration of the steps S52 through S56 in FIG. 19.
Figure 20B:
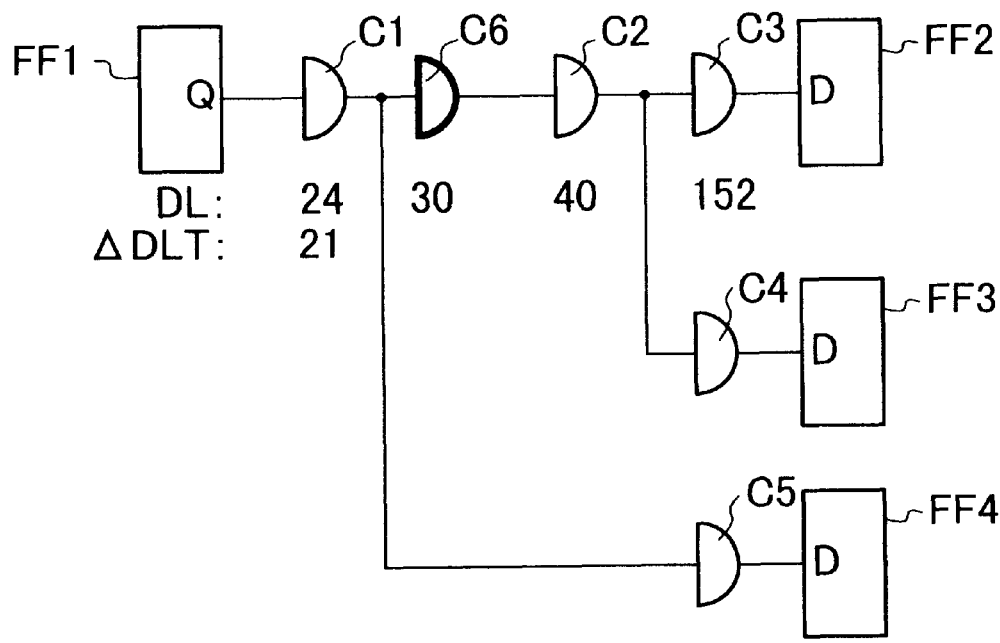
FIG. 20B is an illustration of the step S57 in FIG. 19 in the case of FIG. 20A.

FIG. 20A is an illustration of steps S52 through S56 in FIG. 19, and FIG. 20B is an illustration of a step 57 in FIG. 19 in the case of FIG. 19A. In FIGS. 20A and 20B, FF1 through FF4 each are flip-flops, and C1 through C6 each are cells.

(S52) The number NS of set-up error paths is counted for each cell in the targeted hold error path.

(S53) The cell with the smallest number NS of set-up error paths is selected.

In FIG. 20A, a set-up error path SE1 is from the flip-flop FF1 to the flip-flop FF4, and the number NS of set-up error paths is the smallest at the cells C2 and C3.

(S54) If a plurality of cells are selected at the step S53, the process proceeds to a step S55, or else the process proceeds to a step S57.

(S55) The number NH of hold error paths is counted for each cell in the targeted hold error path.

(S56) Of the cells selected at the step S53, the cell with the largest number NH of hold error paths is selected.

In FIG. 20A, the hold error path HE1 is from the flip-flop FF1 to the flip-flop FF2, the hold error path HE2 is from the flip-flop FF1 to the flip-flop FF3, and the cell C2 is selected.

(S57) The processing of the steps S33, S35 through S37 and S34 in FIG. 10 is executed.

Thus, by inserting cell C6 at the input side of the cell C2, the delay times DL of the cells C1, C2, and C3 in FIG. 20A, 25 ps, 48 ps, and 152 ps, change into the delay times DL of the cell C1, C6, and C2, 24 ps, 30 ps, and 40 ps, and ΔDLT=21 ps. By this replacement, the delay time of the hold error path HE2 in addition to that of the hold error path HE1 increases, and further the delay time of the set-up error path SE1 decreases. Therefore, by adjusting the timing of the hold error path HE1, timings of the hold error path HE2 and the set-up error path SE1 are also adjusted.

In other words, by giving the priority order for cell selection, cell insertion position is limited to one, and effective timing adjusting will be performed.

At the step S4 in FIG. 2, even when ΔT<ΔTmin is judged and the hold error path HE2 or the set-up error path SE1 is excluded from the object to be adjusted, by timing adjusting of the hold error path HE1, the errors of the set-up error path HE2 and the set-up error path SE1 may be corrected, therefore, the entire processing time of FIG. 2 is shortened, and also excessive adjusting is prevented.

Sixth Embodiment

Figure 21A:
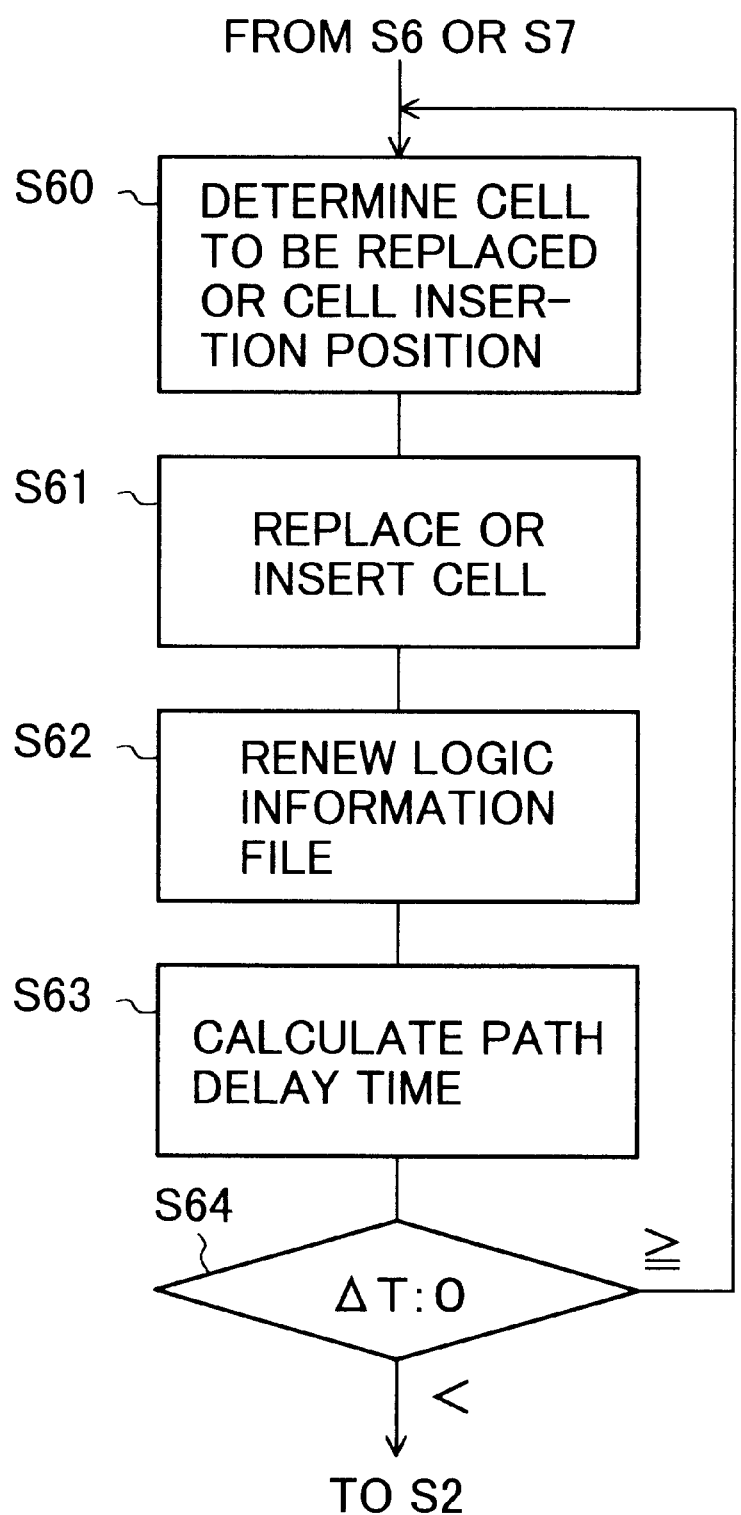
FIG. 21A is a flow chart showing a part of a timing adjusting procedure of the sixth embodiment according to the present invention.

FIG. 21A is a flow chart showing a part of the timing adjusting procedure of the sixth embodiment according to the present invention.

The process enters into a step S60 after the step S6 or S7 in FIG. 2.

(S60) The processing of steps SS1, SS2, SH1, or SH2 in FIG. 2 are executed to select a cell to be replaced or determine the cell insertion position in the targeted timing error path. For example, in FIG. 21B, a set-up error path is from the flip-flop FF1 to the flip-flop FF2, and a cell C1 of cells C1 through C3 is selected.

Figure 21B:
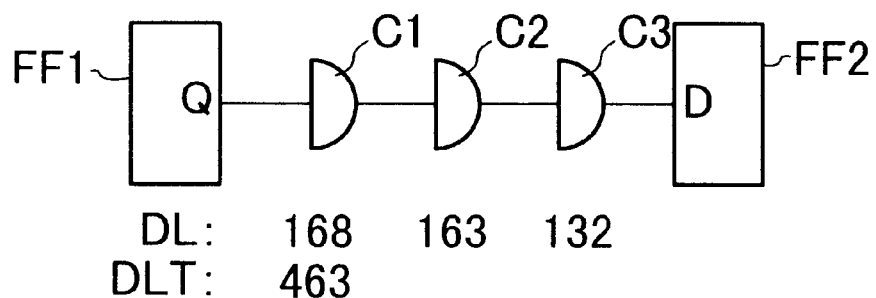
FIGS. 21B through 21D are illustrations for FIG. 21A.
Figure 21C:
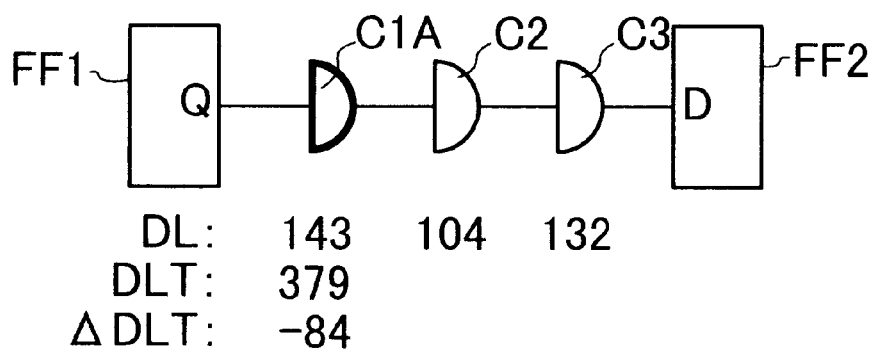

(S61) By the method described for the step SS1, SS2, SH1, or SH2, a cell is replaced or inserted. For example, the cell C1 in FIG. 21B is replaced with a cell C1A, whereby the circuit changes as shown in FIG. 21C.

(S62) The same processing as the step S8 in FIG. 2 is executed.

(S63) The propagation delay time of the targeted path is calculated.

First, regarding the replaced or inserted cell, the proceeding and succeeding cells thereof, and the wiring therebetween, the propagation delay time is calculated. For example, in the case of FIG. 21C, the gate propagation delay times of cells C1A and C2 and wiring propagation delay times on the input side and output side of the cell C1A in the targeted path are calculated. Thereby, the delay times DL of the cells C1 and C2 in FIG. 21B, 168 ps and 163 ps, change into the delay times DL of the cells C1A and C2 in FIG. 21C, 143 ps and 104 ps. Then these are added with the delay time DL of the cell C3, 132 ps, whereby the targeted path delay time DLT becomes 379 ps. In this case, ΔDLT=−84 ps.

(S64) If ΔT≧0, the process returns to the step S60, or else, namely the timing error is corrected, the process proceeds to the step S2 in FIG. 2.

Figure 21D:
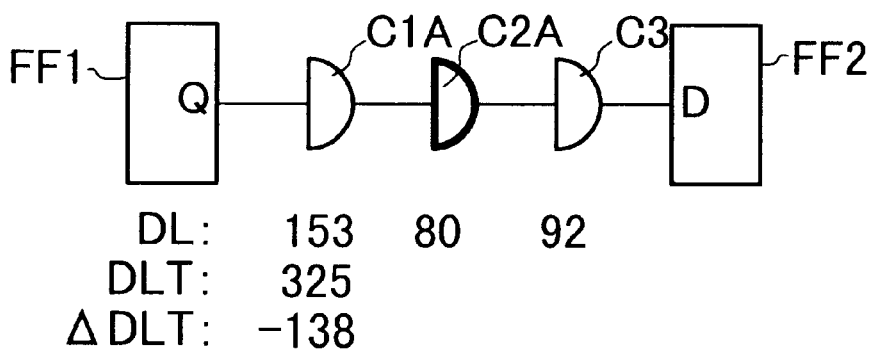

FIG. 21D shows the circuit where the cell C2 is replaced with the cell C2A for the second time.

By this method, for each time of replacement or insertion, effective cell for replacement or position for inserting cell will be selected.

Seventh Embodiment

Figure 22A:
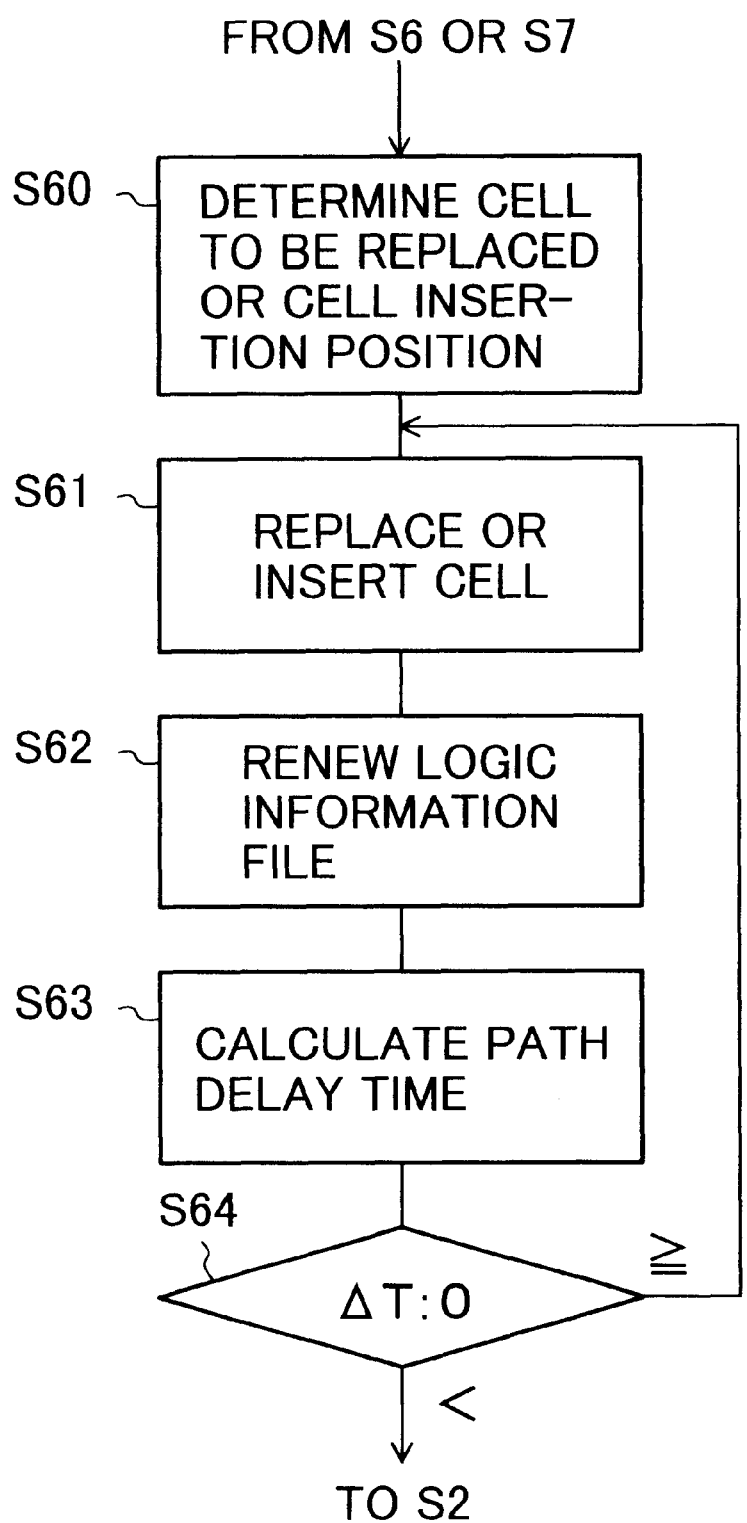
FIG. 22A is a flow chart showing a part of a timing adjusting procedure of the seventh embodiment according to the present invention.

FIG. 22A is a flow chart showing a part of the timing adjusting procedure of the seventh embodiment according to the present invention.

In this embodiment, by the return of the process from the step S64 to the step S61, with respect to the selected cell or the determined cell insertion position at the step S60, cell replacement or insertion is performed at the step S61 for each repeating loop. Other points are the same as in the sixth embodiment.

Figure 22B:
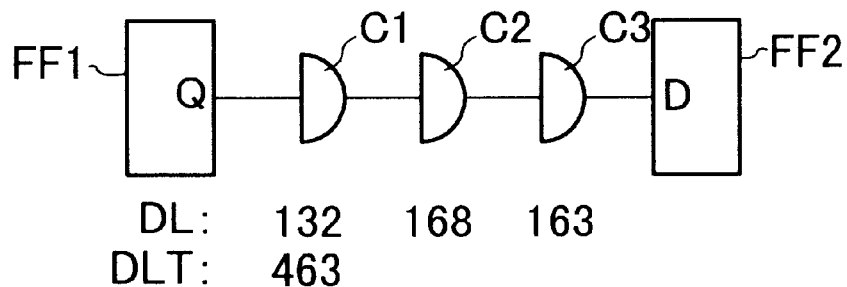
FIG. 22B through FIG. 22D are illustrations in FIG. 22A.
Figure 22C:
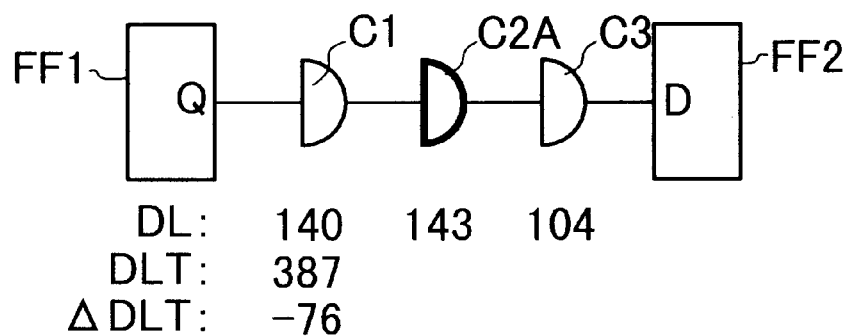
Figure 22D:
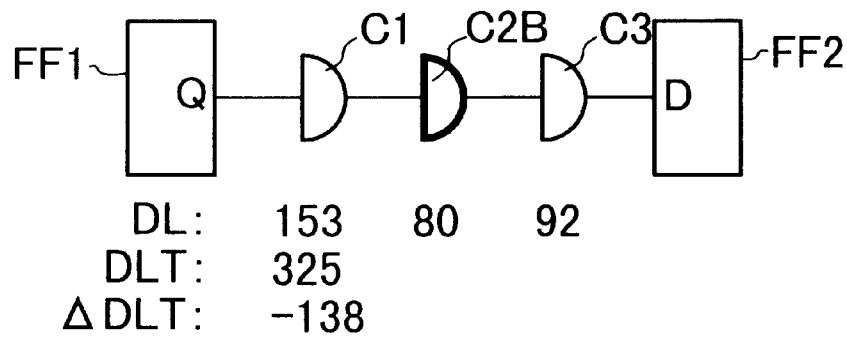

For example, in a case where the circuit of FIG. 22B is a set-up error path, and the cell C2 is selected as a cell to be replaced, for the first time, the cell C2 is replaced with the cell C2A as shown in FIG. 22C, and for the second time, the cell C2A at the same position is replaced with the cell C2B as shown in FIG. 22D.

By this method, the number of cells to be replaced becomes less than in the case of the sixth embodiment, whereby influence on the other paths can be reduced.

Eighth Embodiment

Figure 23:
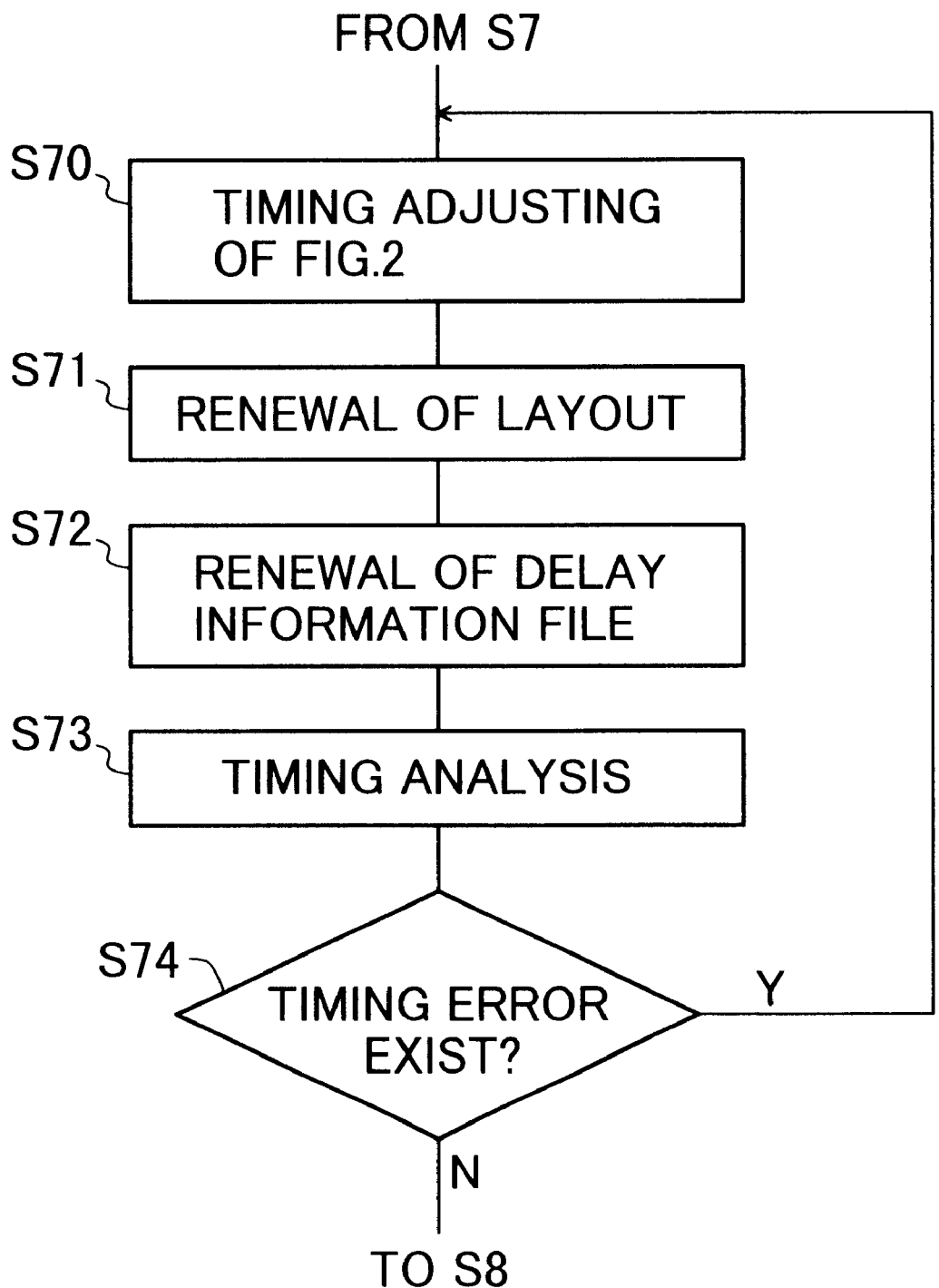
FIG. 23 is a schematic flow chart showing a timing adjusting procedure of the eighth embodiment according to the present invention.

FIG. 23 is a schematic flow chart showing the timing adjusting procedure of the eighth embodiment according to the present invention.

(S70) The timing adjusting of FIG. 2 is performed. Thereby, a renewed logic information file 23 in accordance with cell replacement or insertion is obtained.

(S71) Based on the changed content of the logic information file 23, the semiconductor integrated circuit 10 whose layout has been designed is renewed.

(S72) Based on the renewed layout and changed content of the logic information file 23, the delay information file 22 is renewed.

(S73) Based on the contents of the renewed delay information file 22 and logic information file 23, timing analysis is performed by the timing analyzer apparatus 26.

(S74) If the timing error of ΔT≧ΔTmin remains in the timing error information file 21, the process returns to the step S70, or else the process is ended.

According to the present eighth embodiment, timing adjusting is repeatedly performed with full automatic.

In the step S74, for example, when the number of timing errors is the same as the previous time, ΔTmin may be automatically decreased or made to zero.

Ninth Embodiment

FIG. 24A is a flow chart showing the selection procedure of a cell to be inserted in the ninth embodiment according to the present invention.

The process enters into a step S80 after an affirmative or negative judgement at the step S7 in FIG. 2.

(S80) By either method of FIG. 10 or 19, the cell insertion position is determined.

For example, in FIG. 24B, the path from the flip-flop FF1 to the flip-flop FF2 is a hold error path, and the wiring between the cells C1 and C2 is determined as the inserting position.

(S81) A cell with the smallest driving capability is selected from the group of insertion cells (non-inverting gates) within the logic information file 23.

Figure 24D:
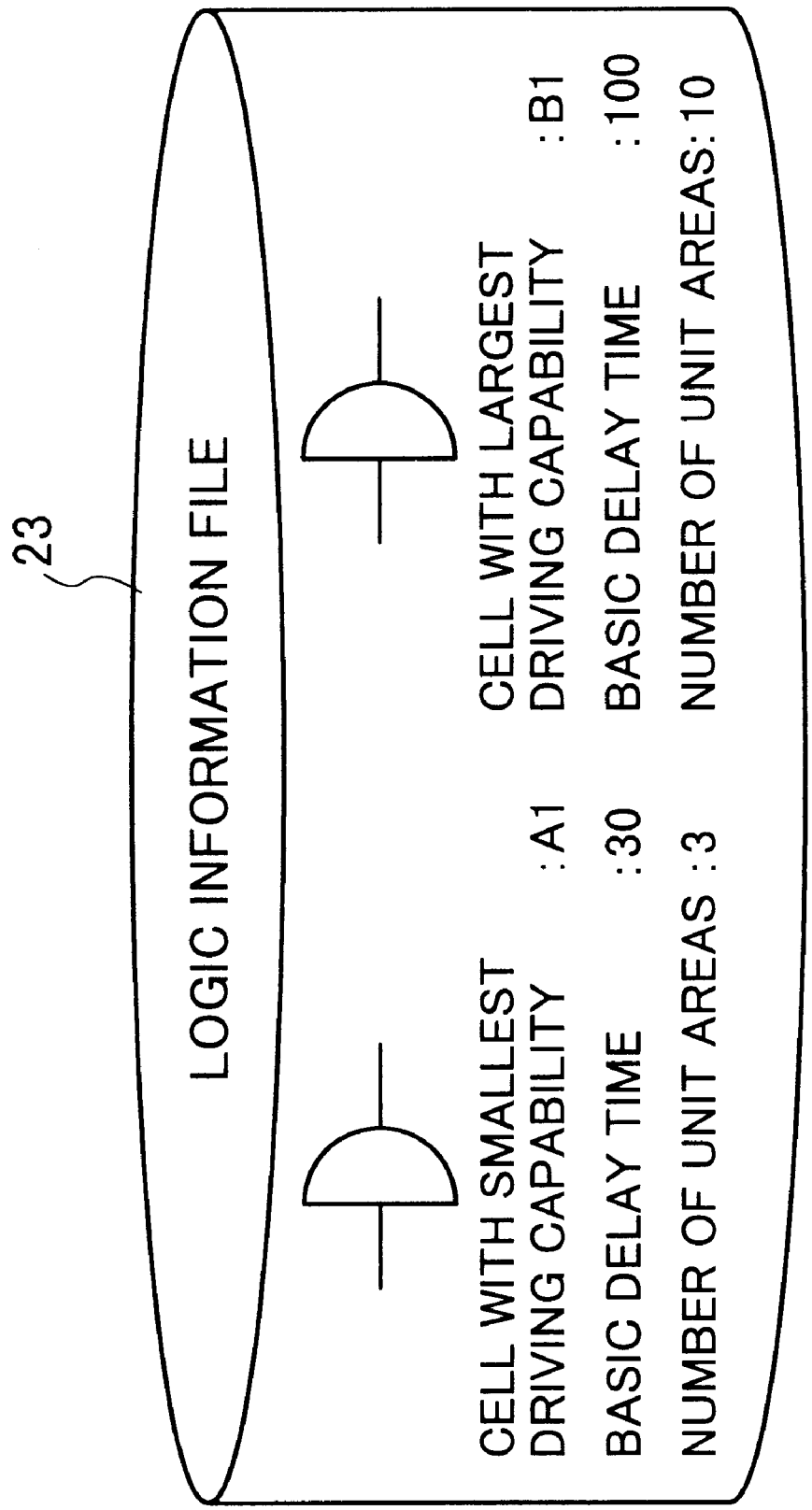

For example, a cell A1 in FIG. 24D is selected.

(S82) The combination of cells, the sum of basic delay times of which becomes equal to or more than the shortage time ΔTH, is inserted into the position determined at step S80.

For example, in a case of ΔTH=80 ps, three cascaded cells A1, each of which has the basic delay time of 30 ps, and number of unit areas, 3, are inserted, and the circuit becomes as shown in FIG. 24C. The cell with the largest driving capability is a cell B1 in FIG. 24D, which has the basic delay time of 100 ps, and the number of unit areas is 10. Therefore, when there is a great limitation for area on chip, it is more effective to employ the combined cells than one cell with the largest driving capability. This is general.

Tenth Embodiment

Figure 25B:
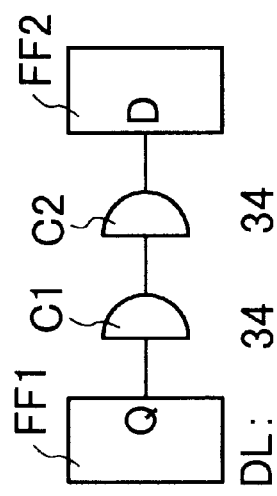
FIGS. 25B through 25D are illustrations for FIG. 25A.
Figure 25C:
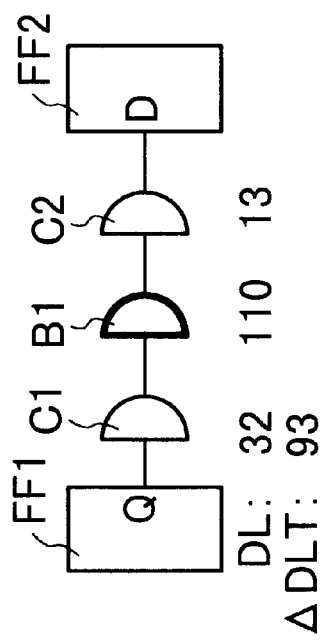
Figure 25A:
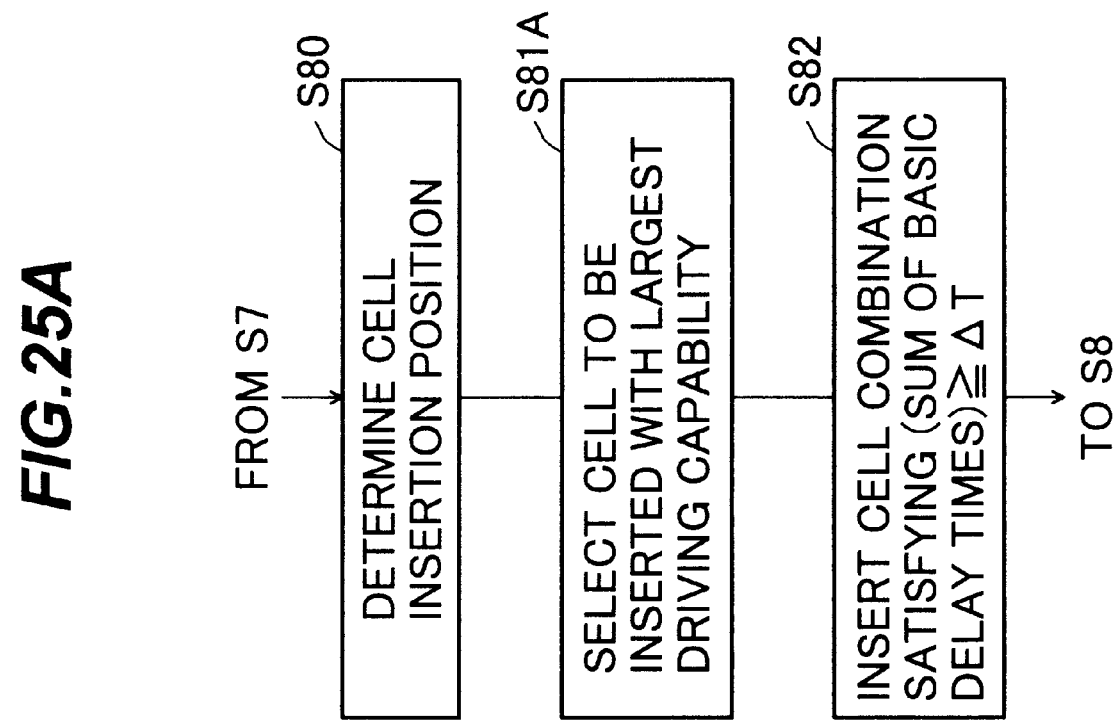
FIG. 25A is a flow chart showing a selection procedure of a cell to be inserted in the tenth embodiment according to the present invention.

FIG. 25A is a flow chart showing the selection procedure of a cell to be inserted in the tenth embodiment according to the present invention.

Figure 25D:
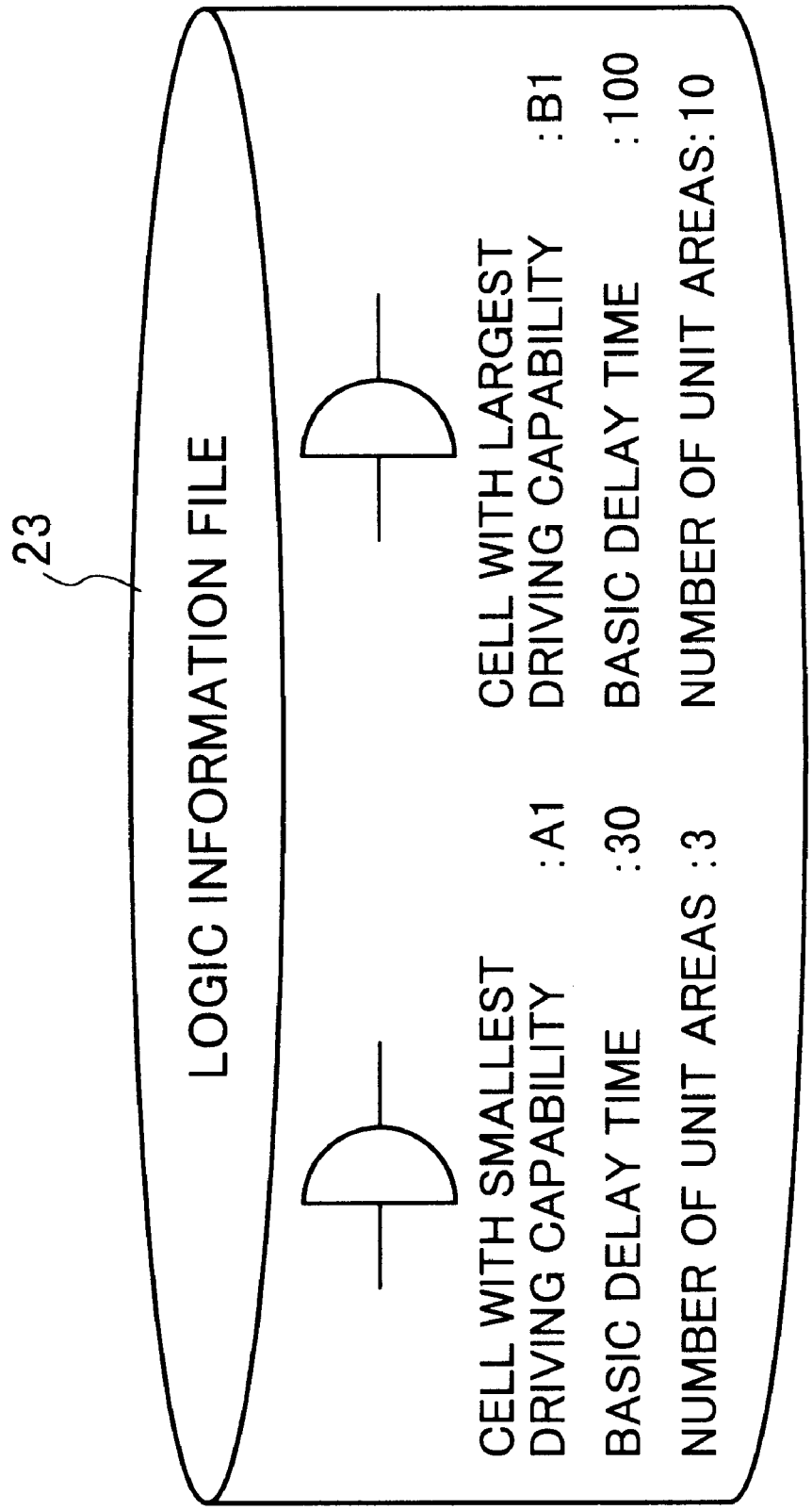

In the above-described ninth embodiment, although the cell with the smallest driving capability is selected in the step S81, in the tenth embodiment, at a step S81A, the cell B1 with the largest driving capability in the logic information file 23 in FIG. 25D is selected, which is inserted into the hold error path in FIG. 25B as shown in FIG. 25C. Other points are the same as the above ninth embodiment.

Generally, by employing a cell with the largest driving capability in the case of a hold error, timing adjusting can be performed with insertion of a smaller number of cells.

Eleventh Embodiment

FIG. 26A is a flow chart showing the selection procedure of a cell to be inserted.

Figure 26D:
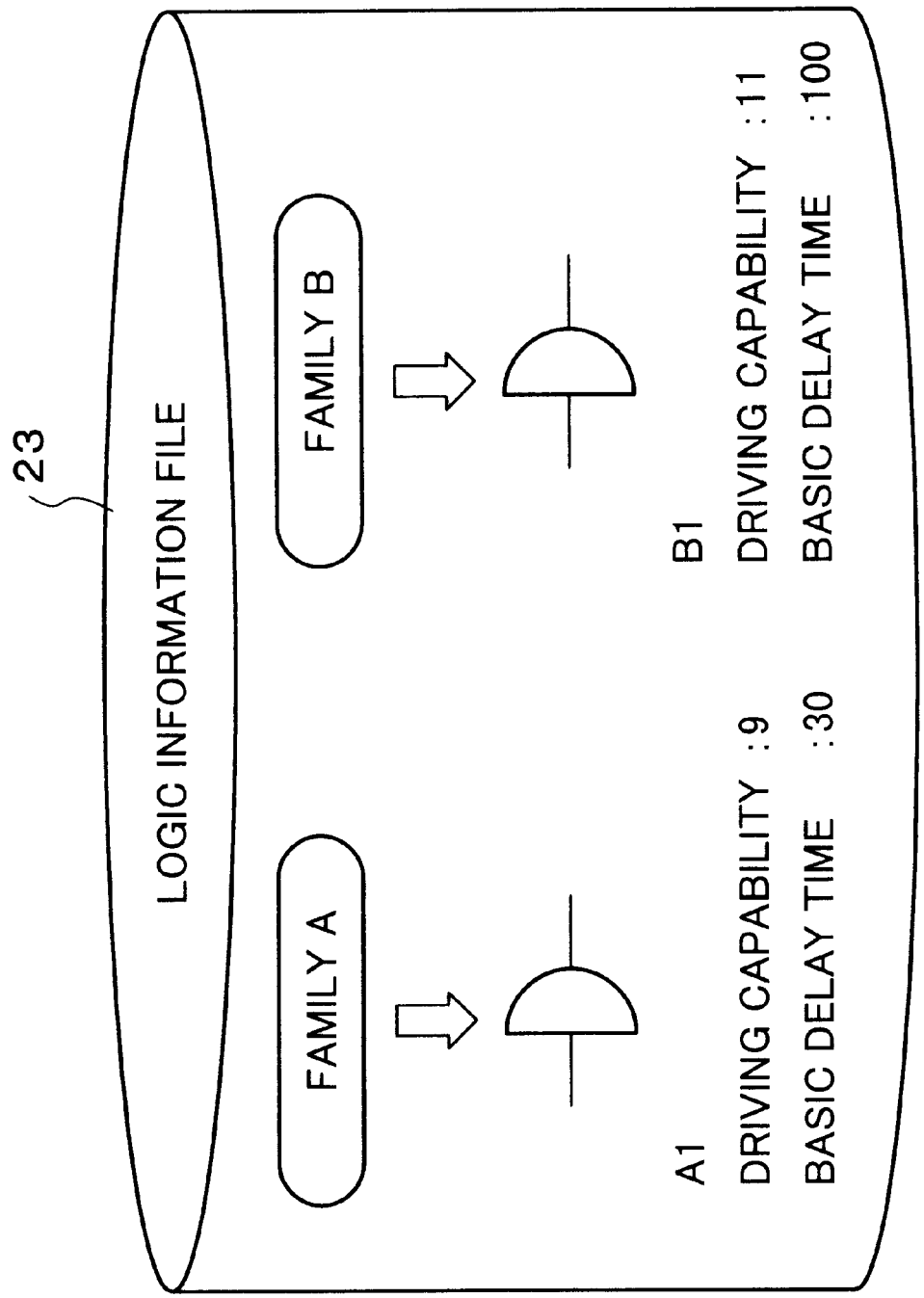

In the logic information file 23, as shown in FIG. 26D, based on the value of basic delay time, the cells to be inserted are classified into a family A and a family B.

Step S80 is the same as in the c as e of FIG. 24A, and for example, the wiring between the cells C2 and C3 in FIG. 26B is determined as the cell insertion position (bold line part, and so forth).

(S81B) In order to avoid great change in the load capacity at the position to be inserted with the cell due to cell insertion, from each insertion cell family in the logic information file 23, a cell having a driving capability close to that of the cell in the proceeding stage of the insertion position is selected. For example, the driving capability of the cell C2 in FIG. 26B is 10, and as shown in FIG. 26D, a cell A1 with the driving capability of value 7 is selected from the insertion cell family A, while a cell B1 with the driving capability of value 11 is selected from the insertion cell family B.

(S82A) In order to avoid excessive adjusting, a cell, the basic delay time of which is above and close to the shortage time ΔTH is selected among the selected cells. In FIG. 26B, since ΔTH=15 ps, the cell A1 with the basic delay time of value 30 ps is selected, inserted as shown in FIG. 26C, and ΔDLT=16 ps>ΔTH, whereby the hold error is corrected.

Twelfth Embodiment

FIG. 27A is a flow chart showing the selection procedure of a cell to be inserted in the twelfth embodiment according to the present invention.

In this embodiment, in place of the step S81B in FIG. 26A, the processing of the following steps S83 and S84 are executed.

(S83) The image of FIG. 27B and its corresponding content of the logic information file 23 are displayed on the display 25 in FIG. 1. An operator narrows the cells in the insertion cell families in the logic information file 23 in order to prevent excessive adjusting.

Figure 27D:
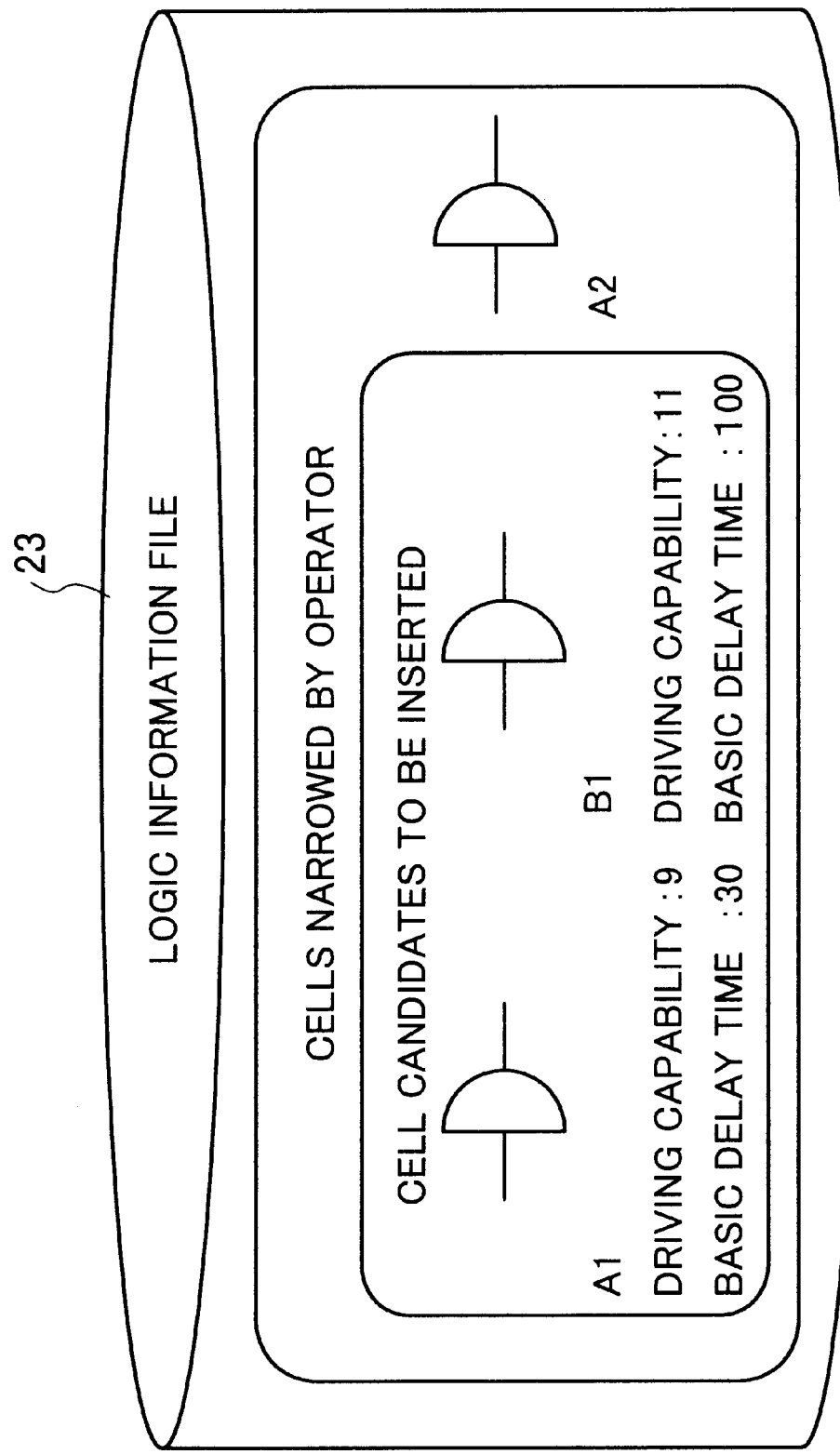

In FIG. 27D, the cells A1, B1, and A2 in the logic information file 23 are chosen as the candidates by the operator.

(S84) Among the narrowed cells, for example, according to the same rule as the step S81B in FIG. 26A, cells are automatically further narrowed to select cell candidates.

In FIG. 27D, cells A1 and B1 whose driving capability are close to 10 are chosen as candidates.

(S82A) Cell selection among the cell candidates is the same as the step S82A in FIG. 26A, whereby the cell A1 is selected and inserted between the cells C2 and C3 in FIG. 27B, and the circuit changes as shown in FIG. 27C.

Thirteenth Embodiment

Figure 28B:
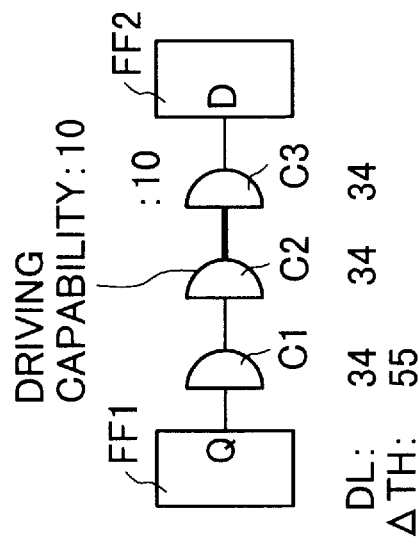
FIGS. 28B through 28D are illustrations for FIG. 28A.
Figure 28C:
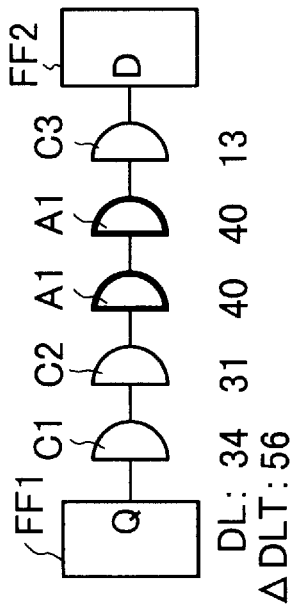
Figure 28A:
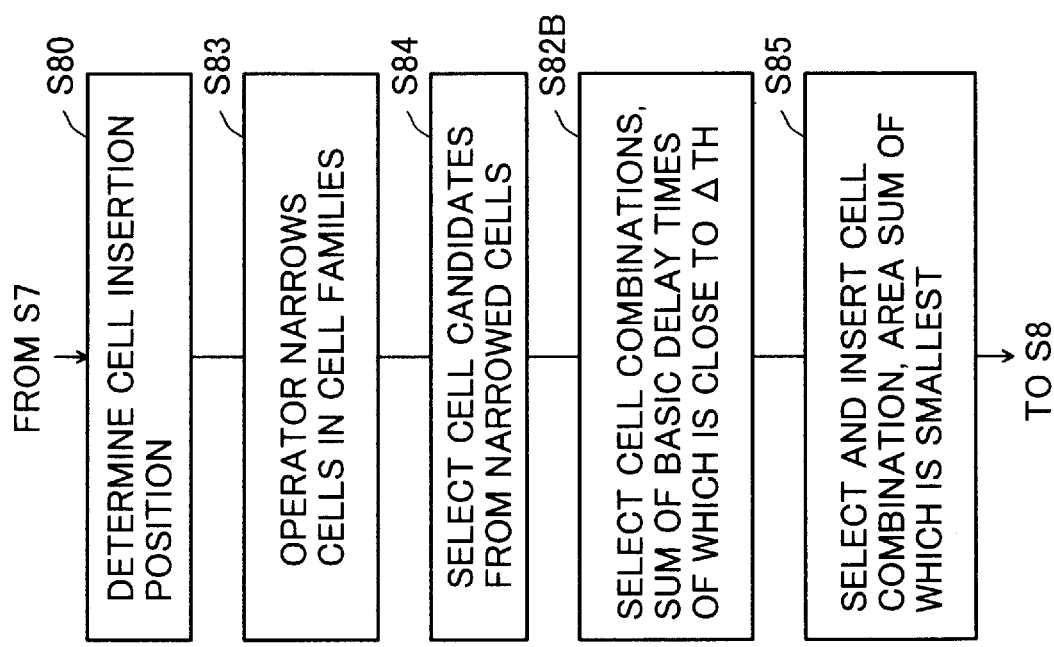
FIG. 28A is a flow chart showing a selection procedure of a cell to be inserted in the thirteenth embodiment according to the present invention.
Figure 28D:
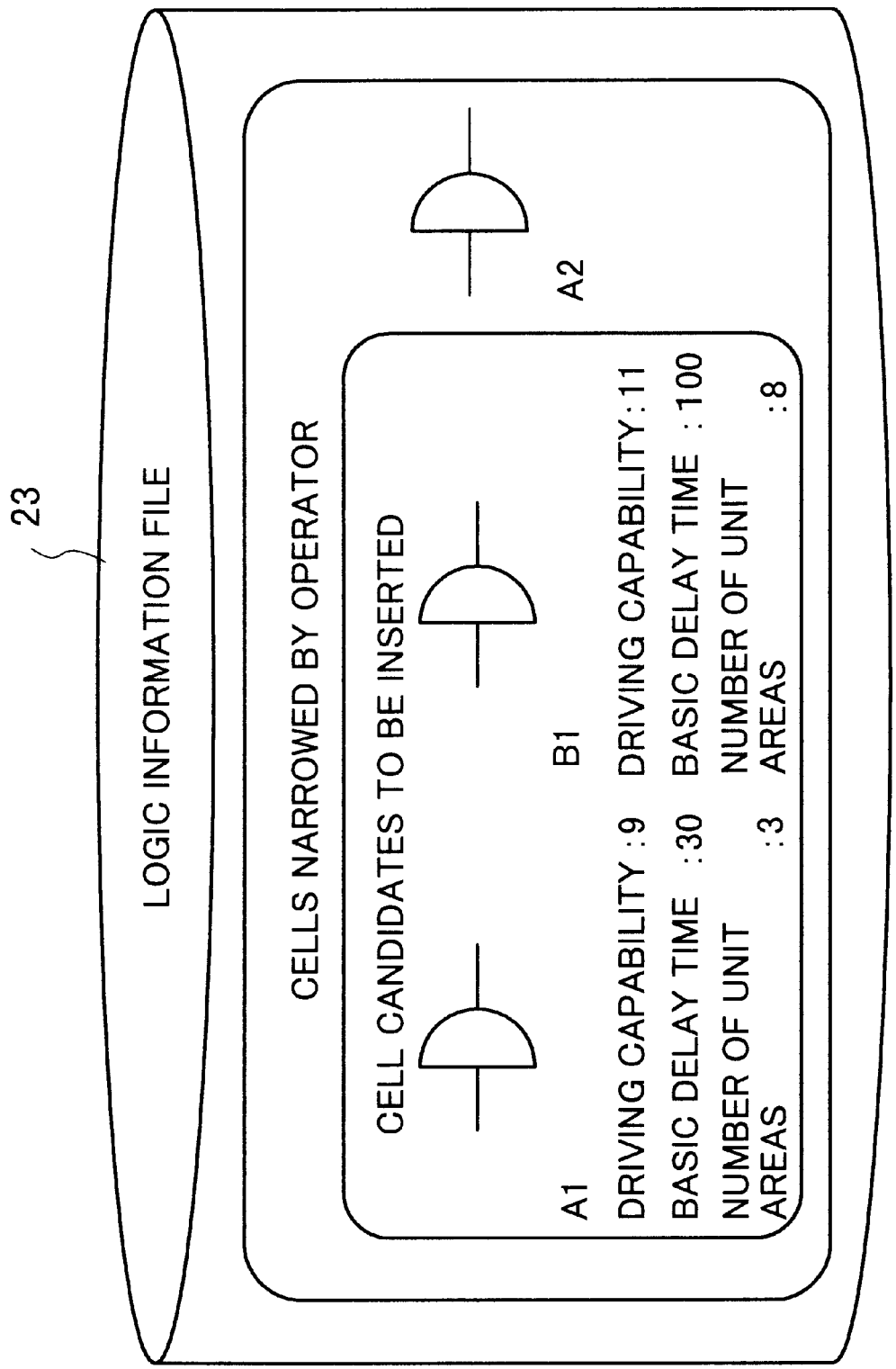

FIG. 28A is a flow chart showing the selection procedure of a cell to be inserted in the thirteenth embodiment according to the present invention.

In this embodiment, in place of the step S82A in FIG. 27A, the processing of following steps S82B and S85 are performed.

(S82B) A cell combination, the sum of basic delay times of which is equal to or above and close to the shortage time ΔTH, is selected from the cell candidates.

In FIG. 28B, since ΔTH=55, with respect to the insertion cell candidates A1 and B1 in the logic information file 23, a combination of two cells of A1 with the basic delay time of 30 ps and one cell B1 with the basic delay time of 100 ps are selected.

(S85) A combination of cells, an area sum of which is smallest, is selected and inserted into the position determined at the step S80.

Since the number of unit areas of the cell A1 is 3, and the number of unit areas of the cell B1 is 8, a combination of two cells of A1 is selected, and inserted between the cells C2 and C3 in FIG. 28B, whereby the circuit changes as shown in FIG. 28C.

By such a method, the number of unit areas to be occupied on chip will be made less than in the case of the twelfth embodiment.

Fourteenth Embodiment

Figure 29B:
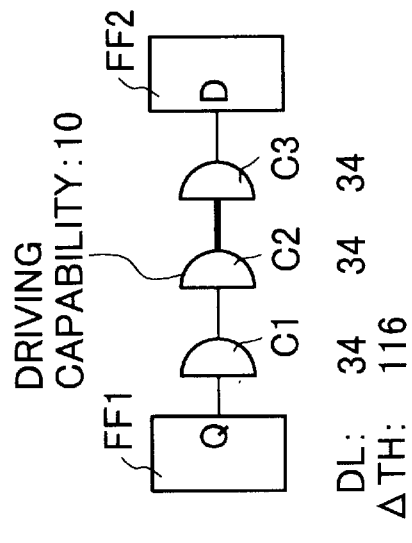
FIGS. 29B through 29D are illustrations for FIG. 29A.
Figure 29C:
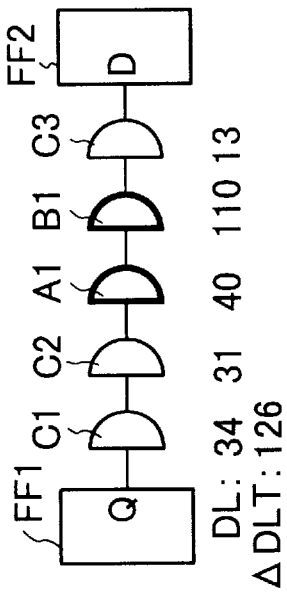
Figure 29A:
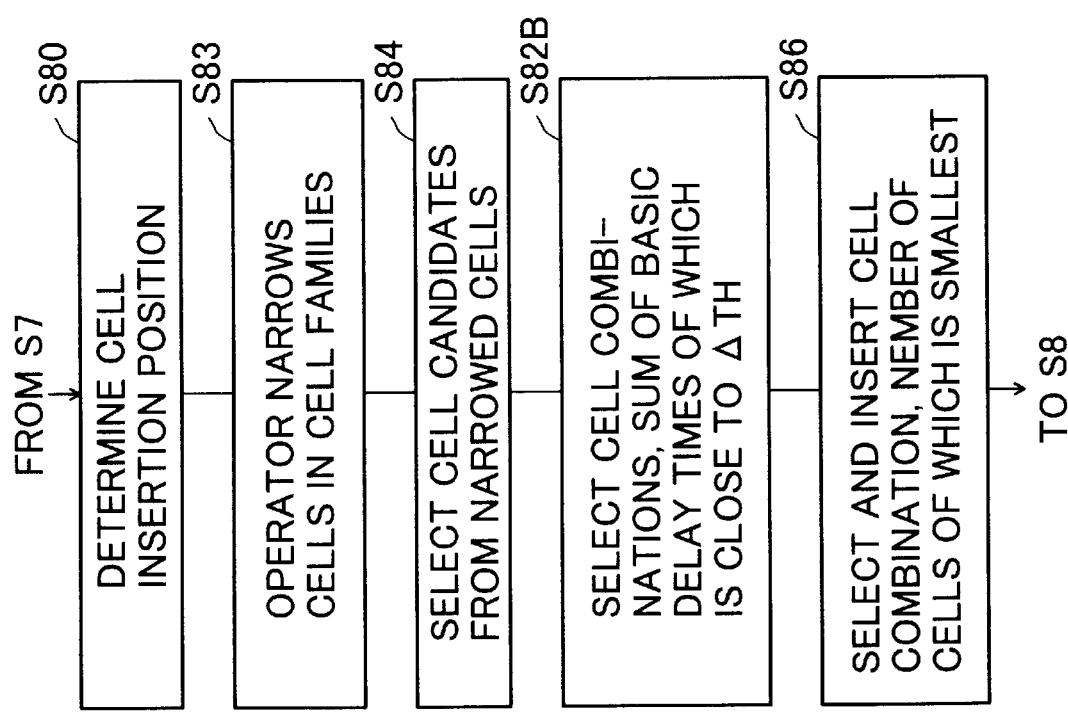
FIG. 29A is a flow chart showing a selection procedure of a cell to be inserted in the fourteenth embodiment according to the present invention.

FIG. 29A is a flow chart showing the selection procedure of a cell to be inserted in the fourteenth embodiment according to the present invention.

In this embodiment, in place of the step S85 in FIG. 28A, the processing of following step S86 is executed.

(S86) A cell combination, the number of cells of which is the smallest is selected and inserted in the position determined at the step S80.

Figure 29D:
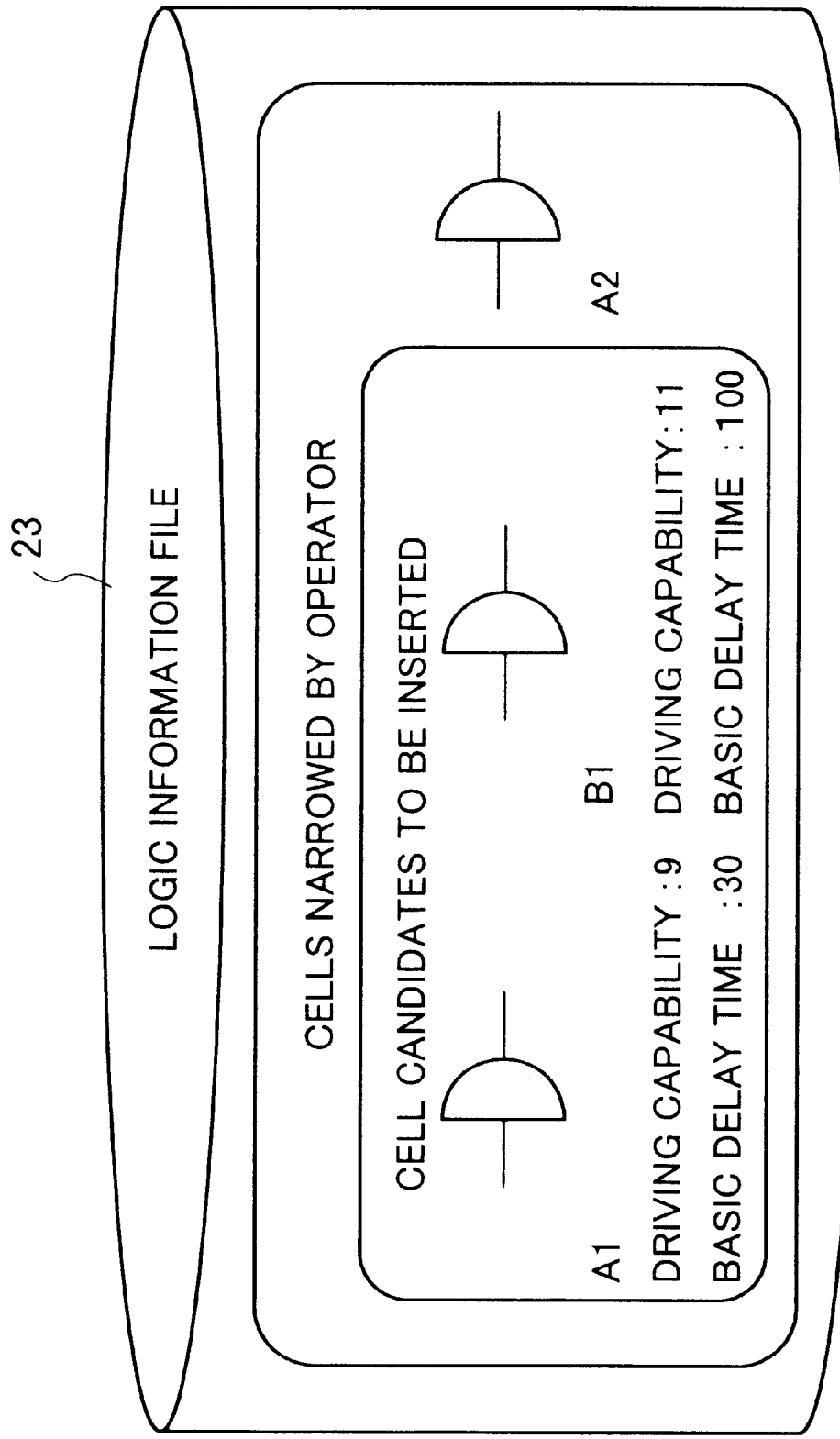

In FIG. 29B, ΔTH=116, and in the step S82B, among the cells A1 and B1 in FIG. 29D, there are a combination of four cells of A1 (basic delay time sum=120 ps) and a combination of a cell A1 and a cell B1 (basic delay time sum=130 ps), and the latter is selected and inserted between the cells C2 and C3 in FIG. 29B, whereby the circuit changes as shown in FIG. 29C.

Thereby, ΔDLT 126 ps which means that the error is corrected.

According to this fourteenth embodiment, in a case where there is enough free area, timing adjusting with the smallest influence on the number of used gates can be performed.

Although preferred embodiments of the present invention has been described, it is to be understood that the invention is not limited thereto and that various changes and modifications may be made without departing from the spirit and scope of the invention.

What is claimed is:

1. A computer-aided timing adjusting method for adjusting a timing in a semiconductor integrated circuit whose layout and wiring have been designed, said semiconductor integrated circuit including sequential circuits, each of said sequential circuits having first and second flip-flops and a combinational circuit connected between an output of said first flip-flop and the input of said second flip-flop, said first and second flip-flops operating in synchronization with a clock, said method comprising:
    preparing a timing error information including the types of timing errors and timing error paths, a delay information relating to signal propagation delay, and a logic information including function and driving capability of each cell in said combinational circuits;
    when said timing error information in which sequential circuit is a set-up error path, then selecting a cell which is estimated with referring to said delay information to be the greatest cause for the set-up error arising;
    searching a cell whose function is the same as the selected cell and driving capability is larger than said selected cell; and
    replacing said selected cell with the searched cell.

2. A computer-aided timing adjusting method according to claim 1,
    wherein, in said preparing step, said delay information has input signal dull values of the cells,
    wherein, in said selecting step, a cell in the proceeding stage of a cell with the largest input signal dull value is selected.

3. A computer-aided timing adjusting method according to claim 1,
    wherein, in said preparing step, said delay information has output-wiring propagation delay times,
    wherein, in said selecting step, a cell whose output-wiring propagation delay time is the maximum is selected.

4. A computer-aided timing adjusting method according to claim 1,
    wherein, in said preparing step, said delay information has gate propagation delay times,
    wherein, in said selecting step, the cell in the proceeding stage of a cell whose propagation delay time is the maximum is selected.

5. A computer-aided timing adjusting method according to claim 1,
    wherein, in said logic information, cells are classified into families, each of said families having the same function and the same number of input and output, wherein, in said searching step, a cell is searched in the same family as the selected cell.

6. A computer-aided timing adjusting method according to claim 1, further comprising a step of setting a lower limit be adjusting timing errors,
   wherein, in said preparing step, said timing error information includes shortage time which is set-up shortage time or hold shortage time;
   wherein, in said replacing or inserting step, said replacing or inserting is performed only for timing error path whose shortage time is larger than said lower limit.

7. A computer-aided timing adjusting method according to claim 1, further comprising a step of calculating signal propagation delay time of adjusted set-up error path,
   wherein said selecting, searching, replacing, and calculating steps are repeatedly executed until the set-up error is corrected.

8. A computer-aided timing adjusting method according to claim 1, further comprising a step of calculating signal propagation delay time of adjusted set-up error path,
   wherein said searching, replacing, and calculating steps are repeatedly executed until the set-up error is corrected.

9. A computer-aided timing adjusting method according to claim 1, further comprising the steps of:
   detecting timing errors in said semiconductor integrated circuit after said replacing step; and
   renewing said timing error information and said delay information;
   wherein said selecting, searching, replacing, detecting and renewing steps are repeatedly executed until all the set-up errors are corrected.

10. A computer-aided timing adjusting method for adjusting a timing in a semiconductor integrated circuit whose layout and wiring have been designed, said semiconductor integrated circuit including sequential circuits, each of said sequential circuits having first and second flip-flops and a combinational circuit connected between an output of said first flip-flop and the input of said second flip-flop, said first and second flip-flops operating in synchronization with a clock, said sequential circuits having first and second sequential circuits whose combinational circuits have a common part, said method comprising:
   preparing a timing error information including the types of timing errors and timing error paths, and a logic information including function and driving capability of each cell in said combinational circuits;
   when said timing error information in which first and second sequential circuits each are timing error paths, then judging whether or not the types of the timing errors of said timing error paths are the same; and
   if the types are the same, then, in order to lower the degree of the both timing errors, replacing a cell in said common part with a cell, in said logic information, with the same function and a different driving capability, or inserting a cell in said logic information into said common part without changing the function of said common part.

11. A computer-aided timing adjusting method according to claim 10, wherein, if the type of said timing errors is a set-up error, then said replacing or inserting step comprises the steps of:
   selecting a cell in said common part;
   searching, in said logic information, a cell having the same function as and a greater driving capability than the selected cell; and
   replacing said selected cell with the searched cell.

12. A computer-aided timing adjusting method according to claim 11, wherein, in said selecting step, if a plurality of said second sequential circuits exist, then a cell, in said common part, with the largest number of set-up error paths is selected.

13. A computer-aided timing adjusting method according to claim 11, wherein, when a plurality of cells are selected in said selecting step, if said common part is on the downstream side of the circuit between said first and second flip-flops, then the cell on the most downstream side is selected, and if said common part is on the upstream side, then the cell on the most upstream side is selected.

14. A computer-aided timing adjusting method according to claim 10, wherein said replacing or inserting step, if the type of said timing errors is a hold error, then comprises the steps of:
   selecting a cell in said common part; and
   inserting a cell, in said logic information, before or after the selected cell so as not to change the function as before insertion.

15. A computer-aided timing adjusting method according to claim 14, wherein, in said selecting step, if a plurality of said second sequential circuits exist, then a cell, in said common part, with the largest number of hold error paths is selected.

16. A computer-aided timing adjusting method according to claim 10,
   wherein, in said preparing step, said timing error information includes hold shortage time at each hold error path, said delay information includes signal propagation delay time of each cell and wiring between adjacent cells in said combinational circuits, and said logic information includes basic delay time of each cell, said basic delay time being propagation delay time of cell itself under a predetermined condition,
   wherein, in said inserting step, cells, the sum of said basic delay times of which is equal to or larger than said hold shortage time, are selected and inserted.

17. A computer-aided timing adjusting method according to claim 16, wherein, in said inserting step, candidates of cells, in said logic information, to be inserted are narrowed manually, and a cell to be inserted is automatically selected.

18. A computer-aided timing adjusting method according to claim 10, further comprising a step of calculating signal propagation delay time of adjusted timing error path,
   wherein said replacing or inserting, and calculating steps are repeatedly executed until the timing error is corrected.

19. A computer-aided timing adjusting method according to claim 10, further comprising the steps of:
   detecting timing errors in said semiconductor integrated circuit after said replacing or inserting step; and
   renewing said timing error information;
   wherein said selecting, searching, replacing or inserting, detecting and renewing steps are repeatedly executed until all the timing errors are corrected.

20. A computer-aided timing adjusting method for adjusting a timing in a semiconductor integrated circuit whose layout and wiring have been designed, said semiconductor integrated circuit including sequential circuits, each of said sequential circuits having first and second flip-flops and a combinational circuit connected between an output of said first flip-flop and the input of said second flip-flop, said first and second flip-flops operating in synchronization with a clock, said sequential circuits having first and second sequential circuits whose combinational circuits have a common part, said method comprising:

preparing a timing error information including the types of timing errors and timing error paths, and a logic information including function and driving capability of each cell in said combinational circuits;

when said timing error information in which first and second sequential circuits each are timing error paths, then judging whether or not the types of the timing errors of said timing error paths are the same; and if the types are the same, then, in order to lower the degree of the both timing errors, replacing a cell in said combinational circuit of said first sequential circuit and not in said common part with a cell, with the same function and a different driving capability, or inserting a cell in said logic information into said common part without changing the function of said common part.

21. A computer-aided timing adjusting method according to claim 20, wherein, if said first and second sequential circuits are a set-up error path and a hold error path, respectively, then said replacing or inserting step comprises the steps of:

selecting a cell which is in said set-up error path and not in said common part;

searching a cell, in said logic information, having the same function as and a greater driving capability than the selected cell; and replacing said selected cell with said searched cell.

22. A computer-aided timing adjusting method according to claim 20, wherein, if said first sequential circuit is a set-up error path, a plurality of said second sequential circuits exist, and at least one of said second sequential circuits is a hold error path, then said replacing or inserting step comprises the steps of:

selecting a cell which is in said set-up error path and has the smallest number of hold error paths;

searching a cell, in said logic information, having the same function as and a greater driving capability than the selected cell; and replacing said selected cell with the searched cell.

23. A computer-aided timing adjusting method according to claim 20, wherein, in said replacing or inserting step, if said first and second sequential circuits are a hold error path and a set-up error path, respectively, then a cell is inserted into a part which is in said hold error path and not in said common part so as not to change the function as before insertion.

24. A computer-aided timing adjusting method according to claim 20, wherein, if said first sequential circuit is a hold error path, a plurality of said second sequential circuits exist, and at least one of said second sequential circuits is a set-up error path, then said replacing or inserting step comprises the steps of:

selecting a cell which is in said hold error path and has the smallest number of set-up error paths; and inserting a cell, in said logic information, before or after the selected cell.

25. A computer-aided timing adjusting method for adjusting a timing in a semiconductor integrated circuit whose layout and wiring have been designed, said semiconductor integrated circuit including sequential circuits, each of said sequential circuits having first and second flip-flops and a combinational circuit connected between an output of said first flip-flop and the input of said second flip-flop, said first and second flip-flops operating in synchronization with a clock, said sequential circuits having first and second sequential circuits whose combinational circuits have a common part, said method comprising:

preparing a timing error information including the types of timing errors and timing error paths, and a logic information including function and driving capability of each cell in said combinational circuits;

when said timing error information in which first and second sequential circuits each are timing error paths, then judging whether or not the types of the timing errors of said timing error paths are the same; and if the types are different, then, counting the number of set-up error paths and the number of hold error paths for each cell in said first sequential circuit;

selecting a cell based on the counted number in accordance with a rule of a priority order; and in order to lower the degree of the timing errors, replacing the selected cell with a cell, in said logic information, with the same function and a different driving capability, or inserting a cell, in said logic information, before or after the selected cell so as not to change the function as before insertion.

26. A computer-aided timing adjusting method according to claim 25, wherein, when said first sequential circuit is a set-up error path, said replacing or inserting step comprises the steps of:

searching a cell, in said logic information, having the same function as and a greater driving capability than the selected cell; and replacing said selected cell with the searched cell.

27. A computer-aided timing adjusting method according to claim 26, wherein said rule is such that the larger the number of set-up error paths, the higher said priority order, and that, if the number of the set-up error paths are equal, the smaller the number of hold error paths, the higher said priority order.

28. A computer-aided timing adjusting method according to claim 26, wherein, in said preparing step, a delay information having the input signal dull value of each cell in said combination circuits is further prepared, wherein said rule is such that a cell in the proceeding stage of a cell with the largest input signal dull value is selected, that, if a plurality of cells are selected thereby, then the larger the number of set-up error paths, the higher said priority order, and that, if the number of the set-up error paths are equal, then the smaller the number of hold error paths, the higher said priority order.

29. A computer-aided timing adjusting method according to claim 25, wherein, in said replacing or inserting step, when said st sequential circuit is a hold error path, a cell is inserted before or after the selected cell so as not to change the function as before insertion.

30. A computer-aided timing adjusting method according to claim 29, wherein said rule is such that the smaller the number of set-up error paths, the higher said priority order, and that, if the number of the set-up error paths are equal, the larger the number of hold error paths, the higher said priority order.

31. A storage medium stored with a program for executing a computer-aided timing adjusting method for adjusting a timing in a semiconductor integrated circuit whose layout and wiring have been designed, said semiconductor integrated circuit including sequential circuits, each of said sequential circuits having first and second flip-flops and a combinational circuit connected between an output of said first flip-flop and the input of said second flip-flop, said first and second flip-flops operating in synchronization with a clock, said method comprising:

preparing a timing error information including the types of timing errors and timing error paths, a delay information relating to signal propagation delay, and a logic information including function and driving capability of each cell in said combinational circuits;

when said timing error information in which sequential circuit is a set-up error path, then selecting a cell which is estimated with referring to said delay information to be the greatest cause for the set-up error arising; searching a cell whose function is the same as the selected cell and driving capability is larger than said selected cell; and replacing said selected cell with the searched cell.

32. A computer-aided timing adjusting apparatus for adjusting a timing in a semiconductor integrated circuit whose layout and wiring have been designed, said semiconductor integrated circuit including sequential circuits, each of said sequential circuits having first and second flip-flops and a combinational circuit connected between an output of said first flip-flop and the input of said second flip-flop, said first and second flip-flops operating in synchronization with a clock, said apparatus comprising:

a storage device that stores a timing error information including the types of timing errors and timing error paths, a delay information relating to signal propagation delay, and a logic information including function and driving capability of each cell in said combinational circuits; and a computer that executes operations of when said timing error information in which sequential circuit is a set-up error path, then selecting a cell which is estimated with referring to said delay information to be the greatest cause for the set-up error arising, searching a cell whose function is the same as the selected cell and driving capability is larger than said selected cell, and replacing said selected cell with the searched cell.

33. A computer-aided timing adjusting apparatus for adjusting a timing in a semiconductor integrated circuit whose layout and wiring have been designed, said semiconductor integrated circuit including sequential circuits, each of said sequential circuits having first and second flip-flops and a combinational circuit connected between an output of said first flip-flop and the input of said second flip-flop, said first and second flip-flops operating in synchronization with a clock, said sequential circuits having first and second sequential circuits whose combinational circuits have a common part, said apparatus comprising:

a storage device that stores a timing error information including the types of timing errors and timing error paths, and a logic information including function and driving capability, of each cell in said combinational circuits; and a computer that executes operations of when said timing error information in which first and second sequential circuits each are timing error paths, then judging whether or not the types of the timing errors of said timing error paths are the same, and if the types are the same, then, in order to lower the degree of the both timing errors, replacing a cell in said common part with a cell, in said logic information, with the same function and a different driving capability, or inserting a cell in said logic information into said common part without changing the function of said common part.

34. A computer-aided timing adjusting apparatus for adjusting a timing in a semiconductor integrated circuit whose layout and wiring have been designed, said semiconductor integrated circuit including sequential circuits, each of said sequential circuits having first and second flip-flops and a combinational circuit connected between an output of said first flip-flop and the input of said second flip-flop, said first and second flip-flops operating in synchronization with a clock, said sequential circuits having first and second sequential circuits whose combinational circuits have a common part, said apparatus comprising:

a storage device that stores a timing error information including the types of timing errors and timing error paths, and a logic information including function and driving capability of each cell in said combinational circuits; and a computer that executes operations of when said timing error information in which first and second sequential circuits each are timing error paths, then judging whether or not the types of the timing errors of said timing error paths are the same, and if the types are the same, then, in order to lower the degree of the both timing errors, replacing a cell in said combinational circuit of said first sequential circuit and not in said common part with a cell, with the same function and a different driving capability, or inserting a cell in said logic information into said common part without changing the function of said common part.

35. A computer-aided timing adjusting apparatus for adjusting a timing in a semiconductor integrated circuit whose layout and wiring have been designed, said semiconductor integrated circuit including sequential circuits, each of said sequential circuits having first and second flip-flops and a combinational circuit connected between an output of said first flip-flop and the input of said second flip-flop, said first and second flip-flops operating in synchronization with a clock, said sequential circuits having first and second sequential circuits whose combinational circuits have a common part, said apparatus comprising:

a storage device that stores a timing error information including the types of timing errors and timing error paths, and a logic information including function and driving capability of each cell in said combinational circuits; and a computer that executes operations of when said timing error information in which first and second sequential circuits each are timing error paths, then judging whether or not the types of the timing errors of said timing error paths are the same, and if the types are different, then, counting the number of set-up error paths and the number of hold error paths for each cell in said first sequential circuit, selecting a cell based on the counted number in accordance with a rule of a priority order, and in order to lower the degree of the timing errors, replacing the selected cell with a cell, in said logic information, with the same function and a different driving capability, or inserting a cell, in said logic information, before or after the selected cell so as not to change the function as before insertion.

* * * * *

UNITED STATES PATENT AND TRADEMARK OFFICE
CERTIFICATE OF CORRECTION

PATENT NO. : 6,606,736 B1
DATED : August 12, 2003
INVENTOR(S) : Tatsuya Kobayashi et al.

It is certified that error appears in the above-identified patent and that said Letters Patent is hereby corrected as shown below:

Column 25,
Line 5, change "be" to -- before --.

Column 28,
Line 53, change "st" to -- first --.

Signed and Sealed this

Sixth Day of January, 2004

JAMES E. ROGAN
*Director of the United States Patent and Trademark Office*